United States Patent
Xu et al.

(10) Patent No.: US 12,230,217 B2
(45) Date of Patent: Feb. 18, 2025

(54) SHIFT REGISTER, SCAN DRIVING CIRCUIT AND DISPLAY APPARATUS

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Jingbo Xu, Beijing (CN); Wei Liu, Beijing (CN); Yipeng Chen, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/250,327

(22) PCT Filed: Mar. 25, 2022

(86) PCT No.: PCT/CN2022/083198
§ 371 (c)(1),
(2) Date: Apr. 24, 2023

(87) PCT Pub. No.: WO2023/178701
PCT Pub. Date: Sep. 28, 2023

(65) Prior Publication Data
US 2024/0379063 A1 Nov. 14, 2024

(51) Int. Cl.
*G09G 3/3266* (2016.01)
*G09G 3/32* (2016.01)
*G11C 19/28* (2006.01)

(52) U.S. Cl.
CPC ............. *G09G 3/3266* (2013.01); *G09G 3/32* (2013.01); *G09G 2310/0267* (2013.01);
(Continued)

(58) Field of Classification Search
CPC .................. G09G 3/3266; G09G 3/32; G09G 2310/0267; G09G 2310/0286; G09G 2310/08; G11C 19/28
See application file for complete search history.

(56) References Cited

U.S. PATENT DOCUMENTS

2009/0290677 A1   11/2009   Otose et al.
2018/0006099 A1   1/2018    Ka et al.
(Continued)

FOREIGN PATENT DOCUMENTS

CN   112397029 A   2/2021
CN   113284451 A   2/2021
(Continued)

OTHER PUBLICATIONS

PCT International Search Report (w/ English translation) and Written Opinion for corresponding PCT Application No. PCT/CN2022/083198, mailed Nov. 30, 2022, 12 pages.

*Primary Examiner* — Abhishek Sarma
(74) *Attorney, Agent, or Firm* — Dority & Manning, P.A.

(57) ABSTRACT

A shift register includes: a first input circuit, a first output circuit, a second input circuit, a second output circuit and at least one functional circuit. The first input circuit is configured to transmit an input signal to the first node under control of a first control signal. The first output circuit is configured to transmit a first output signal to the first scan signal terminal under control of the first node. The second input circuit is configured to transmit a first voltage signal to the second node under control of a second control signal. The second output circuit is configured to transmit a second output signal to the first scan signal terminal under control of the second node. A functional circuit is configured to block a path between the functional input terminal and the functional output terminal under control of a functional control signal.

20 Claims, 35 Drawing Sheets

(52) U.S. Cl.
CPC . *G09G 2310/0286* (2013.01); *G09G 2310/08* (2013.01); *G11C 19/28* (2013.01)

(56) References Cited

U.S. PATENT DOCUMENTS

| | | | |
|---|---|---|---|
| 2018/0190204 A1 | 7/2018 | Shin et al. | |
| 2018/0277614 A1 | 9/2018 | Ono et al. | |
| 2020/0051507 A1 | 2/2020 | Feng et al. | |
| 2020/0168160 A1 | 5/2020 | Oh et al. | |
| 2020/0243151 A1 | 7/2020 | Li et al. | |
| 2020/0294461 A1 | 9/2020 | Xu et al. | |
| 2021/0166603 A1* | 6/2021 | Feng | G11C 19/28 |
| 2021/0193025 A1 | 6/2021 | Xu et al. | |
| 2021/0217376 A1* | 7/2021 | Yuan | G09G 3/3677 |
| 2022/0005428 A1 | 1/2022 | Xu et al. | |
| 2022/0208070 A1 | 6/2022 | Dong et al. | |

FOREIGN PATENT DOCUMENTS

| | | |
|---|---|---|
| CN | 113284543 A | 8/2021 |
| CN | 113571013 A | 10/2021 |

* cited by examiner

SHIFT REGISTER, SCAN DRIVING CIRCUIT AND DISPLAY APPARATUS

CROSS-REFERENCE TO RELATED APPLICATION

This application is a national phase entry under 35 USC 371 of International Patent Application No. PCT/CN2022/083198, filed on Mar. 25, 2022, which is incorporated herein by reference in its entirety.

TECHNICAL FIELD

The present disclosure relates to the field of display technologies, and in particular, to a shift register, a scan driving circuit and a display apparatus.

BACKGROUND

With the continuous development of electronic products, display panels having a display function are widely used in people's life and work, which provides convenience for people.

SUMMARY

In an aspect, a shift register is provided. The shift register includes: a first input circuit, a first output circuit, a second input circuit, a second output circuit and at least one functional circuit. The first input circuit is coupled to an input signal terminal, a first control signal terminal and a first node. The first input circuit is configured to transmit an input signal provided by the input signal terminal to the first node under control of a first control signal provided by the first control signal terminal. The first output circuit is coupled to a first output signal terminal, the first node and a first scan signal terminal. The first output circuit is configured to transmit a first output signal provided by the first output signal terminal to the first scan signal terminal under control of a potential of the first node. The second input circuit is coupled to a first voltage signal terminal, a second control signal terminal and a second node. The second input circuit is configured to transmit a first voltage signal provided by the first voltage signal terminal to the second node under control of a second control signal provided by the second control signal terminal. The second output circuit is coupled to a second output signal terminal, the second node and the first scan signal terminal. The second output circuit is configured to transmit a second output signal provided by the second output signal terminal to the first scan signal terminal under control of a potential of the second node. A functional circuit is coupled to a functional input terminal, a functional output terminal and a functional control terminal. The functional circuit is configured to block a path between the functional input terminal and the functional output terminal under control of a functional control signal provided by the functional control terminal, so as to maintain a potential of the functional output terminal. The functional output terminal includes one of circuit nodes.

In some embodiments, the functional circuit includes an oxide transistor. A control electrode of the oxide transistor is coupled to the functional control terminal, a first electrode of the oxide transistor is coupled to the functional input terminal, and a second electrode of the oxide transistor is coupled to the functional output terminal.

In some embodiments, the oxide transistor includes a first gate pattern, an active layer, and a second gate pattern that are sequentially stacked on a side of a substrate. A material of the active layer includes an oxide semiconductor material. The first gate pattern and the second gate pattern constitute the control electrode of the oxide transistor.

In some embodiments, the oxide transistor further includes source-drain metal patterns. A same source-drain metal pattern is coupled to the first gate pattern and the second gate pattern.

In some embodiments, the first control signal terminal includes a first clock signal terminal. The first input circuit includes a second transistor. A control electrode of the second transistor is coupled to the first clock signal terminal, a first electrode of the second transistor is coupled to the input signal terminal, and a second electrode of the second transistor is coupled to the first node.

In some embodiments, the first control signal terminal includes a first auxiliary clock signal terminal. The first input circuit is further used as the functional circuit. The first input circuit is further configured to block a path between the input signal terminal and the first node under control of a first auxiliary clock signal provided by the first auxiliary clock signal terminal, so as to maintain the potential of the first node.

In some embodiments, the first input circuit includes a second transistor, and the second transistor includes an oxide transistor. The first auxiliary clock signal terminal is used as the functional control terminal; a control electrode of the second transistor is coupled to the first auxiliary clock signal terminal, a first electrode of the second transistor is coupled to the input signal terminal, and a second electrode of the second transistor is coupled to the first node.

In some embodiments, the first control signal terminal includes a third control signal terminal and a fourth control signal terminal. The first input circuit is further configured to transmit the input signal to the first node under control of a third control signal provided by the third control signal terminal and a fourth control signal provided by the fourth control signal terminal. The first input circuit includes the functional circuit, and the functional circuit is coupled in series between the input signal terminal and the first node.

The third control signal terminal is used as the functional control terminal; and the functional circuit is configured to block a path between the input signal terminal and the first node under control of the third control signal provided by the third control signal terminal, so as to maintain the potential of the first node. And/or, the fourth control signal terminal is used as the functional control terminal; and the functional circuit is configured to block the path between the input signal terminal and the first node under control of the fourth control signal provided by the fourth control signal terminal, so as to maintain the potential of the first node.

In some embodiments, the third control signal terminal includes a second clock signal terminal, and the fourth control signal terminal includes a first auxiliary clock signal terminal. The first input circuit includes a second transistor and a third transistor, the functional circuit includes the third transistor, and the third transistor includes an oxide transistor. The first auxiliary clock signal terminal is used as the functional control terminal. A control electrode of the second transistor is coupled to the second clock signal terminal, a first electrode of the second transistor is coupled to the input signal terminal, and a second electrode of the second transistor is coupled to a first electrode of the third transistor; a control electrode of the third transistor is coupled to the first auxiliary clock signal terminal, and a second electrode of the third transistor is coupled to the first node. Alternatively, the third control signal terminal includes a second auxiliary clock signal terminal, and the fourth control signal terminal includes a first clock signal terminal. The first input circuit includes a second transistor and a third transistor, the functional circuit includes the second transistor, and the second transistor includes an oxide transistor. The second auxiliary clock signal terminal is used as the functional control terminal. A control electrode of the second transistor is coupled to the second auxiliary clock signal terminal, a first electrode of the second transistor is coupled to the input signal terminal, and a second electrode of the second transistor is coupled to a first electrode of the third transistor; a control electrode of the third transistor is coupled to the first clock signal terminal, and a second electrode of the third transistor is coupled to the first node.

In some embodiments, the second control signal terminal includes a first clock signal terminal. The second input circuit includes a fourth transistor; a control electrode of the fourth transistor is coupled to the first clock signal terminal, a first electrode of the fourth transistor is coupled to the first voltage signal terminal, and a second electrode of the fourth transistor is coupled to the second node.

In some embodiments, the second control signal terminal includes a first auxiliary clock signal terminal. The second input circuit is further used as the functional circuit. The second input circuit is further configured to block a path between the first voltage signal terminal and the second node under control of a first auxiliary clock signal provided by the first auxiliary clock signal terminal, so as to maintain the potential of the second node.

In some embodiments, the second input circuit includes a fourth transistor, and the fourth transistor includes an oxide transistor. The first auxiliary clock signal terminal is used as the functional control terminal; a control electrode of the fourth transistor is coupled to the first auxiliary clock signal terminal, a first electrode of the fourth transistor is coupled to the first voltage signal terminal, and a second electrode of the fourth transistor is coupled to the second node.

In some embodiments, the shift register further includes a first control circuit. The first control circuit is coupled to a fifth control signal terminal, the second node and a third output signal terminal. The first control circuit is configured to transmit a third output signal provided by the third output signal terminal to the second node under control of a fifth control signal provided by the fifth control signal terminal.

In some embodiments, the first control circuit includes a fifth transistor. The fifth control signal terminal includes the first node, and the third output signal terminal includes a first clock signal terminal or a second voltage signal terminal. A control electrode of the fifth transistor is coupled to the first node, a first electrode of the fifth transistor is coupled to the third output signal terminal, and a second electrode of the fifth transistor is coupled to the second node.

In some embodiments, the functional circuit is coupled in series between the second node and the third output signal terminal. The functional circuit is further coupled to a third clock signal terminal, and the third output signal terminal includes the first clock signal terminal. The functional circuit is configured to block a path between the second node and the first clock signal terminal under control of a third clock signal provided by the third clock signal terminal, so as to maintain the potential of the second node.

In some embodiments, the functional circuit includes a first transistor, and the first transistor includes an oxide transistor. The third clock signal terminal is used as the functional control terminal. A control electrode of the first transistor is coupled to the third clock signal terminal, a first electrode of the first transistor is coupled to the second electrode of the fifth transistor, and a second electrode of the first transistor is coupled to the second node; and the second electrode of the fifth transistor is coupled to the second node through the first transistor. Alternatively, the control electrode of the first transistor is coupled to the third clock signal terminal, the first electrode of the first transistor is coupled to the first clock signal terminal, and the second electrode of the first transistor is coupled to the first electrode of the fifth transistor; and the first electrode of the fifth transistor is coupled to the first clock signal terminal through the first transistor.

In some embodiments, the second input circuit includes a fourth transistor, and the fourth transistor is configured to be coupled to a first voltage signal line. In a plane where the shift register is located, the first transistor is located on a side of the fourth transistor away from the first voltage signal line.

In some embodiments, the first transistor includes: a first gate pattern, an active layer, and a second gate pattern that are sequentially stacked on a side of a substrate. A material of the active layer includes an oxide semiconductor material. The first gate pattern and the second gate pattern constitute the control electrode of the first transistor. The first gate pattern and the second gate pattern of the first transistor are located on a side of the third clock signal terminal proximate to the substrate. The first gate pattern and the second gate pattern of the first transistor are coupled to the third clock signal terminal.

In some embodiments, the first input circuit includes a third transistor, and the third transistor is configured to be coupled to a first clock signal line. In a plane where the shift register is located, the first transistor is located on a side of the third transistor away from the first clock signal line.

In some embodiments, the shift register further includes a third output circuit and a fourth output circuit. The third output circuit is coupled to the first voltage signal terminal, the first node and a second scan signal terminal. The third output circuit is configured to transmit the first voltage signal provided by the first voltage signal terminal to the second scan signal terminal under the control of the potential of the first node. The fourth output circuit is coupled to a second voltage signal terminal, the first node and the second scan signal terminal. The fourth output circuit is configured to transmit a second voltage signal provided by the second voltage signal terminal to the second scan signal terminal under the control of the potential of the first node.

In some embodiments, the third output circuit is further used as the functional circuit. The third output circuit is further configured to block a path between the first voltage signal terminal and the second scan signal terminal under the control of the potential of the first node, so as to maintain a potential of the second scan signal terminal.

In some embodiments, the third output circuit includes a sixth transistor, and the sixth transistor includes an oxide transistor. The first node is used as the functional control terminal. The fourth output circuit includes a seventh transistor. A control electrode of the sixth transistor is coupled to the first node, a first electrode of the sixth transistor is coupled to the first voltage signal terminal, and a second electrode of the sixth transistor is coupled to the second scan signal terminal. A control electrode of the seventh transistor is coupled to the first node, a first electrode of the seventh transistor is coupled to the second voltage signal terminal, and a second electrode of the seventh transistor is coupled to the second scan signal terminal.

In some embodiments, the shift register further includes a first control circuit. The first control circuit is coupled to a fifth control signal terminal, the second node and a third output signal terminal. The first control circuit is configured to transmit a third output signal provided by the third output signal terminal to the second node under control of a fifth control signal provided by the fifth control signal terminal. The third output signal terminal includes a first clock signal terminal; the fifth control signal terminal includes the second scan signal terminal; and the first control circuit is further used as another functional circuit. The first control circuit is configured to block a path between the first clock signal terminal and the second node under control of a second scan signal provided by the second scan signal terminal, so as to maintain the potential of the second node.

In some embodiments, the first control circuit includes a fifth transistor, the fifth transistor includes an oxide transistor. The second scan signal terminal is used as another functional control terminal; a control electrode of the fifth transistor is coupled to the second scan signal terminal, a first electrode of the fifth transistor is coupled to the first clock signal terminal, and a second electrode of the fifth transistor is coupled to the second node.

In some embodiments, the shift register further includes a noise reduction circuit. The noise reduction circuit is coupled to a second voltage signal terminal, a sixth control signal terminal, the second node and the first node. The noise reduction circuit is configured to transmit a second voltage signal provided by the second voltage signal terminal to the first node under control of the potential of the second node and a sixth control signal provided by the sixth control signal terminal.

In some embodiments, the noise reduction circuit includes an eighth transistor and a ninth transistor. A control electrode of the eighth transistor is coupled to the second node, a first electrode of the eighth transistor is coupled to the second voltage signal terminal, and a second electrode of the eighth transistor is coupled to a first electrode of the ninth transistor. A control electrode of the ninth transistor is coupled to the sixth control signal terminal, and a second electrode of the ninth transistor is coupled to the first node.

In some embodiments, the sixth control signal terminal includes a fourth clock signal terminal. The functional circuit is coupled in series between the second voltage signal terminal and the first node, and the functional circuit is further coupled to the first node. The functional circuit is configured to block a path between the second voltage signal terminal and the first node under the control of the potential of the first node, so as to maintain the potential of the first node.

In some embodiments, the functional circuit includes a first transistor, and the first transistor includes an oxide transistor; and the first node is used as the functional control terminal. A control electrode of the first transistor is coupled to the first node, a first electrode of the first transistor is coupled to the second voltage signal terminal, a second electrode of the first transistor is coupled to a first electrode of an eighth transistor, and the first electrode of the eighth transistor is coupled to the second voltage signal terminal through the first transistor; or the control electrode of the first transistor is coupled to the first node, the first electrode of the first transistor is coupled to a second electrode of the eighth transistor, the second electrode of the first transistor is coupled to a first electrode of a ninth transistor, and the second electrode of the eighth transistor is coupled to the first electrode of the ninth transistor through the first transistor; or the control electrode of the first transistor is coupled to the first node, the first electrode of the first transistor is coupled to a second electrode of the ninth transistor, the second electrode of the first transistor is coupled to the first node, and the second electrode of the ninth transistor is coupled to the first node through the first transistor.

In some embodiments, the sixth control signal terminal includes a fourth auxiliary clock signal terminal. The noise reduction circuit includes the functional circuit. The functional circuit is configured to block a path between the first node and the second voltage signal terminal under control of a fourth auxiliary clock signal provided by the fourth auxiliary clock signal terminal, so as to maintain the potential of the first node.

In some embodiments, the noise reduction circuit includes an eighth transistor and a ninth transistor. The functional circuit includes the ninth transistor, and the ninth transistor includes an oxide transistor. The fourth auxiliary clock signal terminal is used as the functional control terminal. A control electrode of the eighth transistor is coupled to the second node, a first electrode of the eighth transistor is coupled to the second voltage signal terminal, and a second electrode of the eighth transistor is coupled to a first electrode of the ninth transistor; a control electrode of the ninth transistor is coupled to the fourth auxiliary clock signal terminal, and a second electrode of the ninth transistor is coupled to the first node.

In some embodiments, the shift register further includes a first control circuit, and the first control circuit includes a first transistor. The eighth transistor is configured to be coupled to a second voltage signal line. In a plane where the shift register is located, the first transistor is located on a side of the second voltage signal line away from the eighth transistor.

In some embodiments, in the plane where the shift register is located, the first transistor is located between the first voltage signal terminal and the second voltage signal terminal.

In some embodiments, the shift register further includes a first voltage stabilizing circuit. The circuit nodes further include a third node. The first voltage stabilizing circuit is coupled to the first node, the third node, and an eighth control signal terminal. The first output circuit is coupled to the third node and is coupled to the first node through the first voltage stabilizing circuit. The first voltage stabilizing circuit is configured to connect the first node and the third node under control of a potential of the third node and an eighth control signal provided by the eighth control signal terminal. The first output circuit is configured to transmit the first output signal provided by the first output signal terminal to the first scan signal terminal under control of the potential of the third node.

In some embodiments, the first voltage stabilizing circuit includes a tenth transistor. The eighth control signal terminal includes the first voltage signal terminal. A control electrode of the tenth transistor is coupled to the first voltage signal terminal, a first electrode of the tenth transistor is coupled to the first node, and a second electrode of the tenth transistor is coupled to the third node.

In some embodiments, the eighth control signal terminal includes a second voltage signal terminal. The first voltage stabilizing circuit is further used as the functional circuit. The first voltage stabilizing circuit is further configured to block a path between the first node and the third node under control of the potential of the third node and a potential of a second voltage signal provided by the second voltage signal terminal, so as to maintain the potential of the third node.

In some embodiments, the functional circuit includes a tenth transistor, and the tenth transistor includes an oxide transistor. The second voltage signal terminal is used as the functional control terminal. A control electrode of the tenth transistor is coupled to the second voltage signal terminal, a first electrode of the tenth transistor is coupled to the first node, and a second electrode of the tenth transistor is coupled to the third node.

In some embodiments, the shift register further includes a second control circuit. The circuit nodes further include a fourth node. The second control circuit is coupled to the second node, the fourth node, a fourth clock signal terminal and a ninth control signal terminal. The second output circuit is coupled to the fourth node and is coupled to the second node through the second control circuit. The second control circuit is configured to transmit a fourth clock signal provided by the fourth clock signal terminal to the fourth node under control of the potential of the second node and a ninth control signal provided by the ninth control signal terminal. The second output circuit is configured to transmit the second output signal provided by the second output signal terminal to the first scan signal terminal under control of the fourth node.

In some embodiments, the second control circuit includes an eleventh transistor, a twelfth transistor, and a first capacitor. A control electrode of the eleventh transistor is coupled to the second node, a first electrode of the eleventh transistor is coupled to the fourth clock signal terminal, and a second electrode of the eleventh transistor is coupled to a first electrode of the twelfth transistor. A control electrode of the twelfth transistor is coupled to the ninth control signal terminal, and a second electrode of the twelfth transistor is coupled to the fourth node. A first electrode plate of the first capacitor is coupled to the second node, and a second electrode plate of the first capacitor is coupled to the first electrode of the twelfth transistor.

In some embodiments, the ninth control signal terminal includes a fourth auxiliary clock signal terminal. The second control circuit includes the functional circuit. The functional circuit is configured to block a path between the fourth clock signal terminal and the fourth node under control of a fourth auxiliary clock signal provided by the fourth auxiliary clock signal terminal, so as to maintain a potential of the fourth node.

In some embodiments, the second control circuit includes an eleventh transistor, a twelfth transistor, and a first capacitor. The functional circuit includes the twelfth transistor, and the twelfth transistor includes an oxide transistor. The fourth auxiliary clock signal terminal is used as the functional control terminal. A control electrode of the eleventh transistor is coupled to the second node, a first electrode of the eleventh transistor is coupled to the fourth clock signal terminal, and a second electrode of the eleventh transistor is coupled to a first electrode of the twelfth transistor. A control electrode of the twelfth transistor is coupled to the fourth auxiliary clock signal terminal, and a second electrode of the twelfth transistor is coupled to the fourth node. A first electrode plate of the first capacitor is coupled to the second node, and a second electrode plate of the first capacitor is coupled to the first electrode of the twelfth transistor.

In some embodiments, the first input circuit includes a second transistor. The shift register further includes a first control circuit, and the first control circuit includes a first transistor. In a plane where the shift register is located, the first transistor is located between the second transistor and the first capacitor.

In some embodiments, the shift register further includes a second voltage stabilizing circuit; the circuit nodes further include a fifth node. The second voltage stabilizing circuit is coupled to a tenth control signal terminal, the second node and the fifth node. The second control circuit is coupled to the fifth node and is coupled to the second node through the second voltage stabilizing circuit. The second voltage stabilizing circuit is configured to form a path between the second node and the fifth node under control of a potential of the fifth node and a tenth control signal provided by the tenth control signal terminal. The second control circuit is configured to transmit the fourth clock signal provided by the fourth clock signal terminal to the fourth node under control of the potential of the fifth node and the ninth control signal provided by the ninth control signal terminal.

In some embodiments, the second voltage stabilizing circuit includes a thirteenth transistor. A control electrode of the thirteenth transistor is coupled to the tenth control signal terminal, a first electrode of the thirteenth transistor is coupled to the second node, and a second electrode of the thirteenth transistor is coupled to the fifth node.

In some embodiments, the tenth control signal terminal includes a second voltage signal terminal. The second voltage stabilizing circuit is further used as the functional circuit. The second voltage stabilizing circuit is further configured to block the path between the second node and the fifth node under control of the potential of the fifth node and a second voltage signal provided by the second voltage signal terminal, so as to maintain the potential of the fifth node.

In some embodiments, the functional circuit includes a thirteenth transistor, and the thirteenth transistor includes an oxide transistor. The second voltage signal terminal is used as the functional control terminal. A control electrode of the thirteenth transistor is coupled to the second voltage signal terminal, a first electrode of the thirteenth transistor is coupled to the second node, and a second electrode of the thirteenth transistor is coupled to the fifth node.

In some embodiments, the shift register further includes a first voltage stabilizing circuit. The circuit nodes include a third node, a sixth node, and a seventh node. The first control signal terminal includes a first clock signal terminal and an eleventh control signal terminal. The first input circuit is coupled to the input signal terminal, the first node, the sixth node, the first clock signal terminal and the eleventh control signal terminal. The first input circuit is configured to transmit the input signal provided by the input signal terminal to the first node under control of a first clock signal provided by the first clock signal terminal. The first input circuit is further configured to transmit the input signal provided by the input signal terminal to the sixth node under control of an eleventh control signal provided by the eleventh control signal terminal.

An eighth control signal terminal includes the first voltage signal terminal and a twelfth control signal terminal. The first voltage stabilizing circuit is coupled to the first node, the third node, the sixth node, the seventh node, the first voltage signal terminal, and the twelfth control signal terminal. The first voltage stabilizing circuit is configured to form a path between the first node and the third node under control of a potential of the third node and the first voltage signal provided by the first voltage signal terminal. The first voltage stabilizing circuit is further configured to form a path between the sixth node and the seventh node under control of a potential of the seventh node and a twelfth control signal provided by the twelfth control signal terminal.

In some embodiments, the first input circuit includes a second transistor and a third transistor. A control electrode of the second transistor is coupled to the first clock signal terminal, a first electrode of the second transistor is coupled to the input signal terminal, and a second electrode of the second transistor is coupled to the first node. A control electrode of the third transistor is coupled to the eleventh control signal terminal, a first electrode of the third transistor is coupled to the input signal terminal, and a second electrode of the third transistor is coupled to the sixth node. The first voltage stabilizing circuit includes a tenth transistor and a fourteenth transistor. A control electrode of the tenth transistor is coupled to the first voltage signal terminal, a first electrode of the tenth transistor is coupled to the first node, and a second electrode of the tenth transistor is coupled to the third node. A control electrode of the fourteenth transistor is coupled to the twelfth control signal terminal, a first electrode of the fourteenth transistor is coupled to the sixth node, and a second electrode of the fourteenth transistor is coupled to the seventh node.

In some embodiments, the eleventh control signal terminal includes a first auxiliary clock signal terminal. The first input circuit includes the functional circuit. The functional circuit is configured to block a path between the input signal terminal and the sixth node under control of a first auxiliary clock signal provided by the first auxiliary clock signal terminal, so as to maintain a potential of the sixth node.

In some embodiments, the first input circuit includes a second transistor and a third transistor. The functional circuit includes the third transistor, and the third transistor includes an oxide transistor. The first auxiliary clock signal terminal is used as the functional control terminal. A control electrode of the second transistor is coupled to the first clock signal terminal, a first electrode of the second transistor is coupled to the input signal terminal, and a second electrode of the second transistor is coupled to the first node. A control electrode of the third transistor is coupled to the first auxiliary clock signal terminal, a first electrode of the third transistor is coupled to the input signal terminal, and a second electrode of the third transistor is coupled to the sixth node.

In some embodiments, the twelfth control signal terminal includes a second voltage signal terminal. The first voltage stabilizing circuit includes the functional circuit. The functional circuit is configured to block the path between the sixth node and the seventh node under control of a second voltage signal provided by the second voltage signal terminal, so as to maintain the potential of the seventh node.

In some embodiments, the first voltage stabilizing circuit includes a tenth transistor and a fourteenth transistor. The functional circuit includes the fourteenth transistor, and the fourteenth transistor includes an oxide transistor. The second voltage signal terminal is used as the functional control terminal. A control electrode of the tenth transistor is coupled to the first voltage signal terminal, a first electrode of the tenth transistor is coupled to the first node, and a second electrode of the tenth transistor is coupled to the third node. A control electrode of the fourteenth transistor is coupled to the second voltage signal terminal, a first electrode of the fourteenth transistor is coupled to the sixth node, and a second electrode of the fourteenth transistor is coupled to the seventh node.

In some embodiments, the shift register further includes a third voltage stabilizing circuit. The third voltage stabilizing circuit is coupled to the seventh node and the third node. The third voltage stabilizing circuit is configured to connect the seventh node and the third node under control of the potential of the seventh node.

In some embodiments, the third voltage stabilizing circuit includes a fifteenth transistor. A control electrode of the fifteenth transistor is coupled to the seventh node, a first electrode of the fifteenth transistor is coupled to the seventh node, and a second electrode of the fifteenth transistor is coupled to the third node.

In some embodiments, the first output signal terminal includes a fourth clock signal terminal or the first voltage signal terminal. The first output circuit includes a sixteenth transistor. A control electrode of the sixteenth transistor is coupled to the first node, a first electrode of the sixteenth transistor is coupled to the first output signal terminal, and a second electrode of the sixteenth transistor is coupled to the first scan signal terminal. The second output signal terminal includes a second clock signal terminal or a second voltage signal terminal. The second output circuit includes a seventeenth transistor and a second capacitor. A control electrode of the seventeenth transistor is coupled to the second node, a first electrode of the seventeenth transistor is coupled to the second output signal terminal, and a second electrode of the seventeenth transistor is coupled to the first scan signal terminal. A first electrode plate of the second capacitor is coupled to the second output signal terminal, and a second electrode plate of the second capacitor is coupled to the second node.

In some embodiments, the shift register includes a first transistor in the functional circuit. The first transistor includes a first gate pattern, an active layer, and a second gate pattern that are sequentially stacked on a side of a substrate, and a material of the active layer includes an oxide semiconductor material. The second gate pattern of the first transistor and the control electrode of the seventeenth transistor are arranged in a same layer.

In another aspect, a scan driving circuit is provided. The scan driving circuit includes a first voltage signal line; and N cascaded shift registers that are sequentially arranged along an extending direction of the first voltage signal line. A shift register is the shift register as described above.

In some embodiments, two adjacent shift registers are symmetrically arranged along a direction perpendicular to the extending direction of the first voltage signal line. Two oxide semiconductor structures belonging to the two adjacent shift registers constitute a one-piece structure.

In yet another aspect, a display apparatus is provided. The display apparatus includes a display area and a peripheral area located on at least one side of the display area. The display area includes a plurality of sub-pixels, the peripheral area includes the scan driving circuit as described above, and the scan driving circuit is coupled to the plurality of sub-pixels.

BRIEF DESCRIPTION OF THE DRAWINGS

In order to describe technical solutions in the present disclosure more clearly, the accompanying drawings to be used in some embodiments of the present disclosure will be introduced briefly; Obviously, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
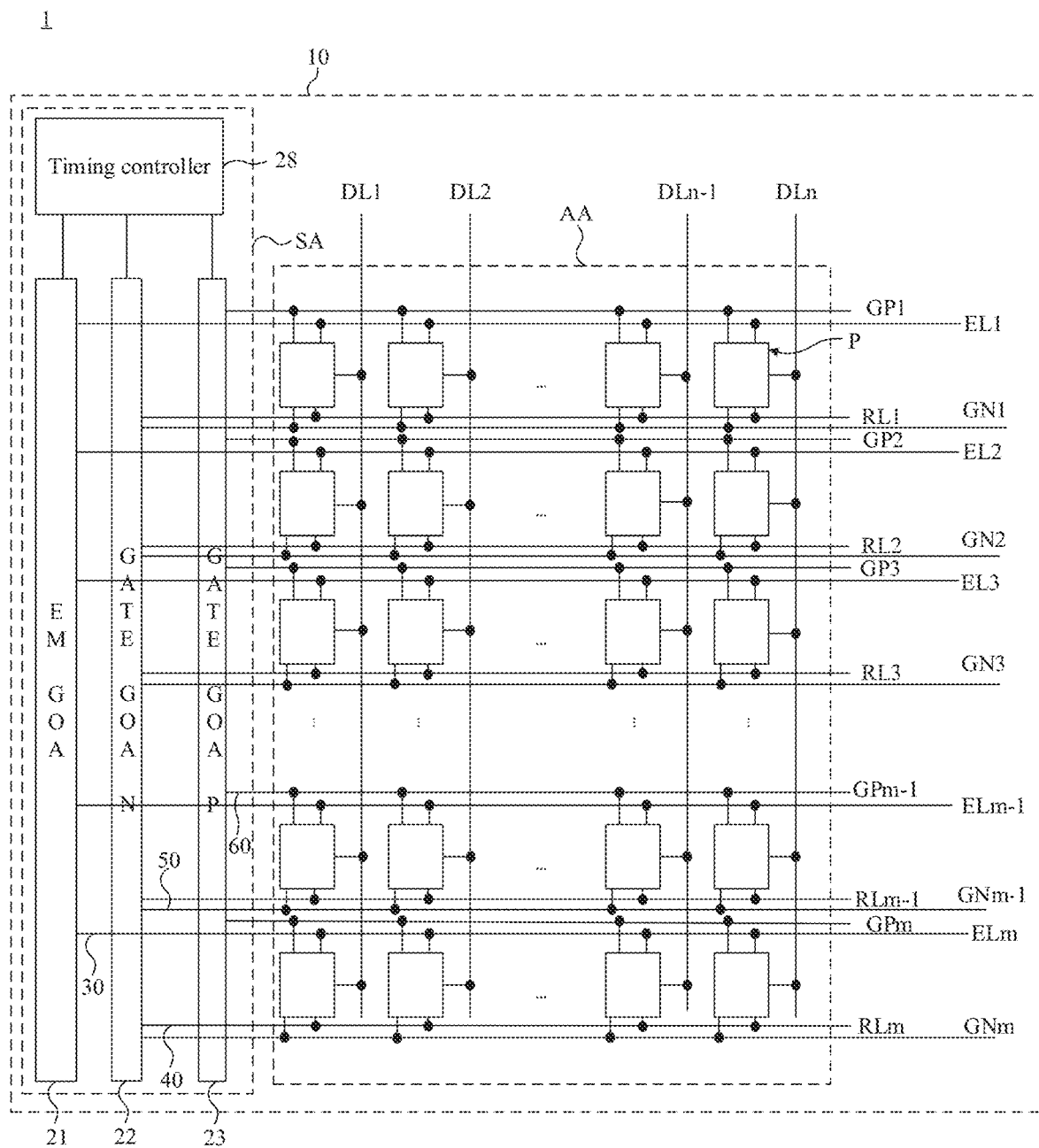
FIG. 1 is a structural diagram of a display apparatus, in accordance with some embodiments.

The technical solutions in some embodiments of the present disclosure will be described clearly and completely below with reference to the accompanying drawings. Obviously, the described embodiments are merely some but not all of embodiments of the present disclosure. All other embodiments obtained by a person of ordinary skill in the art on a basis of the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the terms "electrically connected" and "connected" and derivatives thereof may be used. For example, the term "electrically connected" may be used in the description of some embodiments to indicate that two or more components are in direct physical or electrical contact with each other. The embodiments disclosed herein are not necessarily limited to the content herein.

The phrase "A and/or B" includes the following three combinations: only A, only B, and a combination of A and B.

The phrase "configured to" used herein means an open and inclusive expression, which does not exclude devices that are applicable to or configured to perform additional tasks or steps.

In addition, the phrase "based on" used herein is meant to be open and inclusive, since a process, step, calculation or other action that is "based on" one or more of the stated conditions or values may, in practice, be based on additional conditions or values exceeding those stated.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" may also mean that two or more components are not in direct contact with each other, but still cooperate or interact with each other. The term "coupled" used herein includes expressions "directly coupled" and "indirectly coupled". The fact that A is coupled to C through B does not limit a signal transmitted from B to C to be from A. The embodiments disclosed herein are not necessarily limited to the content herein.

In the description of some embodiments, the terms "valid potential" and "invalid potential" may be used. The valid potential refers to a potential that can form a path between a first electrode and a second electrode of a transistor when transmitted to a control electrode of the transistor. The invalid potential refers to a potential that cannot form the path between the first electrode and the second electrode of the transistor when transmitted to the control electrode of the transistor.

The relationship between "first clock signal" and "first auxiliary clock signal" used herein indicates that in an operation phase, a potential of the first auxiliary clock signal is opposite to a potential of the first clock signal; and in a buffering phase between two adjacent operation phases, the potential of the first auxiliary clock signal may be the same as or opposite to the potential of the first clock signal. For example, in an operation phase, the potential of the first clock signal is a high potential, and the potential of the first auxiliary clock signal is a low potential. For another example, in a buffering phase, the potential of the first clock signal is a high potential, and the potential of the first auxiliary clock signal may be a high potential or a low potential.

Similarly, for the relationship between "second clock signal" and "second auxiliary clock signal", the relationship between "third clock signal" and "third auxiliary clock signal", and the relationship between "fourth clock signal" and "fourth auxiliary clock signal", reference may be made to the relationship between "first clock signal" and "first auxiliary clock signal", and details will not be repeated herein.

As used herein, the term such as "approximately" or "substantially" includes a stated value and an average value within an acceptable range of deviation of a particular value. The acceptable range of deviation is determined by a person of ordinary skill in the art in view of the measurement in question and errors associated with the measurement of a particular quantity (i.e., the limitation of the measurement system).

Exemplary embodiments are described herein with reference to sectional views and/or plan views as idealized exemplary drawings. In the drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

A shift register in a scan driving circuit is mainly composed of transistors, capacitor(s). In the operation process of the shift register, a potential of a control node in the shift register is controlled through the transistors and the capacitor(s), thereby realizing output of a scan signal.

In some embodiments, the scan driving circuit includes a plurality of low temperature poly-silicon thin film transistors (LTPS TFTs). There is a situation that signal terminals connected to two electrodes except a control electrode of an LTPS TFT respectively provide signals with different potentials.

It has been found by the inventors of the present disclosure that, since electron mobility of the LTPS TFT is large, a leakage current of the LTPS TFT is also relatively large; and in the case where the two electrodes except the control electrode of the LTPS TFT respectively receive the signals with different potentials, even if the LTPS TFT is in an off state, the leakage will occur between the two electrodes except the control electrode of the LTPS TFT, which causes unstable potential of the circuit node in the shift register, and reduces reliability of the display apparatus.

Based on this, some embodiments of the present disclosure provide a shift register, a scan driving circuit, and a display apparatus, which will be described below.

FIG. 1 is a structural diagram of a display apparatus, in accordance with some embodiments. For example, as shown in FIG. 1, a display substrate 10 in the display apparatus 1 includes a display area (i.e., a pixel array area) AA and a peripheral area SA located on at least one side of the display area AA. The display area AA includes sub-pixels P of a plurality of rows and a plurality of columns arranged in an array, a plurality of enable signal lines (EL1, ..., ELi, ..., Elm, where i is an integer greater than or equal to 1, and m is an integer greater than or equal to i) connected to enable sub-circuits in the plurality of rows of sub-pixels P, a plurality of reset signal lines (RL1, ..., RLi, ..., RLm) connected to reset sub-circuits in the plurality of rows of sub-pixels P, a plurality of first gate lines (GN1, ..., GNi, ..., GNm) connected to compensation sub-circuits in the plurality of rows of sub-pixels P, and a plurality of second gate lines (GP1, ..., GPi, ..., GPm) connected to data writing sub-circuits in the plurality of rows of sub-pixels P. For example, each sub-pixel P may include a light-emitting element and a pixel circuit having a circuit structure such as 7T1C, 7T2C, 8T2C, or 4T1C in the art.

The peripheral area SA may include a first scan driving circuit 21 and a second scan driving circuit 22.

In some examples, the first scan driving circuit 21 may be connected to the plurality of enable signal lines EL1, EL2, ..., ELi, ..., ELm through a plurality of first connection wires 30 respectively, so as to provide enable signals to the enable sub-circuits in the plurality of rows of sub-pixels P. Since the first scan driving circuit 21 is used to drive the enable sub-circuits in the sub-pixels P, the first scan driving circuit 21 may also be referred to as an enable gate driver on array (EM GOA). Each of the first connection wires 30 and the enable signal line ELi connected thereto may be formed a one-piece structure, and in an actual application, widths of the first connection wire 30 and the enable signal line ELi may be the same or different, which is not limited in the present disclosure.

In some examples, the second scan driving circuit 22 is located on a side of the first scan driving circuit 21 proximate to the display area AA, and is connected to the plurality of reset signal lines RL1, RL2, ..., RLi, ..., RLm through a plurality of second connection wires 40, so as to provide first reset signals to first reset sub-circuits in the plurality of rows of sub-pixels P. Each of the second connection wires 40 and the reset signal line RLi connected thereto may be formed a one-piece structure, and in an actual application, widths of the second connection wire 40 and the reset signal line RLi may be the same or different, which is not limited in the present disclosure.

In some examples, the second scan driving circuit 22 may be further connected to the plurality of first gate lines GN1 ..., GNi ..., GNm through a plurality of third connection wires 50, so as to provide first gate signals to the compensation sub-circuits in the plurality of rows of sub-pixels P. For example, the second scan driving circuit 22 provides a first gate signal for an N-type transistor in the sub-pixel P; and therefore, the second scan driving circuit 22 may also be referred to as a gate GOA N (GN). Each of the third connection wires 50 and the first gate line GNi connected thereto may be formed a one-piece structure, and in an actual application, widths of the third connection wire 50 and the first gate line GNi may be the same or different, which is not limited in the present disclosure.

In some examples, the peripheral area SA may further include a third scan driving circuit 23; and the third scan driving circuit 23 is connected to the plurality of second gate lines GP1, ..., GPi ..., GPm through a plurality of fourth connection wires 60 respectively, so as to provide second gate signals to the data writing sub-circuits in the plurality of rows of sub-pixels P. The second scan driving circuit 22 is located between the first scan driving circuit 21 and the third scan driving circuit 23. That is, the third scan driving circuit 23 is located on a side of the second scan driving circuit 22 proximate to the display area 10. For example, the third scan driving circuit 23 provides a second gate signal for a P-type transistor in the sub-pixel P; and therefore, the third scan driving circuit 23 may also be referred to as a gate GOA P (GP). Each of the fourth connection wires 60 and the second gate line GPi connected thereto may be formed a one-piece structure, and in an actual application, widths of the fourth connection wire 60 and the second gate line GPi may be the same or different, which is not limited in the present disclosure.

As shown in FIG. 1, data lines DL1 to DLn (where n is an integer greater than 1) pass through the display area AA in a vertical direction to provide data signals for the plurality of columns of sub-pixels P arranged in the array. For example, the pixel circuit in the sub-pixel P operates under control of the data signal transmitted by the data line, the gate signal transmitted by the gate line and the enable signal, so as to drive the light-emitting element to emit light, thereby realizing operations such as display. The light-emitting element may be, for example, an organic light-emitting diode (OLED) or a quantum dot light-emitting diode (QLED), which is not limited in the embodiments of the present disclosure.

Figure 2:
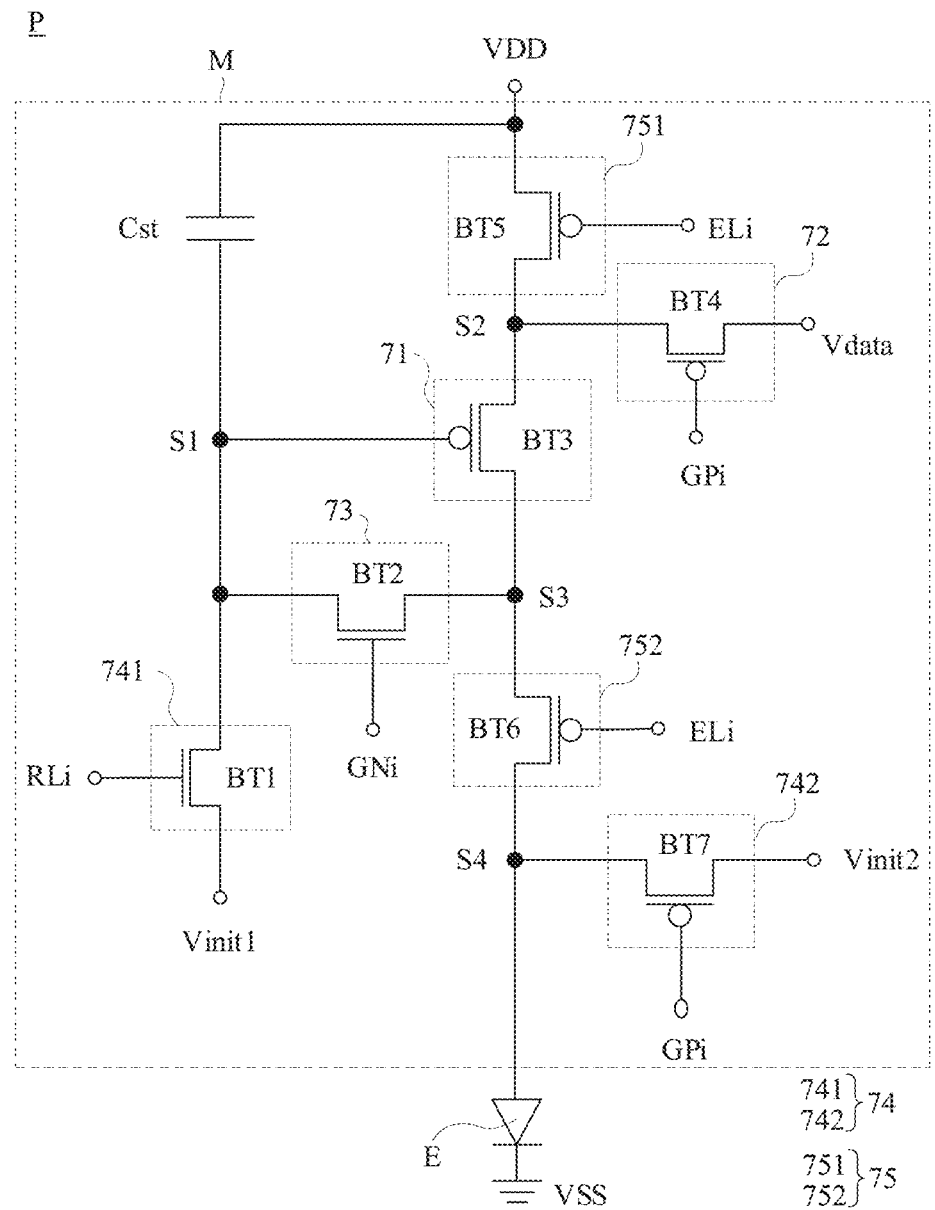
FIG. 2 is a structural diagram of a pixel circuit, in accordance with some embodiments.

FIG. 2 is a circuit diagram of a sub-pixel, in accordance with some embodiments. As shown in FIG. 2, the sub-pixel P includes a light-emitting element E and a pixel circuit M for driving the light-emitting element E to emit light. The pixel circuit M includes a driving sub-circuit 71, a data writing sub-circuit 72, a compensation sub-circuit 73, a reset sub-circuit 74, an enable sub-circuit 75, and a storage capacitor Cst.

The reset sub-circuit 74 includes a first reset sub-circuit 741, and the first reset sub-circuit 741 includes a first reset transistor BT1. The compensation sub-circuit 73 includes a compensation transistor BT2. The driving sub-circuit 71 includes a driving transistor BT3. The data writing sub-circuit 72 includes a data writing transistor BT4. The enable sub-circuit 75 includes a first enable sub-circuit 751 and a second enable sub-circuit 752; the first enable sub-circuit 751 includes a first enable transistor BT5, and the second enable sub-circuit 752 includes a second enable transistor BT6. The reset sub-circuit 74 further includes a second reset sub-circuit, and the second reset sub-circuit 742 includes a second reset transistor BT7. For example, the first reset transistor BT1 and the compensation transistor BT2 are N-type transistors, the data writing transistor BT4 and the second reset transistor BT7 are P-type transistors. The connection relationship and the operation principle of the pixel circuit in the embodiments of the present disclosure are merely examples, and the pixel circuit may adopt other structures as needed, which is not limited in the present disclosure.

As shown in FIG. 2, in some embodiments, the integral description of the pixel circuit M is made below.

A control electrode of the first reset transistor BT1 is coupled to the reset signal line RTi, and a first electrode of the first reset transistor BT1 is coupled to a first initial signal line Vinit1. The first reset transistor BT1 is configured to transmit a first initial signal provided by the first initial signal line Vinit1 to a first node S1 under control of the first reset signal provided by the reset signal line RTi.

A control electrode of the compensation transistor BT2 is coupled to the first gate line GNi, a first electrode of the compensation transistor BT2 is coupled to the first node S1, and a second electrode of the compensation transistor BT2 is coupled to a third node. The compensation transistor BT2 is configured to form a path between the first node S1 and the third node S3 under control of the first gate signal provided by the first gate line GNi.

A control electrode of the driving transistor BT3 is coupled to the first node S1, a first electrode of the driving transistor BT3 is coupled to a second node S2, and a second electrode of the driving transistor BT3 is coupled to the third node S3. The driving transistor BT3 is configured to form a path between the second node S2 and the third node S3 under control of a potential of the first node S1.

A control electrode of the data writing transistor BT4 is coupled to the second gate line GPi, a first electrode of the data writing transistor BT4 is coupled to the data line Vdata, and a second electrode of the data writing transistor BT4 is coupled to the second node S2. The data writing transistor BT4 is configured to transmit the data signal provided by the data line Vdata to the second node S2 under control of the second gate signal provided by the second gate line GPi.

A control electrode of the first enable transistor BT5 is coupled to the enable signal line ELi, a first electrode of the first enable transistor BT5 is coupled to a first power supply terminal VDD, and a second electrode of the first enable transistor BT5 is coupled to the second node S2. The first enable transistor BT5 is configured to transmit a first power supply signal provided by the first power supply terminal to the second node S2 under control of the enable signal provided by the enable signal line ELi.

A control electrode of the second enable transistor BT6 is coupled to the enable signal line ELi, a first electrode of the second enable transistor BT6 is coupled to the third node, and a second electrode of the second enable transistor BT6 is coupled to a fourth node. The second enable transistor BT6 is configured to form a path between the third node and the fourth node under the control of the enable signal provided by the enable signal line ELi.

A control electrode of the second reset transistor BT7 is coupled to the second gate line GPi, a first electrode of the second reset transistor BT7 is coupled to a second initial signal line Vinit2, and a second electrode of the second reset transistor BT7 is coupled to the fourth node. The second reset transistor BT7 is configured to transmit a second initial signal provided by the second initial signal line Vinit2 to the fourth node under the control of the second gate signal provided by the second gate line GPi.

In some embodiments, any one of the scan driving circuits includes a plurality of cascaded shift registers, and each shift register is used to drive one or more rows of sub-pixels P. Embodiments of the present disclosure are described by taking an example where each shift register is used to drive a row of sub-pixels P, but the embodiments of the present disclosure are not limited thereto.

For example, the peripheral area may further include a first voltage signal line (not shown in FIG. 1) and a second voltage signal line (not shown in FIG. 1), the first voltage signal line is configured to provide a first voltage signal, and the second voltage signal line is configured to provide a second voltage signal. A potential value of the first voltage signal is less than a potential value of the second voltage signal. The first scan driving circuit 21 is coupled to the first voltage signal line to output the first voltage signal as a first portion of the enable signal. For example, the first voltage signal line is connected to a plurality of first shift registers in the first scan driving circuit 21. The first portion of the enable signal is, for example, a low potential portion of the enable signal. For example, the low potential portion of the enable signal may enable the first enable transistor BT5 and the second enable transistor BT6 to be in an on state during a light-emitting phase. The first scan driving circuit 21 is further coupled to the second voltage signal line to output a second voltage as a second portion of the enable signal. For example, the second voltage signal line is coupled to the plurality of first shift registers in the first scan driving circuit 21. The second portion of the enable signal is, for example, a high level portion of the enable signal. For example, the high potential portion of the enable signal may enable the first enable transistor BT5 and the second enable transistor BT6 to be in an off state during the light-emitting phase.

Figure 3:
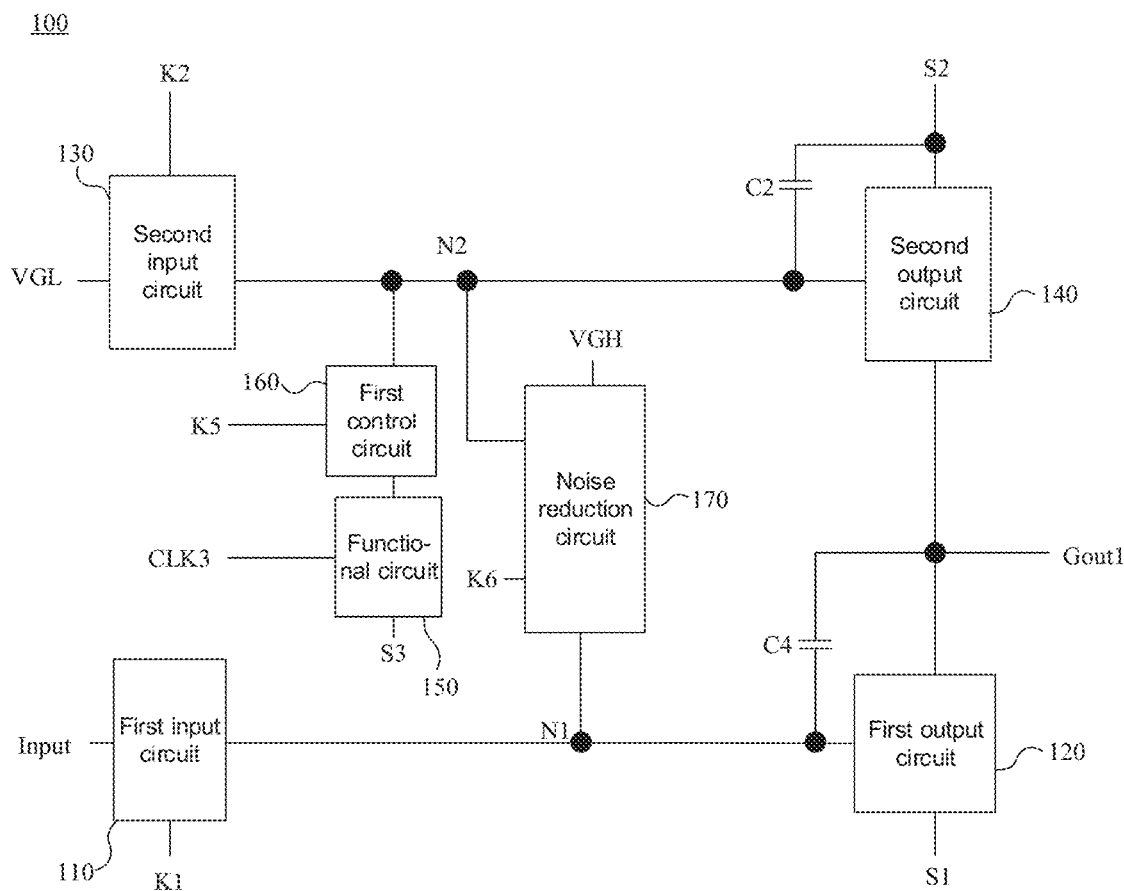
FIG. 3 is a structural diagram of a shift register, in accordance with some embodiments.

Referring to FIG. 3, FIG. 3 is a structural diagram of a shift register in accordance with some embodiments. Embodiments of the present disclosure provide a shift register 100. The shift register 100 includes a first input circuit 110, a first output circuit 120, a second input circuit 130, a second output circuit 140, and at least one functional circuit 150.

The first input circuit 110 is coupled to an input signal terminal Input, a first control signal terminal K1 and a first node N1. The first input circuit 110 is configured to transmit an input signal provided by the input signal terminal Input to the first node N1 under control of a first control signal provided by the first control signal terminal K1.

In some examples, the first control signal terminal K1 may be a first clock signal terminal CLK1. In some other examples, the first control signal terminal K1 may be a first auxiliary clock signal terminal NCLK1. In still other examples, the first control signal terminal K1 may include the first clock signal terminal CLK1 and a second clock signal terminal CLK2. In still other examples, the first control signal terminal K1 may include the first clock signal terminal CLK1 and a second auxiliary clock signal terminal NCLK2. In still other examples, the first control signal terminal K1 may include the first auxiliary clock signal terminal NCLK1 and the second clock signal terminal CLK2.

The first output circuit 120 is coupled to a first output signal terminal S1, the first node N1, and a first scan signal terminal Gout1. The first output circuit 120 is configured to transmit a first output signal provided by the first output signal terminal S1 to the first scan signal terminal Gout1 under control of a potential of the first node N1.

The first output signal terminal S1 may include a fourth clock signal terminal CLK4 or a first voltage signal terminal VGL.

The second input circuit 130 is coupled to the first voltage signal terminal VGL, a second control signal terminal K2 and a second node N2. The second input circuit 130 is configured to transmit a first voltage signal provided by the first voltage signal terminal VGL to the second node N2 under control of a second control signal provided by the second control signal terminal K2.

The second control signal terminal K2 may include a first clock signal terminal CLK1 or a first auxiliary clock signal terminal NCLK1.

The second output circuit 140 is coupled to a second output signal terminal S2, the second node N2 and the first scan signal terminal Gout1. The second output circuit 140 is configured to transmit a second output signal provided by the second output signal terminal S2 to the first scan signal terminal Gout1 under control of a potential of the second node N2.

The second output signal terminal S2 may include a second voltage signal terminal VGH or the second clock signal terminal CLK2.

The input signal terminal coupled to the first input circuit 110 in a current shift register may be coupled to the first scan signal terminal in a previous stage of shift register, or may be coupled to the frame start signal line STV.

A functional circuit 150 is coupled to a functional input terminal, a functional output terminal and a functional control terminal. The functional circuit 150 is configured to, under control of a functional control signal provided by the functional control terminal, block a path between the functional input terminal and the functional output terminal to maintain a potential of the functional output terminal.

The functional input terminal may include one of a plurality of clock signal terminals, e.g., the first clock signal terminal CLK1 or the fourth clock signal terminal CLK4. The functional input terminal may also include one of a plurality of voltage signal terminals, e.g., the first voltage signal terminal VGL or the second voltage signal terminal VGH. The functional input terminal may also include the input signal terminal Input, or one of a plurality of circuit nodes, which is not limited here.

The functional control terminal may include one of the plurality of circuit nodes, e.g., the first node N1. The functional control terminal may also include one of the plurality of voltage signal terminals, e.g., the second voltage signal terminal VGH. The functional control terminal may also include one of the plurality of clock signal terminals, e.g., a third clock signal terminal CLK3. The functional control terminal may also include one of a plurality of auxiliary clock signal terminals. For example, the functional control terminal is the first auxiliary clock signal terminal NCLK1. For another example, the functional control terminal is a third auxiliary clock signal terminal NCLK3. Of course, the functional control terminal may also be one of a plurality of scan signal terminals, which is not limited here.

The functional output terminal may include one of the plurality of circuit nodes, and the circuit nodes include at least the first node N1 and the second node N2. That is, the functional output terminal of the functional circuit 150 is coupled to a circuit node.

The functional circuit 150 blocks the path between the functional input terminal and the functional output terminal under the control of the functional control signal provided by the functional control terminal. Therefore, the functional circuit 150 has a function of blocking the functional input terminal and the functional output terminal. In the shift register provided in the embodiments of the present disclosure, the functional circuit 150 can block the path between the functional input terminal and the functional output terminal under the control of the functional control signal provided by the functional control terminal, which alleviates or even eliminates an influence of a potential of the functional input terminal on a potential of the functional output terminal, improves stability of a potential of the circuit node inside the shift register, and thus improve reliability of the display apparatus.

In some embodiments, the functional circuit 150 may be a switching circuit. Under the control of the functional control signal provided by the functional control terminal, the path between an input terminal (i.e., the functional input terminal) of the switching circuit and an output terminal (i.e., the functional output terminal) of the switching circuit is blocked.

In some embodiments, the functional circuit 150 may include an oxide transistor (e.g., low temperature polycrystalline oxide thin film transistor (LTPO TFT)). A control electrode of the oxide transistor is coupled to the functional control terminal, a first electrode of the oxide transistor is coupled to the functional input terminal, and a second electrode of the oxide transistor is coupled to the functional output terminal.

The oxide transistor refers to a transistor having an oxide semiconductor channel. A material of the oxide semiconductor channel may include a suitable oxide material such as indium gallium zinc oxide (IGZO), which is not limited here. A leakage current of the oxide transistor in an off-state is less than a leakage current of a low temperature polysilicon thin film transistor (LTPS TFT), which can alleviate or even eliminate the influence of the potential of the first electrode (the functional input terminal) of the oxide transistor on the potential of the second electrode (the functional output terminal) of the oxide transistor, improve the stability of the potential of the control node inside the shift register, and thus improve the reliability of the display apparatus.

Figure 4A:
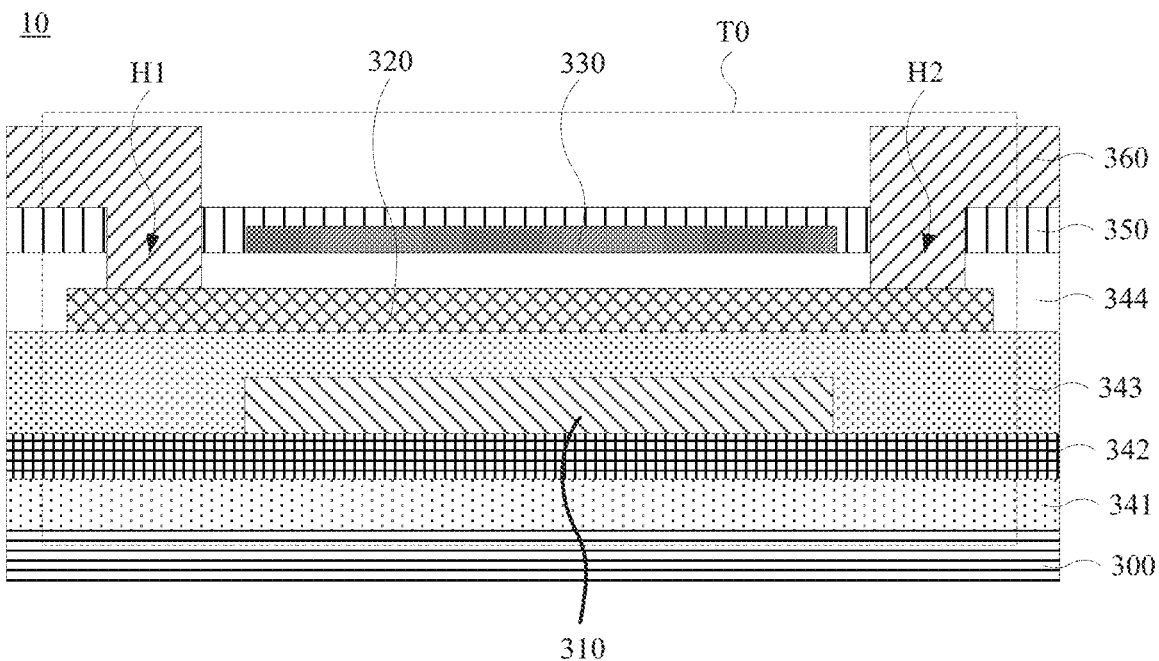
FIG. 4A is a sectional view of an oxide transistor in a shift register at an angle, in accordance with some embodiments.

As shown in FIG. 4A, in some embodiments, the oxide transistor TO in a display substrate 10 includes a first gate pattern 310, an active layer 320, and a second gate pattern 330 that are sequentially stacked on a side of a substrate 300. A material of the active layer 320 includes an oxide semiconductor material.

The substrate 300 may be an organic substrate or an inorganic substrate. A material of the substrate 300 may be polyethylene terephthalate (PET), polyimide (PI), cycloolefin polymer (COP), or glass, which is not limited here.

At least one gate insulating layer may be disposed between the substrate 300 and the first gate pattern 310. As shown in FIG. 4A, a first gate insulating layer 341 and a second gate insulating layer 342 are sequentially disposed on the substrate 300 in a direction away from the substrate 300.

A material of the first gate insulating layer 341 and/or a material of the second gate insulating layer 342 may be an oxide, a nitride, or a combination of one or more of oxynitride, which is not limited here. In some examples, the material of the first gate insulating layer 341 includes the oxide, and the material of the second gate insulating layer 342 includes the nitride.

In some embodiments, a buffer layer may be included between the substrate 300 and the first gate insulating layer 341, which is not limited here.

As shown in FIG. 4A, the first gate pattern 310 is formed on the second gate insulating layer 342. A material of the first gate pattern 310 may be a conductive material, such as a metal material or an alloy material. The metal material is, for example, aluminum (Al), silver (Ag), magnesium (Mg), ytterbium (Yb), lithium (Li), or the like.

A third gate insulating layer 343 may be included between the first gate pattern 310 and the active layer 320. The third gate insulating layer 343 covers the first gate pattern 310. A material of the third gate insulating layer 343 may be the same as the material of the first gate insulating layer 341 and/or the material of the second gate insulating layer 342, which will not be repeated here.

The active layer 320 is formed on the third gate insulating layer 343. A fourth gate insulating layer 344 may be included between the active layer 320 and the second gate pattern 330. The fourth gate insulating layer 344 covers the active layer 320. A material of the fourth gate insulating layer 344 may be the same as the material of the first gate insulating layer 341 and/or the material of the second gate insulating layer 342, which will not be repeated here.

The second gate pattern 330 is formed on the fourth gate insulating layer 344. A dimension of the active layer 320 in a direction parallel to the substrate 300 may be smaller than a dimension of the second gate pattern 330 in the direction parallel to the substrate 300. The dimension of the active layer 320 in the direction parallel to the substrate 300 may also be greater than the dimension of the second gate pattern 330 in the direction parallel to the substrate 300. For example, an orthographic projection of the second gate pattern 330 on the substrate 300 may be located within an orthographic projection of the active layer 320 on the substrate 300.

The active layer 320 is located between the first gate pattern 310 and the second gate pattern 330. That is, the orthographic projection of the active layer 320 on the substrate 300 is located within an overlapping region between the orthographic projection of the second gate pattern 330 on the substrate 300 and an orthographic projection of the first gate pattern 310 on the substrate 300.

As shown in FIG. 4A, an interlayer dielectric layer 350 and source-drain metal patterns 360 may further be included on the second gate pattern 330. The interlayer dielectric layer 350 covers the second gate pattern 330. The source-drain metal patterns 360 may be in electrical contact with the active layer 320 by penetrating through the interlayer dielectric layer 350 and the fourth gate insulating layer 344. The first gate pattern 310 and the second gate pattern 330 may be in electrical contact with different conductive patterns respectively, or may be in electrical contact with the same conductive pattern, which is not limited here.

Figure 4B:
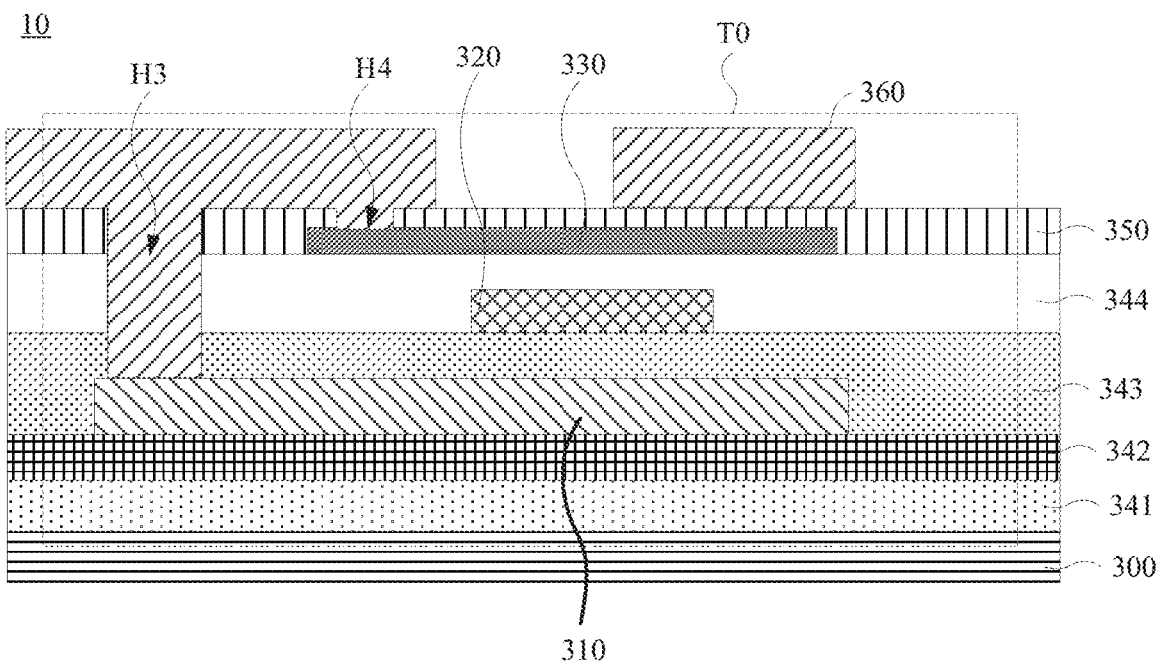
FIG. 4B is a sectional view of an oxide transistor in a shift register at an another angle, in accordance with some embodiments.

As shown in FIG. 4B, in some embodiments, the oxide transistor TO includes source-drain metal patterns 360. A same source-drain metal pattern 360 is coupled to the first gate pattern 310 and the second gate pattern 330.

A dimension of the active layer 320 in a direction parallel to the substrate 300 may be smaller than a dimension of the first gate pattern 310 in the direction parallel to the substrate 300. An orthographic projection of the active layer 320 on the substrate 300 may be located within an orthographic projection of the first gate pattern 310 on the substrate 300.

The source-drain metal pattern 360 may be in direct contact with the first gate pattern 310 and the second gate pattern 330 to achieve coupling of the source-drain metal pattern 360 to the first gate pattern 310 and the second gate pattern 330. The source-drain metal pattern 360 may also be coupled to the first gate pattern 310 and the second gate pattern 330 through via holes.

In some examples, as shown in FIG. 4B, a source-drain metal pattern 360 is located on a side of the first gate pattern 310 and the second gate pattern 330 away from the substrate 300, and the source-drain metal pattern 360 is coupled to the first gate pattern 310 through a third via hole H3, and is coupled to the second gate pattern 330 through s fourth via hole H4.

There may be various arrangements of the first input circuit 110, which are described in detail below through various embodiments.

Figure 5:
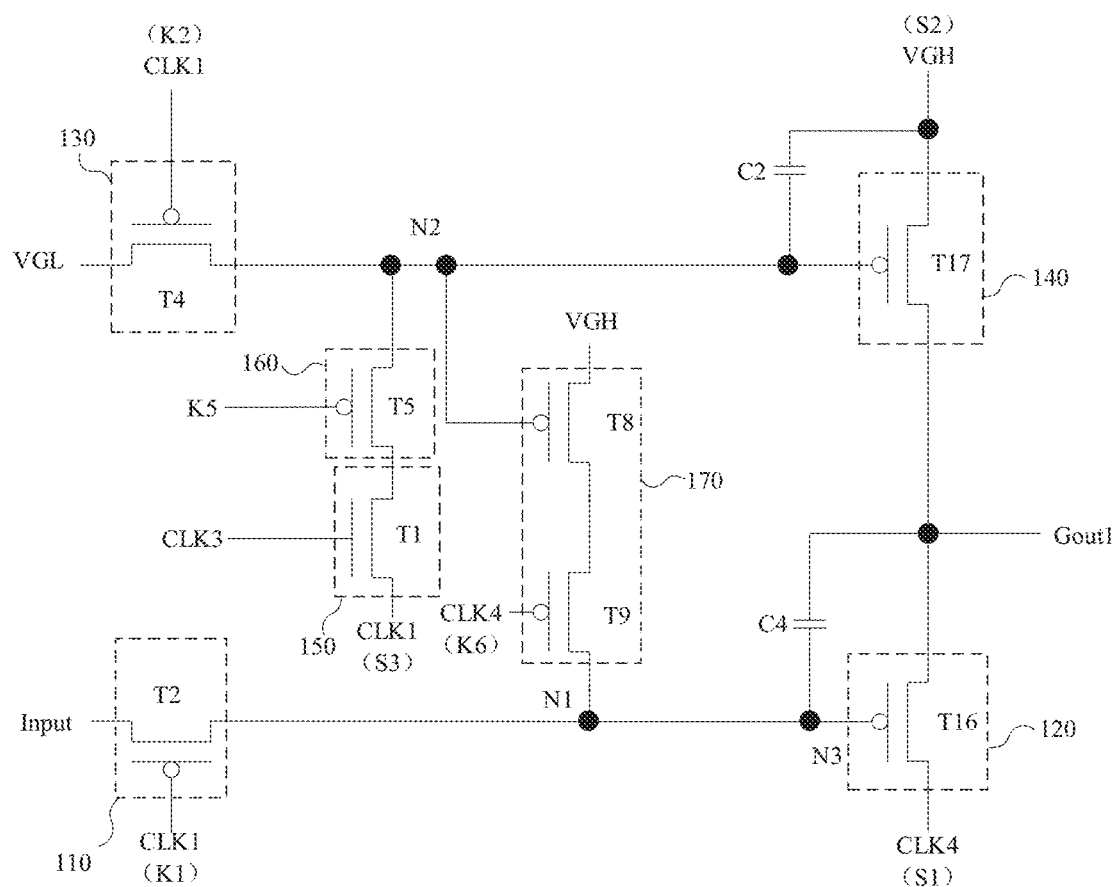
FIG. 5 is a structural diagram of a shift register, in accordance with some embodiments.

As shown in FIG. 5, in some embodiments, the first control signal terminal K1 includes the first clock signal terminal CLK1. The first input circuit 110 includes a second transistor T2.

For example, a control electrode of the second transistor T2 is coupled to the first clock signal terminal CLK1, a first electrode of the second transistor T2 is coupled to the input signal terminal Input, and a second electrode of the second transistor T2 is coupled to the first node N1.

In some examples, the second transistor T2 is a P-type transistor. The second transistor T2 transmits the input signal provided by the input signal terminal to the first node N1 under control of the first clock signal being at a low potential.

Figure 6:
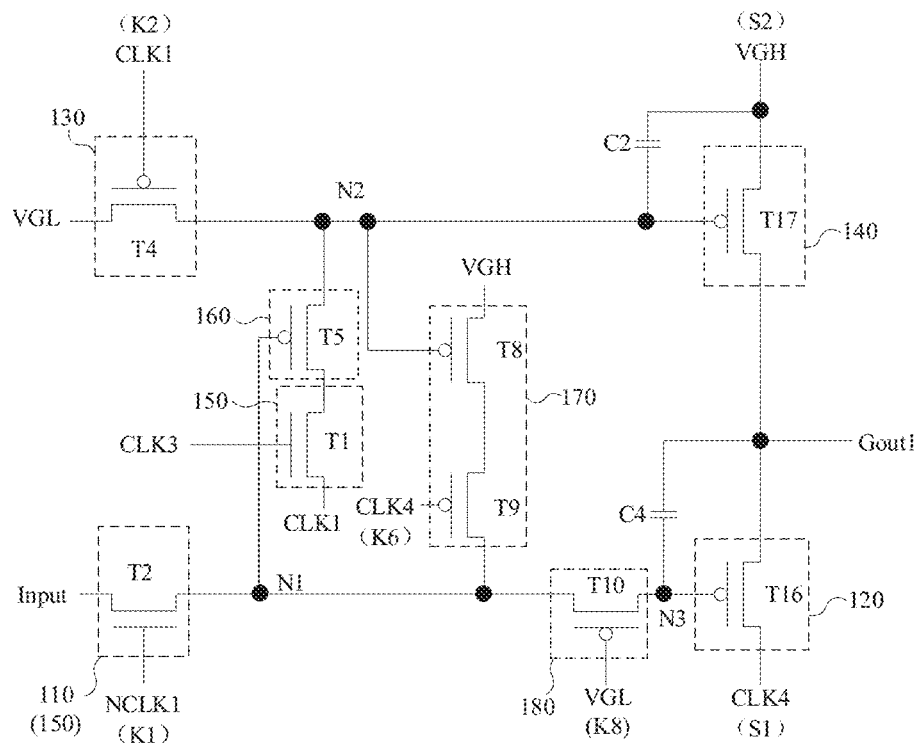
FIG. 6 is a structural diagram of a shift register, in accordance with some embodiments.

As shown in FIG. 6, in some other embodiments, the first control signal terminal K1 includes the first auxiliary clock signal terminal NCLK1, and the first input circuit 110 is further used as a functional circuit 150. The first auxiliary clock signal terminal NCLK1 is used as a functional control terminal, the input signal terminal is used as a functional input terminal, and the first node N1 is used as a functional output terminal.

The first input circuit 110 is further configured to block a path between the input signal terminal and the first node N1 under control of a first auxiliary clock signal provided by the first auxiliary clock signal terminal NCLK1, so as to maintain the potential of the first node N1.

In some examples, in a case where the first auxiliary clock signal provided by the first auxiliary clock signal terminal NCLK1 is at a valid potential (e.g., a high potential), the path between an input terminal (the input signal terminal) of the first input circuit 110 and an output terminal (the first node N1) of the first input circuit 110 is formed to transmit the input signal provided by the input signal terminal to the first node N1. In a case where the first auxiliary clock signal provided by the first auxiliary clock signal terminal NCLK1 is at an invalid potential (e.g., a low potential), the path between the input terminal (the input signal terminal) of the first input circuit 110 and the output terminal (the first node N1) of the first input circuit 110 is blocked to maintain the potential of the first node N1.

As shown in FIG. 6, in some examples, the first input circuit 110 includes a second transistor T2, and the second transistor T2 includes an oxide transistor.

For example, a control electrode of the second transistor T2 is coupled to the first auxiliary clock signal terminal NCLK1, a first electrode of the second transistor T2 is coupled to the input signal terminal, and a second electrode of the second transistor T2 is coupled to the first node N1.

In an example where the second transistor T2 is an N-type transistor, in the case where the first auxiliary clock signal is at the valid potential (e.g., the high potential), the path between the first electrode of the second transistor T2 (the input signal terminal) and the second electrode of the second transistor T2 (the first node N1) is formed, and the input signal provided by the input signal terminal is transmitted to the first node N1. In a case where the first auxiliary clock signal is at the invalid potential (e.g., the low potential), the path between the first electrode of the second transistor T2 (the input signal terminal) and the second electrode of the second transistor T2 (the first node N1) is blocked to maintain the potential of the first node N1.

Figure 7:
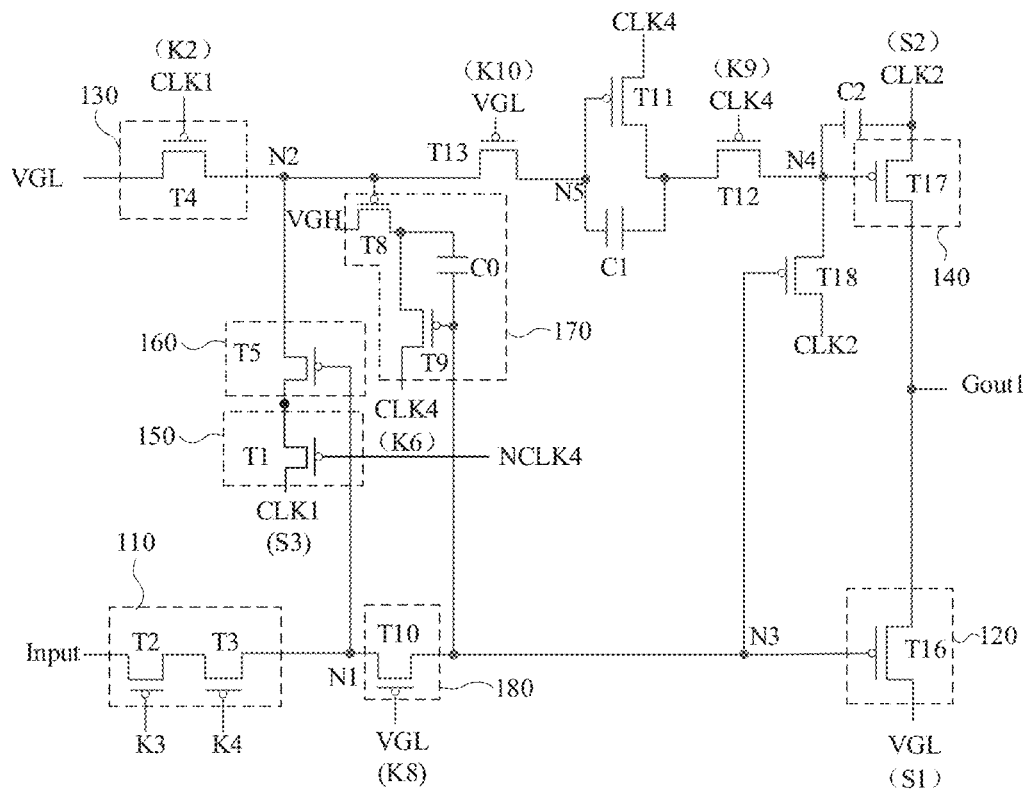
FIG. 7 is a structural diagram of a shift register, in accordance with some embodiments.
Figure 8:
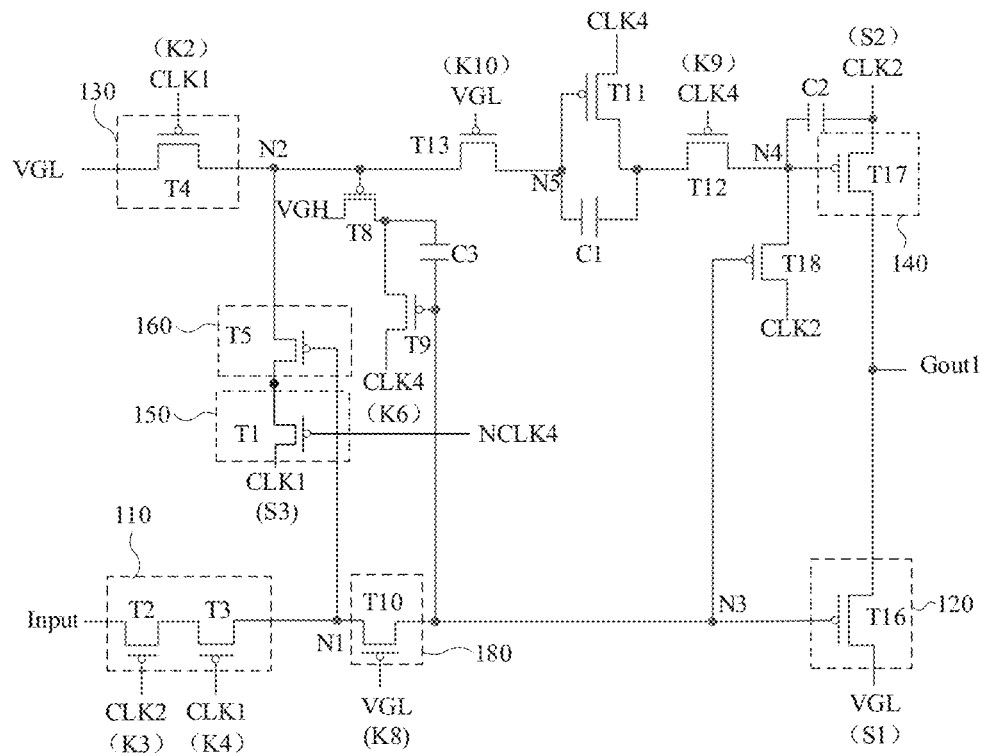
FIG. 8 is a structural diagram of a shift register, in accordance with some embodiments.
Figure 9:
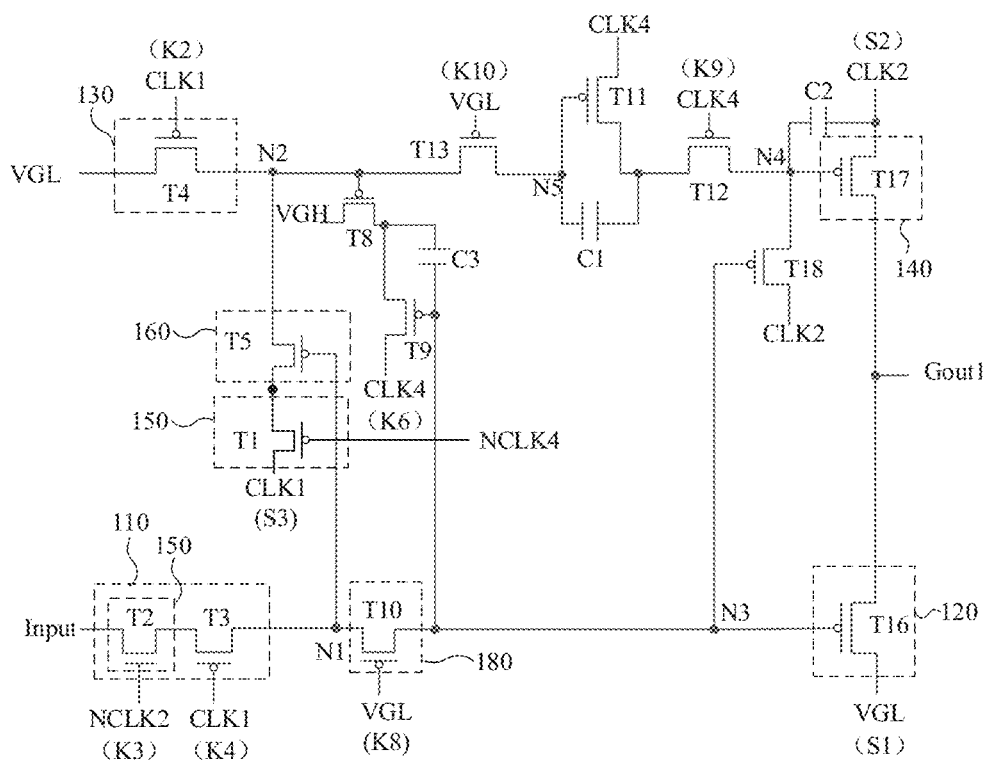
FIG. 9 is a structural diagram of a shift register, in accordance with some embodiments.

As shown in FIGS. 7 to 9, in still other embodiments, the first control signal terminal K1 includes a third control signal terminal K3 and a fourth control signal terminal K4. The third control signal terminal K3 may be one of the plurality of clock signal terminals, e.g., the first clock signal terminal CLK1. The third control signal terminal K3 may also be one of the plurality of auxiliary clock signal terminals, e.g., the first auxiliary clock signal terminal NCLK1. The fourth control signal terminal K4 may be one of the plurality of clock signal terminals, e.g., the second clock signal terminal CLK2. The fourth control signal terminal K4 may also be one of the plurality of auxiliary clock signal terminals, e.g., the second auxiliary clock signal terminal NCLK2.

As shown in FIG. 7, the first input circuit 110 is coupled to the third control signal terminal K3 and the fourth control signal terminal K4. The first input circuit 110 is further configured to transmit the input signal provided by the input signal terminal to the first node N1 under control of a third control signal provided by the third control signal terminal K3 and a fourth control signal provided by the fourth control signal terminal K4.

In some examples, the third control signal terminal K3 is the second clock signal terminal CLK2, and the fourth control signal terminal K4 is the first clock signal terminal CLK1. As shown in FIG. 8, the first input circuit 110 includes a second transistor T2 and a third transistor T3. A control electrode of the second transistor T2 is coupled to the second clock signal terminal CLK2, a first electrode of the second transistor T2 is coupled to the input signal terminal, a second electrode of the second transistor T2 is coupled to a first electrode of the third transistor T3; a control electrode of the third transistor T3 is coupled to the first clock signal terminal CLK1, and a second electrode of the third transistor T3 is coupled to the first node N1.

In an example where the second transistor T2 and the third transistor T3 are P-type transistors, in a case where a second clock signal provided by the second clock signal terminal CLK2 and a third clock signal provided by the third clock signal terminal CLK3 are both low potential signals, the path between the input signal terminal and the first node N1 is formed, and the input signal provided by the input signal terminal is transmitted to the first node N1.

As shown in FIG. 9, in still other embodiments, the first input circuit 110 includes a functional circuit 150, and the functional circuit 150 is coupled in series between the input signal terminal and the first node N1.

In some embodiments, the third control signal terminal K3 is used as a functional control terminal. The functional circuit 150 is configured to block the path between the input signal terminal and the first node N1 under control of the third control signal provided by the third control signal terminal K3, so as to maintain the potential of the first node N1.

In some examples, the first input circuit 110 includes a second transistor T2 and a third transistor, and the second transistor T2 includes an oxide transistor. A control electrode of the second transistor T2 is coupled to the third control signal terminal K3, a first electrode of the second transistor T2 is coupled to the input signal terminal, and a second electrode of the second transistor T2 is coupled to a first electrode of the third transistor T3; a control electrode of the third transistor T3 is coupled to the fourth control signal terminal K4, and a second electrode of the third transistor T3 is coupled to the first node N1. In a case where the third control signal provided by the third control signal terminal K3 is at an invalid potential, a path between the first electrode of the second transistor T2 and the second electrode of the second transistor T2 is blocked, so that the path between the input signal terminal and the first node N1 is blocked to maintain the potential of the first node N1. The input signal terminal serves as a functional input terminal, and the first node N1 serves as a functional output terminal through the third transistor T3.

For example, the second transistor T2 is an N-type transistor, and the third transistor T3 is a P-type transistor. In a case where the third control signal provided by the third control signal terminal K3 is a high potential signal and the fourth control signal provided by the fourth control signal terminal K4 is a low potential signal, the path between the input signal terminal and the first node N1 is formed, and the input signal provided by the input signal terminal is transmitted to the first node N1. In a case where the third control signal provided by the third control signal terminal K3 is a low potential signal, a path between the first electrode of the second transistor T2 and the second electrode of the second transistor T2 is blocked, so that the path between the input signal terminal and the first node N1 is blocked to maintain the potential of the first node N1.

As shown in FIG. 9, in some examples, the third control signal terminal K3 includes the second auxiliary clock signal terminal NCLK2, and the fourth control signal terminal K4 includes the first clock signal terminal CLK1. The first input circuit 110 includes the second transistor T2 and the third transistor T3, and the second transistor T2 includes the oxide transistor.

In some examples, the second transistor T2 is an N-type transistor, and the third transistor T3 is a P-type transistor. In a case where the second auxiliary clock signal provided by the second auxiliary clock signal terminal NCLK2 is a high potential signal and the first clock signal provided by the first clock signal terminal CLK1 is a low potential signal, the path between the input signal terminal and the first node N1 is formed, and the input signal provided by the input signal terminal is transmitted to the first node N1. In a case where the second auxiliary clock signal provided by the second auxiliary clock signal terminal NCLK2 is a low potential signal, the path between the first electrode of the second transistor T2 and the second electrode of the second transistor T2 is blocked, so that the path between the input signal terminal and the first node N1 is blocked to maintain the potential of the first node N1.

Figure 10:
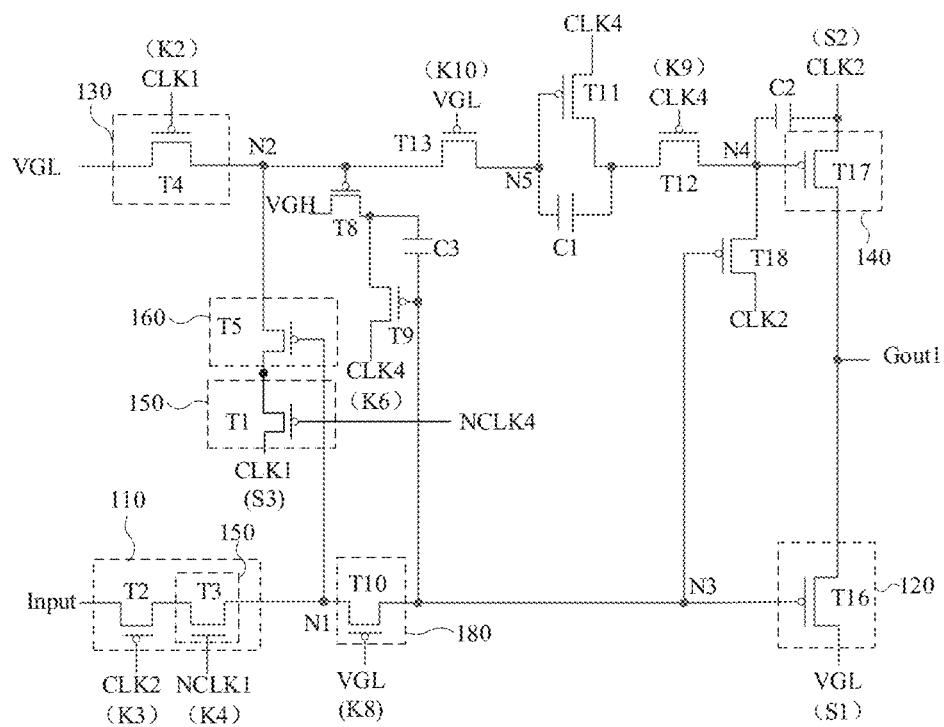
FIG. 10 is a structural diagram of a shift register, in accordance with some embodiments.

As shown in FIG. 10, in some other embodiments, the fourth control signal terminal K4 serves as the functional control terminal. The functional circuit 150 is configured to block the path between the input signal terminal and the first node N1 under control of the fourth control signal provided by the fourth control signal terminal K4, so as to maintain the potential of the first node N1.

In some examples, the first input circuit 110 includes a second transistor T2 and a third transistor T3, and the third transistor T3 includes an oxide transistor. A control electrode of the second transistor T2 is coupled to the third control signal terminal K3, a first electrode of the second transistor T2 is coupled to the input signal terminal, and a second electrode of the second transistor T2 is coupled to a first electrode of the third transistor T3; a control electrode of the third transistor T3 is coupled to the fourth control signal terminal K4, and a second electrode of the third transistor T3 is coupled to the first node N1. In a case where the fourth control signal provided by the fourth control signal terminal K4 is at an invalid potential, the path between the first electrode of the third transistor T3 and the second electrode of the third transistor T3 is blocked, so that the path between the input signal terminal and the first node N1 is blocked to maintain the potential of the first node N1. The input signal terminal serves as the functional input terminal through the second transistor T2, and the first node N1 serves as the functional output terminal.

For example, the second transistor T2 is a P-type transistor, and the third transistor T3 is an N-type transistor. In a case where the third control signal provided by the third control signal terminal K3 is a low potential signal and the fourth control signal provided by the fourth control signal terminal K4 is a high potential signal, the path between the input signal terminal and the first node N1 is formed, and the input signal provided by the input signal terminal is transmitted to the first node N1. In a case where the fourth control signal provided by the fourth control signal terminal K4 is a low potential signal, the path between the first electrode of the third transistor T3 and the second electrode of the third transistor T3 is blocked, so that the path between the input signal terminal and the first node N1 is blocked to maintain the potential of the first node N1.

As shown in FIG. 10, in some examples, the third control signal terminal K3 includes the second clock signal terminal CLK2, and the fourth control signal terminal K4 includes the first auxiliary clock signal terminal NCLK1. The first input circuit 110 includes the second transistor T2 and the third transistor T3, and the third transistor T3 includes the oxide transistor.

In some examples, the second transistor T2 is a P-type transistor, and the third transistor T3 is an N-type transistor. In a case where the second clock signal provided by the second clock signal terminal CLK2 is a low potential signal and the first auxiliary clock signal provided by the first auxiliary clock signal terminal NCLK1 is a high potential signal, the path between the input signal terminal and the first node N1 is formed, and the input signal provided by the input signal terminal is transmitted to the first node N1. In a case where the first auxiliary clock signal provided by the first auxiliary clock signal terminal NCLK1 is at a low potential, the path between the first electrode of the third transistor T3 and the second electrode of the third transistor T3 is blocked, so that the path between the input signal terminal and the first node N1 is blocked to maintain the potential of the first node N1.

There may be various arrangements of the second input circuit 130, which are described in detail below through various embodiments.

As shown in FIG. 5, in some embodiments, the second control signal terminal K2 includes the first clock signal terminal CLK1. The second input circuit 130 includes a fourth transistor T4; a control electrode of the fourth transistor T4 is coupled to the first clock signal terminal CLK1, a first electrode of the fourth transistor T4 is coupled to the first voltage signal terminal VGL, and a second electrode of the fourth transistor T4 is coupled to the second node N2.

In some examples, the fourth transistor T4 is a P-type transistor. The fourth transistor T4 is configured to form a path between the first electrode of the fourth transistor T4 (the first voltage signal terminal VGL) and the second electrode of the fourth transistor T4 (the second node N2) in a case where the first clock signal provided by the first clock signal terminal CLK1 is at a low potential, so as to transmit the first voltage signal provided by the first voltage signal terminal VGL to the second node N2.

Figure 11:
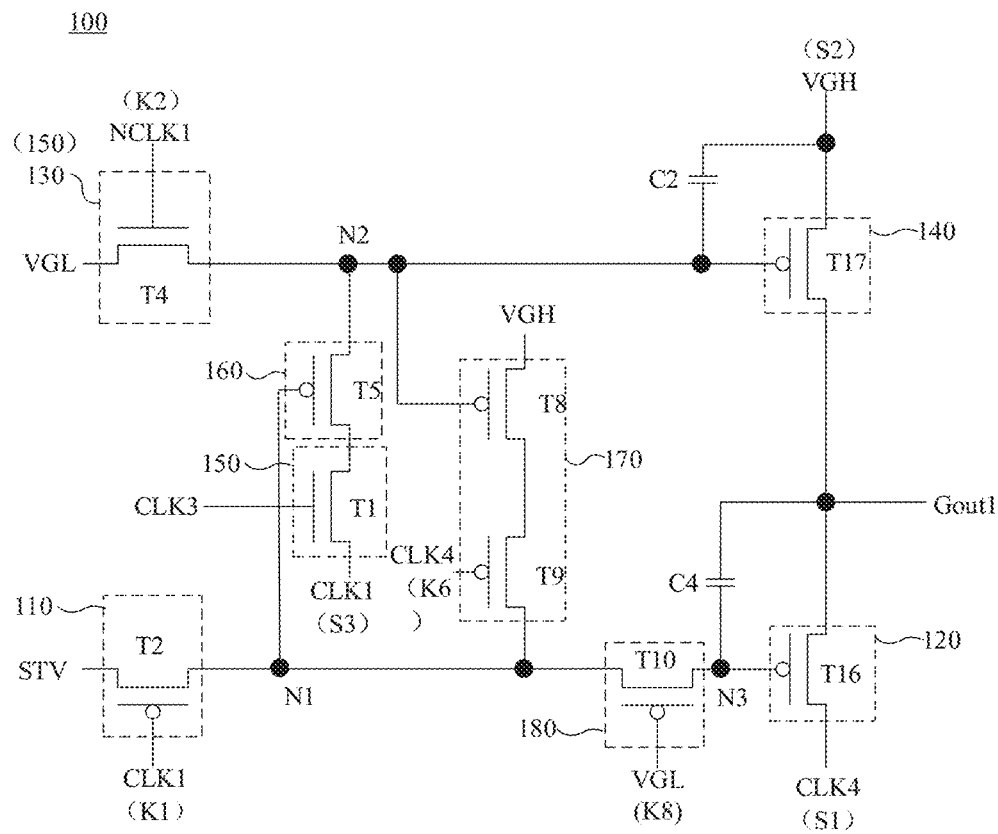
FIG. 11 is a structural diagram of a shift register, in accordance with some embodiments.

As shown in FIG. 11, in some other embodiments, the second control signal terminal K2 includes the first auxiliary clock signal terminal NCLK1. The second input circuit 130 is further used as a functional circuit 150. For example, the first voltage signal terminal VGL serves as a functional input terminal, the first auxiliary clock signal terminal NCLK1 serves as a functional control terminal, and the second node N2 serves as a functional output terminal.

The second input circuit 130 is configured to form the path between the first voltage signal terminal VGL and the second node N2 in a case where the first auxiliary clock signal provided by the first auxiliary clock signal terminal NCLK1 is at a valid potential, so as to transmit the first voltage signal provided by the first voltage signal terminal VGL to the second node N2.

The second input circuit 130 is further configured to block the path between the first voltage signal terminal VGL and the second node N2 in a case where the first auxiliary clock signal provided by the first auxiliary clock signal terminal NCLK1 is at an invalid potential, so as to maintain the potential of the second node N2.

As shown in FIG. 11, in some examples, the second input circuit 130 includes a fourth transistor T4, and the fourth transistor T4 includes an oxide transistor.

A control electrode of the fourth transistor T4 is coupled to the first auxiliary clock signal terminal NCLK1, a first electrode of the fourth transistor T4 is coupled to the first voltage signal terminal VGL, and a second electrode of the fourth transistor T4 is coupled to the second node N2.

In some examples, the fourth transistor T4 is an N-type transistor. In a case where the first auxiliary clock signal provided by the first auxiliary clock signal terminal NCLK1 is a high potential signal, the path between the first electrode of the fourth transistor T4 (the first voltage signal terminal VGL) and the second electrode of the fourth transistor T4 (the second node N2) is formed to transmit the first voltage signal provided by the first voltage signal terminal VGL to the second node N2. In a case where the first auxiliary clock signal provided by the first auxiliary clock signal terminal NCLK1 is a low potential signal, the path between the first electrode of the fourth transistor T4 (the first voltage signal terminal VGL) and the second electrode of the fourth transistor T4 (the second node N2) is blocked, so that the path between the first voltage signal terminal VGL and the second node N2 is blocked to maintain the potential of the second node N2.

There may be various arrangements of a first control circuit 160, which are described in detail below through various embodiments.

As shown in FIG. 3, in some embodiments, the shift register further includes the first control circuit 160. The first control circuit 160 is coupled to a fifth control signal terminal K5, the second node N2 and a third output signal terminal S3. The first control circuit 160 is configured to transmit a third output signal provided by the third output signal terminal S3 to the second node N2 under control of a fifth control signal provided by the fifth control signal terminal K5.

The fifth control signal terminal K5 may be one of the plurality of clock signal terminals, e.g., the fourth clock signal terminal CLK4. The fifth control signal terminal K5 may also be one of the plurality of circuit nodes, e.g., the first node N1. The fifth control signal terminal K5 may also be the first scan signal terminal. The fifth control signal terminal K5 may also be one of the plurality of auxiliary clock signal terminals, e.g., the first auxiliary clock signal terminal NCLK1, which is not limited here.

The third output signal terminal S3 may be one of the plurality of clock signal terminals, e.g., the first clock signal terminal CLK1. The third output signal terminal S3 may also be one of the plurality of voltage signal terminals, e.g., the second voltage signal terminal VGH.

As shown in FIG. 5, in some embodiments, the first control circuit 160 includes a fifth transistor T5; a control electrode of the fifth transistor T5 is coupled to the fifth control signal terminal K5, a first electrode of the fifth transistor T5 is coupled to the third output signal terminal S3, and a second electrode of the fifth transistor T5 is coupled to the second node N2.

Figure 12:
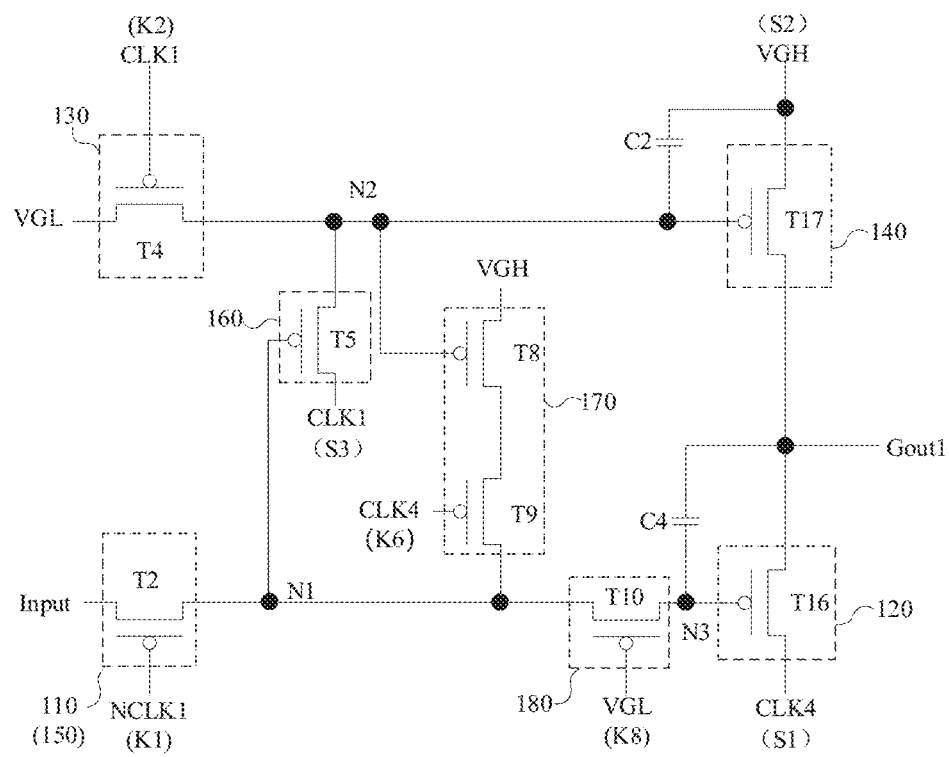
FIG. 12 is a structural diagram of a shift register, in accordance with some embodiments.

As shown in FIG. 12, in some examples, the fifth control signal is the first node N1, and the third output signal terminal S3 is the first clock signal terminal CLK1. The control electrode of the fifth transistor T5 is coupled to the first node N1, the first electrode of the fifth transistor T5 is coupled to the first clock signal terminal CLK1, and the second electrode of the fifth transistor T5 is coupled to the second node N2. The fifth transistor T5 is configured to transmit the first clock signal provided by the first clock signal terminal CLK1 to the second node N2 under control of the potential of the first node N1.

Figure 13:
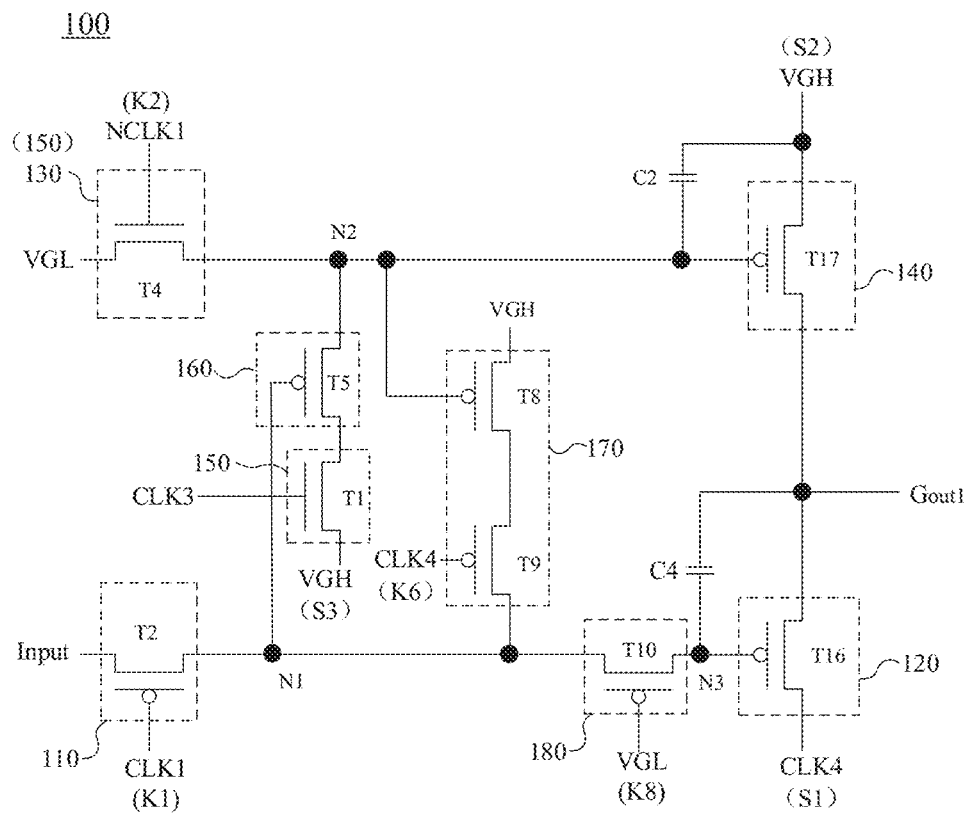
FIG. 13 is a structural diagram of a shift register, in accordance with some embodiments.

As shown in FIG. 13, in some other examples, the fifth control signal is the first node N1, and the third output signal terminal S3 is the second voltage signal terminal VGH. The control electrode of the fifth transistor T5 is coupled to the first node N1, the first electrode of the fifth transistor T5 is coupled to the second voltage signal terminal VGH, and the second electrode of the fifth transistor T5 is coupled to the second node N2. The fifth transistor T5 is configured to transmit the second voltage signal provided by the second voltage signal terminal VGH to the second node N2 under control of the potential of the first node N1.

As shown in FIG. 3, in some other embodiments, a functional circuit 150 is coupled in series between the second node N2 and the third output signal terminal S3. The third output signal terminal S3 includes the first clock signal terminal CLK1, and the functional control terminal includes the third clock signal terminal CLK3.

The functional circuit 150 is configured to block the path between the second node N2 and the first clock signal terminal CLK1 under control of the third clock signal provided by the third clock signal terminal CLK3, so as to maintain the potential of the second node N2.

The functional circuit 150 may be located between the first clock signal terminal CLK1 and the first control circuit 160; or the functional circuit 150 may be located between the second node N2 and the first control circuit 160. In a case where the functional circuit 150 is located at the two positions, a functional input terminal of the functional circuit 150 is the first clock signal terminal CLK1, and a functional output terminal of the functional circuit 150 is the second node N2; and the path between the first clock signal terminal CLK1 and the second node N2 may be blocked to maintain the potential of the second node N2.

The third clock signal provided by the third clock signal terminal CLK3 can control the functional circuit 150, and in a case where the first control circuit 160 controls the first clock signal terminal CLK1 and the second node N2 to form the path, the third clock signal is at a valid potential to control the path between the functional input terminal and the functional output terminal. That is, the functional circuit 150 does not affect the first clock signal terminal CLK1 and the second node N2 to form the path.

The third clock signal provided by the third clock signal terminal CLK3 can further control the functional circuit 150, and in a case where the first control circuit 160 controls the first clock signal terminal CLK1 and the second node N2 to form an open circuit and a potential of the first clock signal provided by the first clock signal terminal CLK1 is different from the potential of the second node N2, the third clock signal is at an invalid potential to control the path between the functional input terminal and the functional output terminal to be blocked, thereby ensuring that the second node N2 is not affected by the first clock signal provided by the first clock signal terminal CLK1, and maintaining the potential of the second node N2.

In some examples, the functional circuit 150 includes a first transistor T1, and the first transistor T1 includes an oxide transistor. The functional circuit 150 is coupled in series between the second node N2 and the first control circuit 160.

A control electrode of the first transistor T1 is coupled to the third clock signal terminal CLK3, a first electrode of the first transistor T1 is coupled to the second electrode of the fifth transistor T5, and a second electrode of the first transistor T1 is coupled to the second node N2. The first electrode of the fifth transistor T5 is coupled to the first clock signal terminal CLK1, and the control electrode of the fifth transistor T5 is coupled to the first node N1.

In some examples, the first transistor T1 is an N-type transistor. In a case where the third clock signal provided by the third clock signal terminal CLK3 is a high potential signal, the path between the first electrode of the first transistor T1 (coupled to the first clock signal terminal CLK1 through the fifth transistor T5) and the second electrode of the first transistor T1 (the second node N2) is formed to transmit the first clock signal provided by the first clock signal terminal CLK1 to the second node N2. In a case where the third clock signal provided by the third clock signal terminal CLK3 is a low potential signal, the path between the first electrode of the first transistor T1 (coupled to the first clock signal terminal CLK1 through the fifth transistor T5) and the second electrode of the first electrode transistor (the second node N2) is blocked, so that the path between the first clock signal terminal CLK1 and the second node N2 is blocked to maintain the potential of the second node N2.

As shown in FIG. 13, in some examples, the functional circuit 150 includes a first transistor T1, and the first transistor T1 includes an oxide transistor. The functional circuit 150 is coupled in series between the first clock signal terminal CLK1 and the first control circuit 160.

A control electrode of the first transistor T1 is coupled to the third clock signal terminal CLK3, a first electrode of the first transistor T1 is coupled to the first clock signal terminal CLK1, and a second electrode of the first transistor T1 is coupled to the first electrode of the fifth transistor T5. The second electrode of the fifth transistor T5 is coupled to the second node N2, and the control electrode of the fifth transistor T5 is coupled to the first node N1.

In some examples, the first transistor T1 is an N-type transistor. In a case where the third clock signal provided by the third clock signal terminal CLK3 is a high potential signal, the path between the first electrode of the first transistor T1 (the first clock signal terminal CLK1) and the second electrode of the first transistor T1 (coupled to the second node N2 through the fifth transistor T5) is formed to transmit the first clock signal provided by the first clock signal terminal CLK1 to the second node N2. In a case where the third clock signal provided by the third clock signal terminal CLK3 is a low potential signal, the path between the first electrode of the first transistor T1 (the first clock signal terminal CLK1) and the second electrode of the first electrode transistor (coupled to the second node N2 through the fifth transistor T5) is blocked, so that the path between the first clock signal terminal CLK1 and the second node N2 is blocked to maintain the potential of the second node N2.

Figure 14:
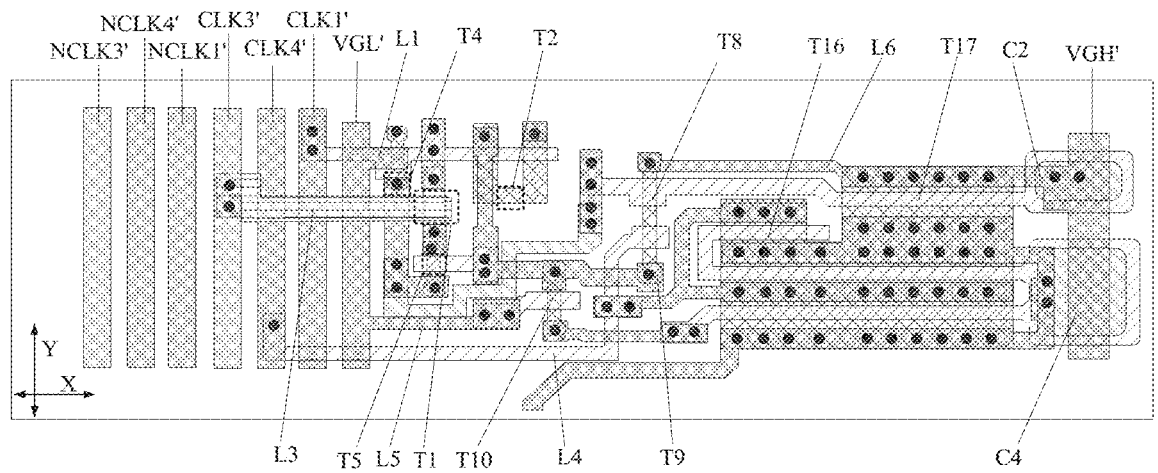
FIG. 14 is a top view of a shift register in a display substrate, in accordance with some embodiments.

In some embodiments, as shown in FIG. 13, the shift register includes the first transistor T1 of the functional circuit 150 and the fourth transistor T4 of the second input circuit 130. As shown in FIG. 14, the fourth transistor T4 is configured to be coupled to a first voltage signal line VGL'.

As shown in FIG. 14, in a plane where the shift register is located, the first transistor T1 is located on a side of the fourth transistor T4 away from the first voltage signal line VGL'.

In some other embodiments, as shown in FIG. 13, the shift register includes the fifth transistor T5 of the first control circuit 160, the first transistor T1 of the functional circuit 150, the second transistor T2 of the first input circuit 110, and the fourth transistor T4 of the second input circuit 130.

As shown in FIG. 14, in the plane where the shift register is located, the first transistor T1 is located in a region enclosed by the second transistor T2, the fourth transistor T4 and the fifth transistor T5. For example, the first transistor T1 is located at a central position of the region enclosed by the second transistor T2, the fourth transistor T4 and the fifth transistor T5.

As shown in FIG. 14, the first clock signal terminal CLK1 is coupled to a first clock signal line CLK1' through a first wire L1, the third clock signal terminal CLK3 is coupled to a third clock signal line CLK3' through a third wire L3, the fourth clock signal terminal CLK4 is coupled to a fourth clock signal line CLK4' through a fourth wire L4, the first voltage signal terminal VGL is coupled to the first voltage signal line VGL' through a fifth wire L5, and the second voltage signal terminal VGH is coupled to a second voltage signal line VGH' through a sixth wire L6.

The first voltage signal line VGL', the first clock signal line CLK1', the third clock signal line CLK3', and the fourth clock signal line CLK4' extend in a second direction Y and are arranged at intervals in a first direction X. The first voltage signal line VGL', the first clock signal line CLK1', the third clock signal line CLK3', and the fourth clock signal line CLK4' may be located on a same side of the shift register in the first direction X, and are sequentially arranged in a direction away from the shift register.

The second voltage signal line VGH' may be located on the other side of the shift register in the first direction X and extend in the second direction Y.

In some embodiments, a structure of the first transistor T1 is the same as the structure of the oxide transistor as shown in FIG. 4B, and details are not described here.

The first gate pattern 310 and the second gate pattern 330 of the first transistor T1 are located on a side of the third clock signal terminal CLK3 proximate to the substrate 300. The first gate pattern 310 and the second gate pattern 330 of the first transistor T1 are coupled to the third clock signal terminal CLK3. For example, the source-drain metal pattern 360 is connected to the first gate pattern 310, the second gate pattern 330 and the third clock signal terminal CLK3, so that the first gate pattern 310 and the second gate pattern 330 of the first transistor T1 are coupled to the third clock signal terminal CLK3. The first gate pattern 310 and the second gate pattern 330 of the first transistor T1 may be in direct contact with the third clock signal terminal CLK3, so as to be coupled to the third clock signal terminal CLK3. The first gate pattern 310 and the second gate pattern 330 of the first transistor T1 may also be coupled to the third clock signal terminal CLK3 through via hole(s).

In some examples, as shown in FIG. 4B, the source-drain metal pattern 360 is located on a side of the first gate pattern 310 and the second gate pattern 330 away from the substrate 300, and the source-drain metal pattern 360 is coupled to the first gate pattern 310 through a third via hole H3, and is coupled to the second gate pattern 342 through s fourth via hole H4. The third clock signal terminal CLK3 is coupled to the source-drain metal pattern through the third wire L3, thereby achieving coupling of the third clock signal terminal CLK3 to the first gate pattern and the second gate pattern.

Figure 15:
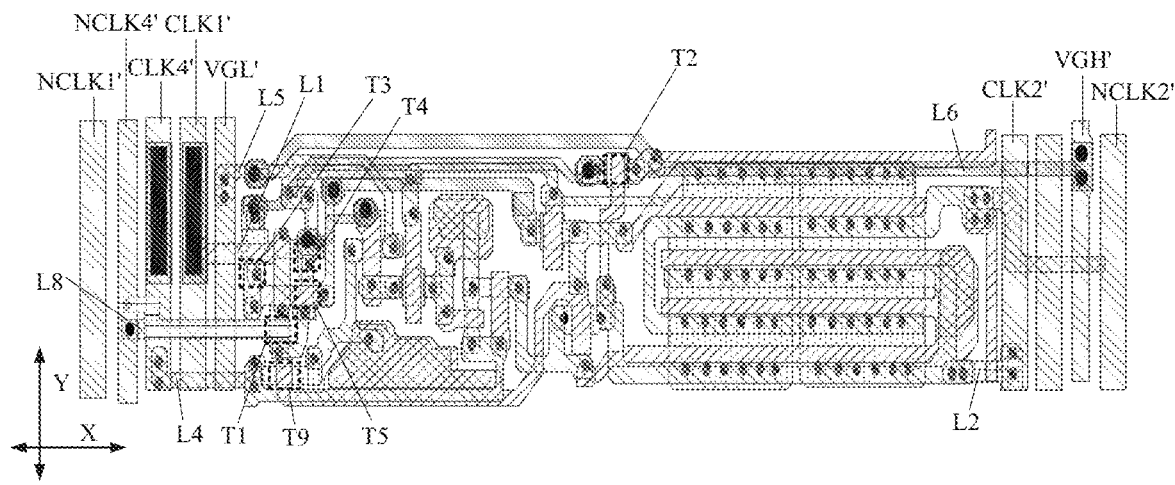
FIG. 15 is a top view of a shift register in a display substrate, in accordance with some embodiments.

In some embodiments, as shown in FIGS. 7 to 10, the shift register includes the second transistor T2 and the third transistor T3 of the first input circuit 110. As shown in FIG. 15, the third transistor T3 is configured to be coupled to a first clock signal line CLK1'. The first transistor T1 is located on a side of the third transistor T3 away from the first clock signal line CLK1'.

In some other embodiments, as shown in FIGS. 7 to 10, the shift register includes the third transistor T3 of the first input circuit 110, the fifth transistor T5 of the first control circuit 160, and a ninth transistor T9 of a second control circuit 210.

As shown in FIG. 15, the first transistor T1 is located in a region enclosed by the third transistor T3, the fifth transistor T5 and the ninth transistor T9. For example, the first transistor T1 is located at a central position of the region enclosed by the third transistor T3, the fifth transistor T5 and the ninth transistor T9.

As shown in FIG. 15, the first clock signal terminal CLK1 is coupled to the first clock signal line CLK1' through a first wire L1, the fourth clock signal terminal CLK4 is coupled to a fourth clock signal line CLK4' through a fourth wire L4, a fourth auxiliary clock signal terminal is coupled to a fourth auxiliary clock signal line NCLK4' through an eighth wire L8, the first voltage signal terminal VGL is coupled to a first voltage signal line VGL' through a fifth wire L5, the second clock signal terminal CLK2 is coupled to a second clock signal line CLK 2' through a second wire L2, and the second voltage signal terminal VGH is coupled to a second voltage signal line VGH' through a sixth wire L6.

The first clock signal line CLK1', the fourth clock signal line CLK4', the fourth auxiliary clock signal line NCLK4', and the first voltage signal line VGL' extend in the second direction Y and are arranged at intervals in the first direction X. The first voltage signal line VGL', the first clock signal line CLK1', the fourth clock signal line CLK4', and the fourth auxiliary clock signal line NCLK4' may be located on a same side of the shift register in the first direction X, and are sequentially arranged in a direction away from the shift register.

The second clock signal line CLK2' and the second voltage signal line VGH' extend in the second direction Y and are arranged at intervals in the first direction X. The second clock signal line CLK2' and the second voltage signal line VGH' may be located on the other side of the shift register in the first direction X, and are sequentially arranged in a direction away from the shift register.

Figure 16:
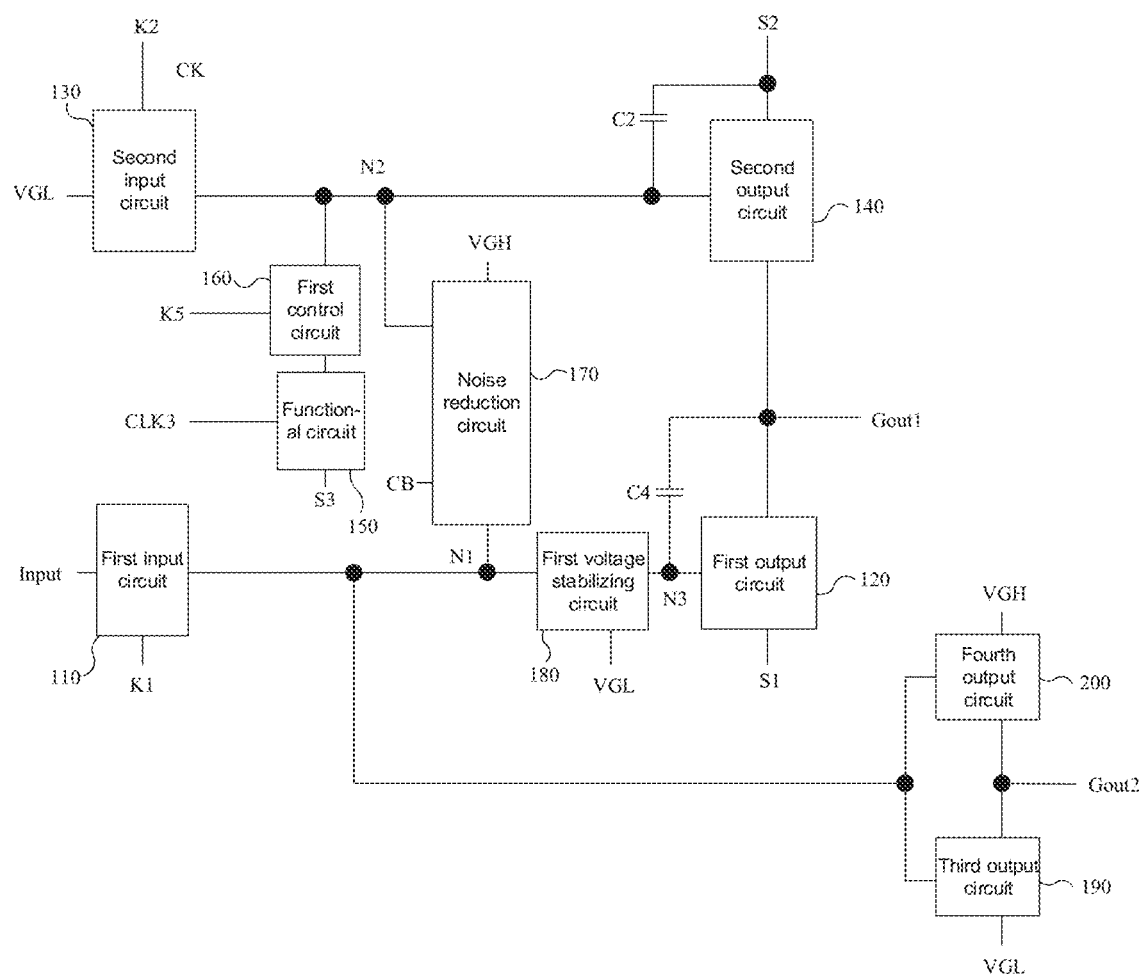
FIG. 16 is a structural diagram of a shift register, in accordance with some embodiments.

As shown in FIG. 16, in some embodiments, the shift register further includes a third output circuit 190 and a fourth output circuit 200.

The third output circuit 190 is coupled to the first voltage signal terminal VGL, the first node N1 and a second scan signal terminal. The third output circuit 190 is configured to transmit the first voltage signal provided by the first voltage signal terminal VGL to the second scan signal terminal under the control of the potential of the first node N1.

The fourth output circuit 200 is coupled to the second voltage signal terminal VGH, the first node N1 and the second scan signal terminal. The fourth output circuit 200 is configured to transmit the second voltage signal provided by the second voltage signal terminal VGH to the second scan signal terminal under the control of the potential of the first node N1.

In the embodiments, the shift register is a dual-output shift register. That is, the shift register not only provides the first gate signal for the N-type transistor in the sub-pixel, but also provides the second gate signal for the P-type transistor in the sub-pixel. For example, the first scan signal terminal provides the first gate signal for the N-type transistor in the sub-pixel, and the second scan signal terminal provides the second gate signal for the P-type transistor in the sub-pixel.

In some examples, in a case where the potential of the first node N1 is a low potential, the third output circuit 190 transmits the first voltage signal provided by the first voltage signal terminal VGL to the second scan signal terminal; and in a case where the potential of the first node N1 is a high potential, the fourth output circuit 200 transmits the second voltage signal provided by the second voltage signal terminal VGH to the second scan signal terminal.

Figure 17:
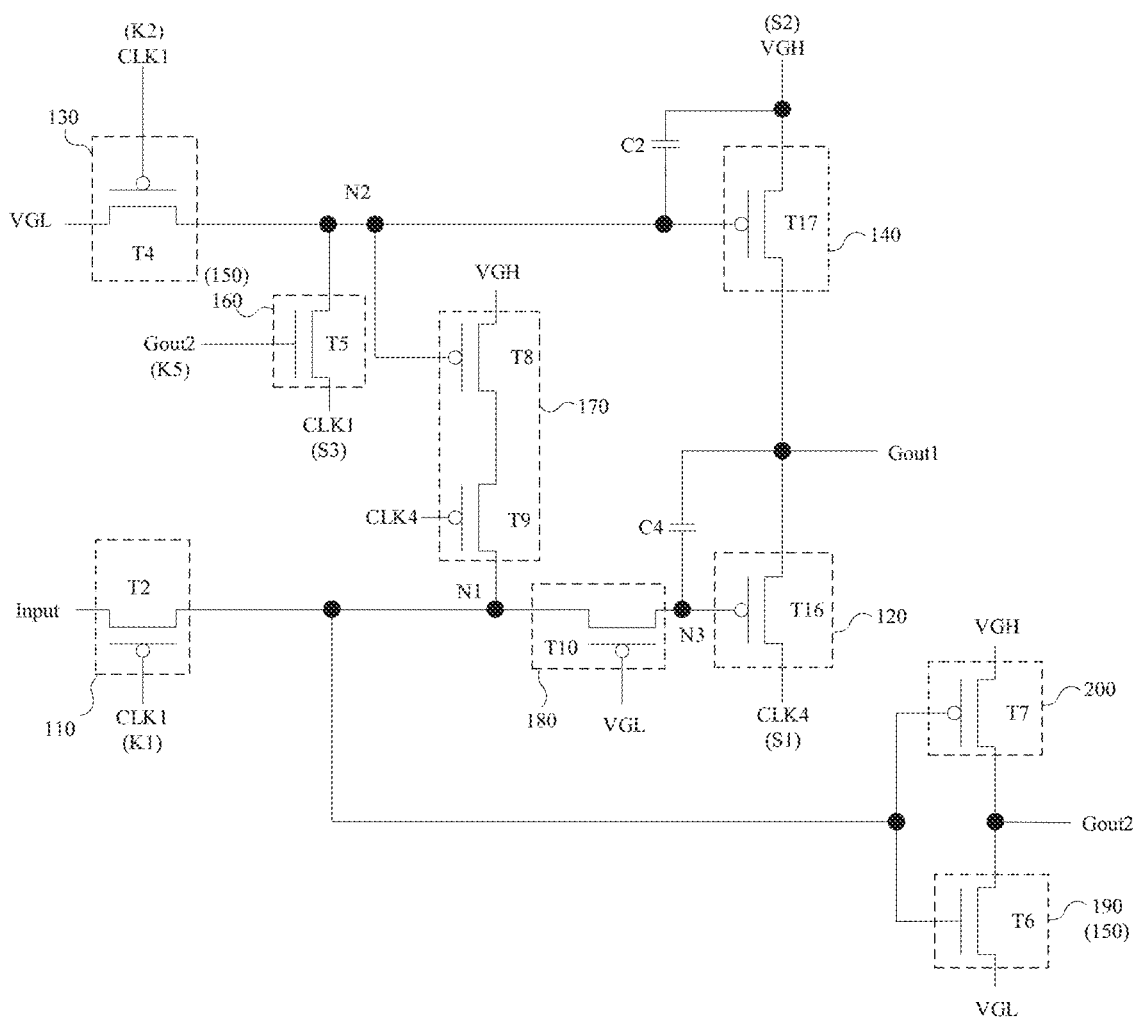
FIG. 17 is a structural diagram of a shift register, in accordance with some embodiments.

In the embodiments, as shown in FIG. 17, the first output signal terminal S1 coupled to the first output circuit 120 may be the fourth clock signal terminal CLK4. That is, under the control of the potential of the first node N1, the first output circuit 120 transmits the fourth clock signal provided by the fourth clock signal terminal CLK4 to the first scan signal terminal.

As shown in FIG. 17, in some embodiments, the third output circuit 190 includes a functional circuit 150. The first node N1 serves as a functional control terminal. The third output circuit 190 is further configured to block a path between the first voltage signal terminal VGL and the second scan signal terminal under the control of the potential of the first node N1, so as to maintain the potential of the second scan signal terminal.

That is, the functional control terminal includes the first node N1, the functional input terminal includes the first voltage signal terminal, and the functional output terminal includes the second scan signal terminal. The circuit nodes include the first node N1, the second node N2, and the second scan signal terminal.

In some examples, the third output circuit 190 is configured to control the formation of the path between the first voltage signal terminal VGL and the second scan signal terminal in a case where the potential of the first node N1 is a valid potential (e.g., a high potential), so as to transmit the first voltage signal provided by the first voltage signal terminal VGL to the second scan signal terminal. The third output circuit 190 is further configured to block the path between the first voltage signal terminal VGL and the second scan signal terminal in a case where the potential of the first node N1 is an invalid potential (e.g., a low potential), so as to maintain the potential of the second scan signal terminal.

As shown in FIG. 17, in some examples, the third output circuit 190 includes a sixth transistor T6, and the sixth transistor T6 includes an oxide transistor. The fourth output circuit 200 includes a seventh transistor T7.

A control electrode of the sixth transistor T6 is coupled to the first node N1, a first electrode of the sixth transistor T6 is coupled to the first voltage signal terminal VGL, and a second electrode of the sixth transistor T6 is coupled to the second scan signal terminal.

A control electrode of the seventh transistor T7 is coupled to the first node N1, a first electrode of the seventh transistor T7 is coupled to the second voltage signal terminal VGH, and a second electrode of the seventh transistor T7 is coupled to the second scan signal terminal.

In some examples, the sixth transistor T6 is an N-type transistor, and the seventh transistor T7 is a P-type transistor. In a case where the potential of the first node N1 is a low potential, a path between the first electrode of the seventh transistor T7 (the second voltage signal terminal VGH) and the second electrode of the seventh transistor T7 (the second scan signal terminal) is formed, and the path between the first electrode of the sixth transistor T6 (the first voltage signal terminal VGL) and the second electrode of the sixth transistor T6 (the second scan signal terminal) is blocked; and thus the second voltage signal provided by the second voltage signal terminal VGH is transmitted to the second scan signal terminal, and the first voltage signal provided by the first voltage signal terminal VGL is prevented from affecting the potential of the second scan signal terminal. In a case where the potential of the first node N1 is a high potential, the path between the first electrode of the sixth transistor T6 (the first voltage signal terminal VGL) and the second electrode of the sixth transistor T6 (the second scan signal terminal) is formed to transmit the first voltage signal provided by the first voltage signal terminal VGL to the second scan signal terminal.

As shown in FIG. 17, in some embodiments, the shift register includes the first control circuit 160, the third output circuit 190, and the fourth output circuit 200. The third output signal terminal S3 includes the first clock signal terminal CLK1, the fifth control signal terminal K5 includes the second scan signal terminal, and the first control circuit 160 is further used as a functional circuit 150.

That is, a functional control terminal includes the second scan signal terminal, a functional input terminal includes the first clock signal terminal CLK1, and a functional output terminal includes the second node N2.

The first control circuit 160 is configured to control the formation of the path between the first clock signal terminal CLK1 and the second node N2 in a case where the potential of the second scan signal provided by the second scan signal terminal is a valid potential, so as to transmit the first clock signal provided by the first clock signal terminal CLK1 to the second node N2. The first control circuit 160 is further configured to block the path between the first clock signal terminal CLK1 and the second node N2 in a case where the potential of the second scan signal provided by the second scan signal terminal is an invalid potential, so as to maintain the potential of the second node N2.

As shown in FIG. 17, in some embodiments, the fifth transistor T5 in the first control circuit 160 includes an oxide transistor.

A control electrode of the fifth transistor T5 is coupled to the second scan signal terminal, a first electrode of the fifth transistor T5 is coupled to the first clock signal terminal CLK1, and a second electrode of the fifth transistor T5 is coupled to the second node N2.

In some examples, the fifth transistor T5 is an N-type transistor. In a case where the second scan signal provided by the second scan signal terminal is at a high potential, the path between the first electrode of the fifth transistor T5 (the first clock signal terminal CLK1) and the second electrode of the fifth transistor T5 (the second node N2) is formed to transmit the first clock signal provided by the first clock signal terminal CLK1 to the second node N2. In a case where the second scan signal provided by the second scan signal terminal is at a low potential, the path between the first electrode of the fifth transistor T5 (the first clock signal terminal CLK1) and the second electrode of the fifth transistor T5 (the second node N2) is blocked, thereby maintaining the potential of the second node N2.

The shift register may further include a noise reduction circuit 170. There are various arrangements of the noise reduction circuit 170, which are described in detail below through various embodiments.

As shown in FIG. 3, in some embodiments, the noise reduction circuit 170 is coupled to the second voltage signal terminal VGH, a sixth control signal terminal K6, the second node N2, and the first node N1. The noise reduction circuit 170 is configured to form a path between the second voltage signal terminal VGH and the first node N1 under control of the potential of the second node N2 and a sixth control signal provided by the sixth control signal terminal K6.

The sixth control signal terminal K6 may be one of the plurality of clock signal terminals, e.g., the fourth clock signal terminal CLK4. The sixth control signal terminal K6 may also be one of the plurality of auxiliary clock signal terminals, e.g., the fourth auxiliary clock signal terminal NCLK4. The sixth control signal terminal K6 may also be one of the plurality of circuit nodes, e.g., the first node N1, which is not limited here.

Figure 18:
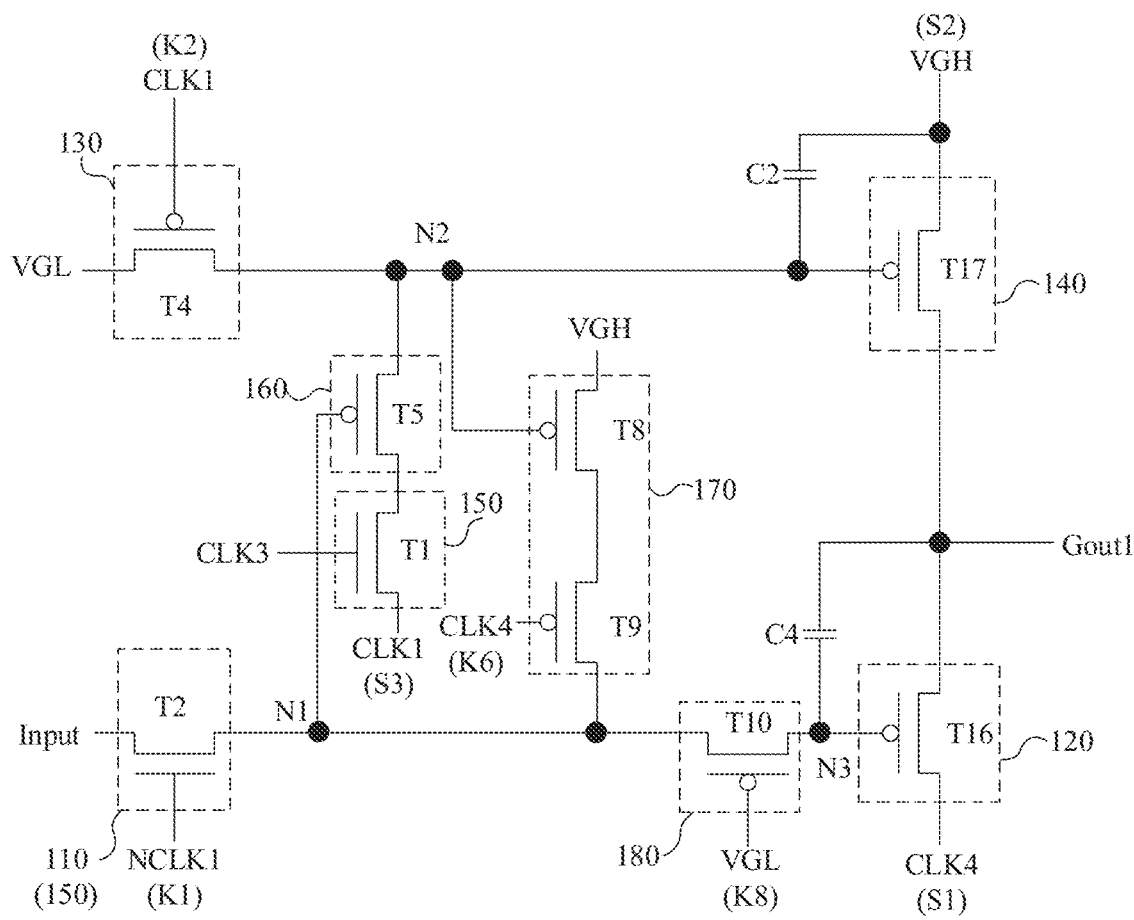
FIG. 18 is a structural diagram of a shift register, in accordance with some embodiments.

As shown in FIG. 18, in some examples, the sixth control signal terminal K6 includes the fourth clock signal terminal CLK4. The noise reduction circuit 170 is configured to, under the control of the potential of the second node N2 and the fourth clock signal provided by the fourth clock signal terminal CLK4, control the formation of path between the second voltage signal terminal VGH and the first node N1, so as to transmit the second voltage signal provided by the second voltage signal terminal VGH to the first node N1.

As shown in FIG. 18, in some embodiments, the noise reduction circuit 170 includes an eighth transistor T8 and a ninth transistor T9. A control electrode of the eighth transistor T8 is coupled to the second node N2, a first electrode of the eighth transistor T8 is coupled to the second voltage signal terminal VGH, and a second electrode of the eighth transistor T8 is coupled to a first electrode of the ninth transistor T9; a control electrode of the ninth transistor T9 is coupled to the sixth control signal terminal K6, and a second electrode of the ninth transistor T9 is coupled to the first node N1.

In some examples, the sixth control signal terminal K6 includes the fourth clock signal terminal CLK4. As shown in FIG. 18, the control electrode of the eighth transistor T8 is coupled to the second node N2, the first electrode of the eighth transistor T8 is coupled to the second voltage signal terminal VGH, and the second electrode of the eighth transistor T8 is coupled to the first electrode of the ninth transistor T9; the control electrode of the ninth transistor T9 is coupled to the fourth clock signal terminal CLK4, and the second electrode of the ninth transistor T9 is coupled to the first node N1.

In an example where the eighth transistor T8 and the ninth transistor T9 are P-type transistors, in a case where the second node N2 is at a low potential and the fourth clock signal provided by the fourth clock signal terminal CLK4 is at a low potential, a path is formed between the first electrode of the eighth transistor T8 (the second voltage signal terminal VGH) and the second electrode of the eighth transistor T8, and a path is formed between the first electrode of the ninth transistor T9 and the second electrode of the ninth transistor T9 (the first node N1). That is, the path between the second voltage signal terminal VGH and the first node N1 is formed to transmit the second voltage signal provided by the second voltage signal terminal VGH to the first node N1.

Figure 19:
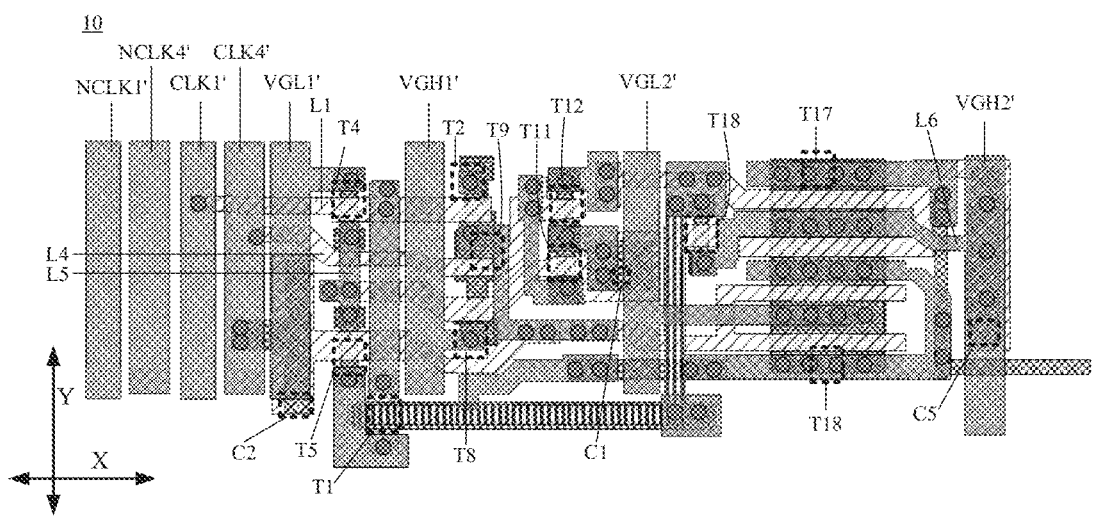
FIG. 19 is a top view of a shift register in a display substrate, in accordance with some embodiments.

In some embodiments, as shown in FIG. 18, the shift register includes the eighth transistor T8 of the noise reduction circuit 170 and the first transistor T1 of the functional circuit 150. As shown in FIG. 19, the eighth transistor T8 is configured to be coupled to the second voltage signal line VGH'.

As shown in FIG. 19, in the plane where the shift register is located, the first transistor T1 is located on a side of the second voltage signal line VGH' away from the eighth transistor T8.

In some other embodiments, as shown in FIG. 18, the shift register includes the eighth transistor T8 of the noise reduction circuit 170, the second transistor T2 of the first input circuit 110, the fourth transistor T4 of the second input circuit 130, the first transistor T1 of the functional circuit 150, and the fifth transistor T5 of the first control circuit 160.

As shown in FIG. 19, in the plane where the shift register is located, the first transistor T1 is located on a side of the fourth transistor T4 and the fifth transistor T5 away from the first voltage signal line VGL'. In addition, the first transistor T1 is located on a side of the second transistor T2 and the eighth transistor T8 proximate to the first voltage signal line VGL'.

As shown in FIG. 19, the first clock signal terminal CLK1 is coupled to the first clock signal line CLK1' through the first wire L1, the fourth clock signal terminal CLK4 is coupled to the fourth clock signal line CLK4' through the fourth wire L4, the first voltage signal terminal VGL is coupled to the first voltage signal line VGL' through the fifth wire L5, and the second voltage signal terminal VGH is coupled to the second voltage signal line VGH' through the sixth wire L6.

The first voltage signal line VGL', the fourth clock signal line CLK4', and the first clock signal line CLK1' extend in the second direction Y and are arranged at intervals in the first direction X. The first voltage signal line VGL', the fourth clock signal line CLK4', and the first clock signal line CLK1' may be located on a same side of the shift register in the first direction X, and are sequentially arranged in a direction away from the shift register.

The second voltage signal line VGH' extends in the second direction Y, and the second voltage signal line VGH' may be located on a side of the shift register away from the substrate. That is, an orthographic projection of the second voltage signal line VGH' on the substrate overlaps with an orthographic projection of the shift register on the substrate.

In some embodiments, in the plane where the shift register is located, the first transistor T1 is located between the first voltage signal terminal VGL and the second voltage signal terminal VGH. For example, in the first direction X, the first transistor T1 is located between a connection position of the first voltage signal line VGL' and the fourth transistor T4, and a connection position of the second voltage signal line VGH' and the fifth transistor T5. For another example, an orthographic projection of the first transistor T1 on the substrate is located between an orthographic projection of the connection position of the first voltage signal line VGL' and the fourth transistor T4 on the substrate, and an orthographic projection of the connection position of the second voltage signal line VGH' and the fifth transistor T5 on the substrate.

In some examples, in the first direction X, the first transistor T1 is located between the first voltage signal line VGL' and the second voltage signal line VGH'.

In some embodiments, as shown in FIG. 19, the number of the first voltage signal lines VGL' may be multiple; and similarly, the number of the second voltage signal lines VGH' may also be multiple. Some of the first voltage signal lines VGL' may also be located on the side of the shift register away from the substrate; and some of the second voltage signal lines VGH' may also be located on the side of the shift register away from the substrate.

In some embodiments, a structure of the first transistor T1 in FIG. 19 may be the same as the structure of the oxide transistor shown in FIG. 4B, and details are not described here.

Figure 20:
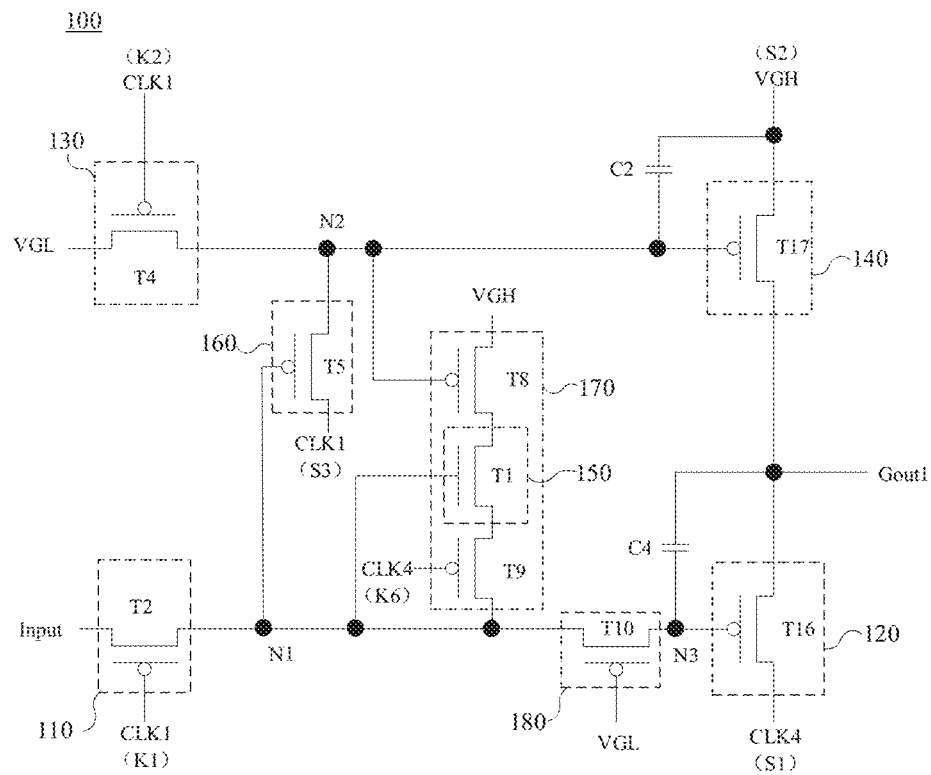
FIG. 20 is a structural diagram of a shift register, in accordance with some embodiments.

As shown in FIG. 20, in some other embodiments, the sixth control signal terminal K6 includes the fourth clock signal terminal CLK4. A functional circuit 150 is coupled in series between the second voltage signal terminal VGH and the first node N1. A functional control terminal includes the first node N1, a functional input terminal includes the second voltage signal terminal VGH, and a functional output terminal includes the first node N1.

The functional circuit 150 is configured to form the path between the second voltage signal terminal VGH and the first node N1 in a case where the potential of the first node N1 is a valid potential, so as to transmit the second voltage signal provided by the second voltage signal terminal VGH to the first node N1.

The functional circuit 150 is further configured to block the path between the second voltage signal terminal VGH and the first node N1 in a case where the potential of the first node N1 is an invalid potential, so as to maintain the potential of the first node N1.

The functional circuit 150 may be coupled in series between the eighth transistor T8 and the second voltage signal terminal VGH, or may be coupled in series between the eighth transistor T8 and the ninth transistor T9, or may be coupled in series between the ninth transistor T9 and the first node N1. The functional circuit 150 is located at the above three positions, all of which may block the path between the second voltage signal terminal VGH and the first node N1 in a case of blocking the functional input terminal and the functional output terminal, so that the potential of the first node N1 is maintained.

In some embodiments, the functional circuit 150 is coupled in series between the eighth transistor T8 and the second voltage signal terminal VGH. The functional circuit 150 includes a first transistor T1, and the first transistor T1 includes an oxide transistor.

A control electrode of the first transistor T1 is coupled to the first node N1, a first electrode of the first transistor T1 is coupled to the second voltage signal terminal VGH, and a second electrode of the first transistor T1 is coupled to the first electrode of the eighth transistor T8.

In some examples, the first transistor T1 is an N-type transistor, the eighth transistor T8 and the ninth transistor T9 are P-type transistors. In a case where the first node N1 is at a high potential, the second node N2 is at a low potential, and the fourth clock signal provided by the fourth clock signal terminal CLK4 is at a low potential, the first electrode of the first transistor T1 (the second voltage signal terminal VGH) sequentially forms a path with the second electrode of the first transistor T1, the first electrode of the eighth transistor T8, the second electrode of the eighth transistor T8, the first electrode of the ninth transistor T9, and the second electrode of the ninth transistor T9 (the first node N1), so that the second voltage signal provided by the second voltage signal terminal VGH is transmitted to the first node N1.

In a case where the potential of the first node N1 is a low potential, the path between the first electrode of the first transistor T1 and the second electrode of the first transistor T1 is blocked, so that the path between the second voltage signal terminal and the first node N1 is blocked to maintain the potential of the first node N1.

As shown in FIG. 20, in some embodiments, the functional circuit 150 is coupled in series between the eighth transistor T8 and the ninth transistor T9. The functional circuit 150 includes a first transistor T1, and the first transistor T1 includes an oxide transistor.

A control electrode of the first transistor T1 is coupled to the first node N1, a first electrode of the first transistor T1 is coupled to the second electrode of the eighth transistor T8, and a second electrode of the first transistor T1 is coupled to the first electrode of the ninth transistor T9.

In some examples, the first transistor T1 is an N-type transistor, the eighth transistor T8 and the ninth transistor T9 are P-type transistors. In a case where the first node N1 is at a high potential, the second node N2 is at a low potential, and the fourth clock signal provided by the fourth clock signal terminal CLK4 is at a low potential, the first electrode of the eighth transistor T8 (the second voltage signal terminal VGH) sequentially forms a path with the second electrode of the eighth transistor T8, the first electrode of the first transistor T1, the second electrode of the first transistor T1, the first electrode of the ninth transistor T9, and the second electrode of the ninth transistor T9 (the first node N1), so that the second voltage signal provided by the second voltage signal terminal VGH is transmitted to the first node N1.

In a case where the potential of the first node N1 is a low potential, the path between the first electrode of the first transistor T1 and the second electrode of the first transistor T1 is blocked, so that the path between the second voltage signal terminal and the first node N1 is blocked to maintain the potential of the first node N1.

In some embodiments, the functional circuit 150 is coupled in series between the ninth transistor T9 and the first node N1. The functional circuit 150 includes a first transistor T1, and the first transistor T1 includes an oxide transistor.

A control electrode of the first transistor T1 is coupled to the first node N1, a first electrode of the first transistor T1 is coupled to the second electrode of the ninth transistor T9, and a second electrode of the first transistor T1 is coupled to the first node N1.

In some examples, the first transistor T1 is an N-type transistor, the eighth transistor T8 and the ninth transistor T9 are P-type transistors. In a case where the first node N1 is at a high potential, the second node N2 is at a low potential, and the fourth clock signal provided by the fourth clock signal terminal CLK4 is at a low potential, the first electrode of the eighth transistor T8 (the second voltage signal terminal VGH) sequentially forms a path with the second electrode of the eighth transistor T8, the first electrode of the ninth transistor T9, the second electrode of the ninth transistor T9, the first electrode of the first transistor T1, and the second electrode of the first transistor T1 (the first node N1), so that the second voltage signal provided by the second voltage signal terminal VGH is transmitted to the first node N1.

In a case where the potential of the first node N1 is a low potential, the path between the first electrode of the first transistor T1 and the second electrode of the first transistor T1 is blocked, so that the path between the second voltage signal terminal and the first node N1 is blocked to maintain the potential of the first node N1.

Figure 21:
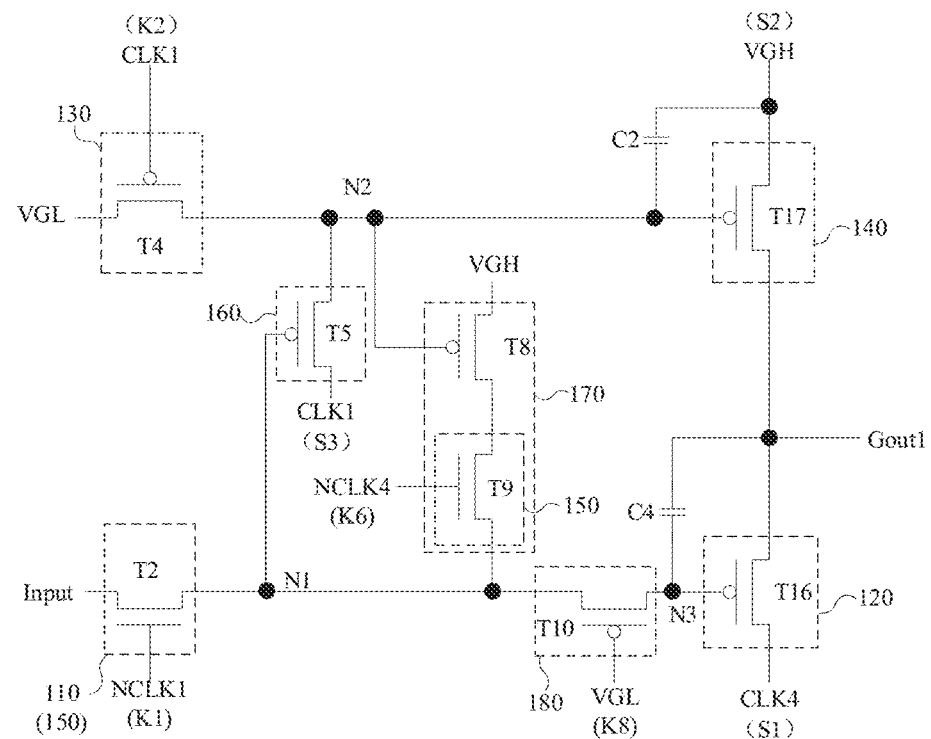
FIG. 21 is a structural diagram of a shift register, in accordance with some embodiments.

As shown in FIG. 21, in still other embodiments, the sixth control signal terminal K6 includes the fourth auxiliary clock signal terminal NCLK4.

The noise reduction circuit 170 includes a functional circuit 150. The functional circuit 150 is coupled in series between the second voltage signal terminal VGH and the first node N1. The functional control terminal includes the fourth auxiliary clock signal terminal NCLK4, the functional input terminal of the functional circuit 150 includes the second voltage signal terminal VGH, and the functional output terminal of the functional circuit 150 includes the first node N1.

The functional circuit 150 is configured to block the path between the first node N1 and the second voltage signal terminal VGH under control of the fourth auxiliary clock signal provided by the fourth auxiliary clock signal terminal NCLK4, so as to maintain the potential of the first node N1.

As shown in FIG. 21, in some embodiments, the functional circuit 150 includes the ninth transistor T9. The ninth transistor T9 includes the oxide transistor. The control electrode of the ninth transistor T9 is coupled to the fourth auxiliary clock signal terminal NCLK4.

In some examples, the eighth transistor T8 is a P-type transistor, and the ninth transistor T9 is an N-type transistor. In a case where the fourth auxiliary clock signal provided by the fourth auxiliary clock signal terminal NCLK4 is at a high potential and the second node N2 is at a low potential, the path between the second voltage signal terminal VGH and the first node N1 is formed, so that the second voltage signal provided by the second voltage signal terminal VGH is transmitted to the first node N1 through the first electrode of the eighth transistor T8 (the second voltage signal terminal VGH), the second electrode of the eighth transistor T8, the first electrode of the ninth transistor T9, and the second electrode of the ninth transistor T9 (the first node N1) in sequence.

In a case where the fourth auxiliary clock signal provided by the fourth auxiliary clock signal terminal NCLK4 is at a low potential, the path between the first electrode of the ninth transistor T9 and the second electrode of the ninth transistor T9 is blocked, so that the path between the second voltage signal terminal VGH and the first node N1 is blocked to maintain the potential of the first node N1.

The shift register further includes a first voltage stabilizing circuit 180. There are various arrangements of the first voltage stabilizing circuit 180, which are described in detail below through various embodiments.

As shown in FIGS. 6 to 13, in some embodiments, the circuit nodes further include a third node N3. The first voltage stabilizing circuit 180 is coupled to the first node N1, the third node N3, and an eighth control signal terminal K8; and the first output circuit 120 is coupled to the third node N3, and is coupled to the first node N1 through the first voltage stabilizing circuit 180.

The eighth control signal terminal K8 may be one of the plurality of voltage signal terminals. For example, the eighth control signal terminal K8 may be the first voltage signal terminal VGL. For another example, the eighth control signal terminal K8 may be the second voltage signal terminal VGH The first voltage stabilizing circuit 180 is configured to connect the first node N1 to the third node N3 under control of a potential of the third node N3 and an eighth control signal provided by the eighth control signal terminal K8.

As shown in FIGS. 6 to 13, in some embodiments, the first voltage stabilizing circuit 180 includes a tenth transistor T10.

A control electrode of the tenth transistor T10 is coupled to the eighth control signal terminal K8, a first electrode of the tenth transistor T10 is coupled to the first node N1, and a second electrode of the tenth transistor T10 is coupled to the third node N3.

In some examples, the tenth transistor T10 is a P-type transistor, and the eighth control signal terminal K8 includes the first voltage signal terminal VGL. In a case where a potential of the eighth control signal provided by the eighth control signal terminal K8 is lower than the potential of the third node N3, a path between the first electrode of the tenth transistor T10 (the first node N1) and the second electrode of the tenth transistor T10 (the third node N3) is formed to transmit the potential of the first node N1 to the third node N3.

Figure 22:
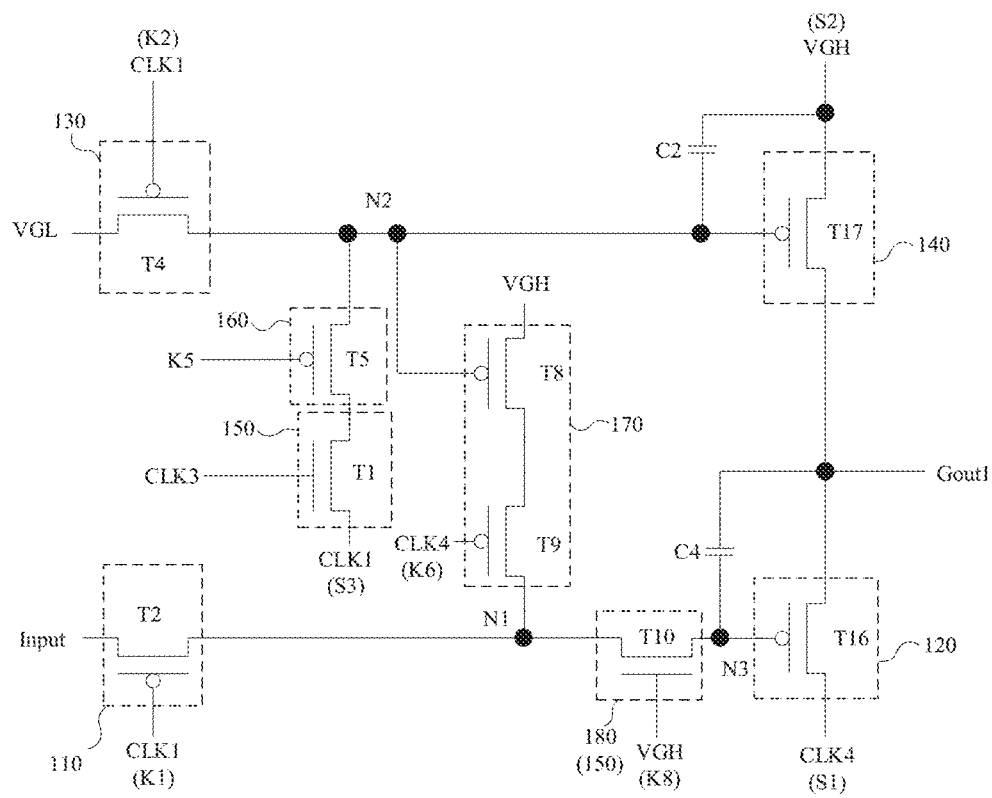
FIG. 22 is a structural diagram of a shift register, in accordance with some embodiments.

As shown in FIG. 22, in some embodiments, the eighth control signal terminal K8 includes the second voltage signal terminal VGH.

The first voltage stabilizing circuit 180 is further used as a functional circuit 150. A functional control terminal includes the second voltage signal terminal VGH, a functional input terminal includes the first node N1, and a functional output terminal includes the third node N3.

The first voltage stabilizing circuit 180 is further configured to block the path between the first node N1 and the third node N3 under control of the potential of the third node N3 and a potential of the second voltage signal provided by the second voltage signal terminal VGH, so as to maintain the potential of the third node N3.

As shown in FIG. 22, in some embodiments, the tenth transistor T10 is an oxide transistor. The control electrode of the tenth transistor T10 is coupled to the second voltage signal terminal VGH.

In some examples, the tenth transistor T10 is an N-type transistor. In a case where the potential of the second voltage signal provided by the second voltage signal terminal VGH is lower than the potential of the third node N3, the path between the first electrode of the tenth transistor T10 (the first node N1) and the second electrode of the tenth transistor T10 (the third node N3) is formed to transmit the potential of the first node N1 to the third node N3. In a case where the potential of the second voltage signal provided by the second voltage signal terminal VGH is higher than the potential of the third node N3, the path between the first electrode of the tenth transistor T10 (the first node N1) and the second electrode of the tenth transistor T10 (the third node N3) is blocked to maintain the potential of the third node N3.

The shift register further includes a second control circuit 210. There are various arrangements of the second control circuit 210, which are described in detail below through various embodiments.

Figure 23:
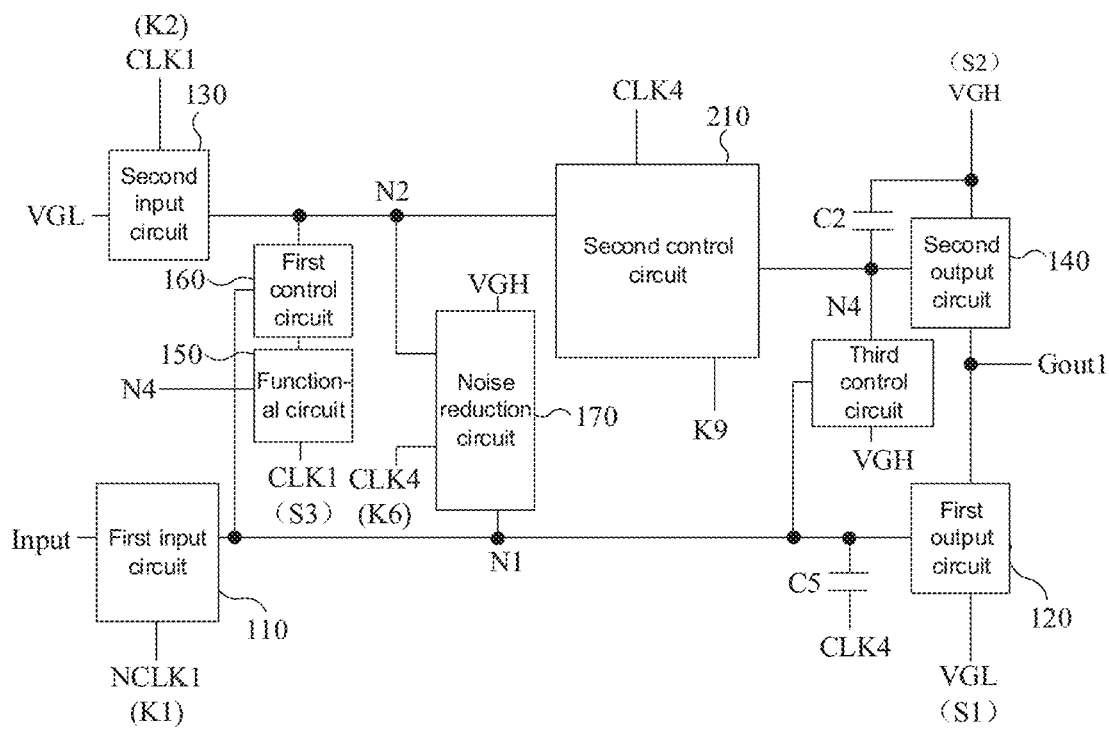
FIG. 23 is a structural diagram of a shift register, in accordance with some embodiments.

As shown in FIG. 23, in some embodiments, the circuit nodes further include a fourth node N4. The second control circuit 210 is coupled to the second node N2, the fourth node N4, the fourth clock signal terminal CLK4, and a ninth control signal terminal K9. The second output circuit 140 is coupled to the fourth node N4, and is coupled to the second node N2 through the second control circuit 210.

The ninth control signal terminal K9 may include one of the plurality of clock signal terminals. For example, the ninth control signal terminal K9 may be the first clock signal terminal CLK1. For another example, the ninth control signal terminal K9 may be the fourth clock signal terminal CLK4. The ninth control signal terminal K9 may also include one of the plurality of auxiliary clock signal terminals, e.g., the fourth auxiliary clock signal terminal NCLK4.

The second control circuit 210 is configured to transmit the fourth clock signal provided by the fourth clock signal terminal CLK4 to the fourth node N4 under control of the potential of the second node N2 and a ninth control signal provided by the ninth control signal terminal K9.

The second control circuit 210 may control an operation state of the second output circuit 140 by controlling the potential of the fourth node N4. For example, the second output circuit 140 is configured to transmit the second output signal provided by the second output signal terminal S2 to the first scan signal terminal in a case where the potential of the fourth node N4 is a valid potential.

Figure 24:
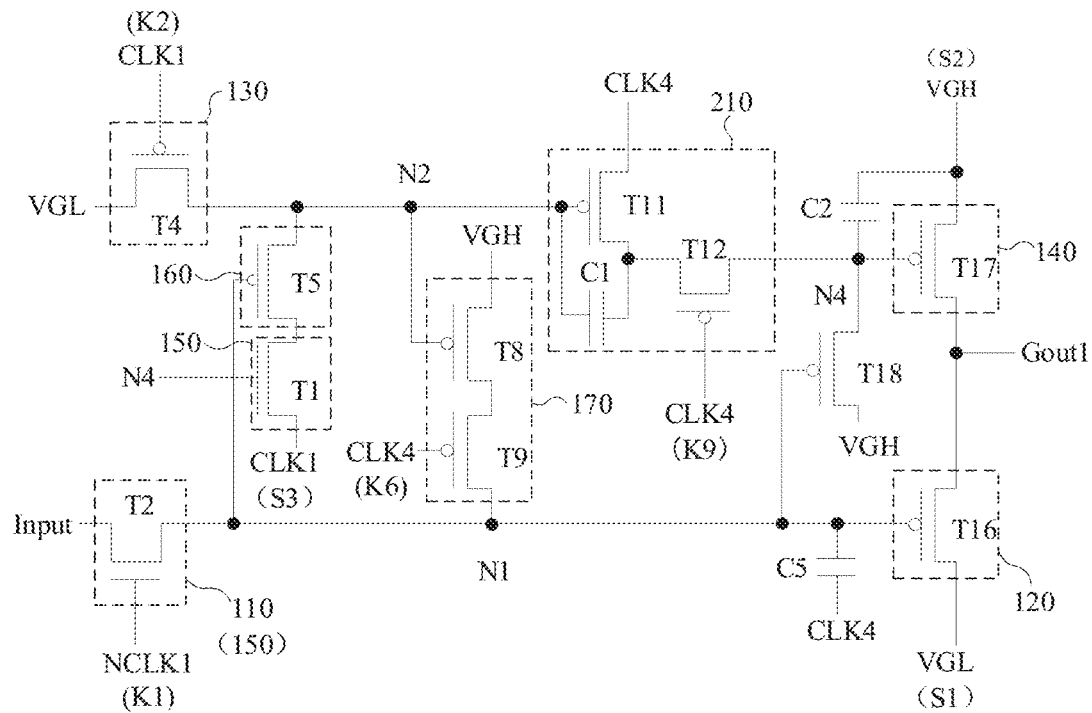
FIG. 24 is a structural diagram of a shift register, in accordance with some embodiments.

As shown in FIG. 24, in some examples, the second control circuit 210 includes an eleventh transistor T11, a twelfth transistor T12, and a first capacitor C1. A control electrode of the eleventh transistor T11 is coupled to the second node N2, a first electrode of the eleventh transistor T11 is coupled to the fourth clock signal terminal CLK4, and a second electrode of the eleventh transistor T11 is coupled to a first electrode of the twelfth transistor T12; a control electrode of the twelfth transistor T12 is coupled to the ninth control signal terminal K9, and a second electrode of the twelfth transistor T12 is coupled to the fourth node N4; a first electrode plate of the first capacitor is coupled to the second node N2, and a second electrode plate of the first capacitor is coupled to the first electrode of the twelfth transistor T12.

As shown in FIG. 24, in some examples, the ninth control signal terminal K9 includes the fourth clock signal terminal CLK4, and the eleventh transistor T11 and the twelfth transistor T12 each include a P-type transistor. In a case where the second node N2 is at a low potential and the fourth clock signal provided by the fourth clock signal terminal CLK4 is at a low potential, a path is formed through the first electrode of the eleventh transistor T11 (the fourth clock signal terminal CLK4), the second electrode of the eleventh transistor T11, the first electrode of the twelfth transistor T12, and the second electrode of the twelfth transistor T12 (the fourth node N4) in sequence, so that the fourth clock signal provided by the fourth clock signal terminal CLK4 is transmitted to the fourth node N4.

The first capacitor maintains the potential of the second node N2 stable in a case where a potential of the first electrode of the twelfth transistor T12 is stable.

Figure 25:
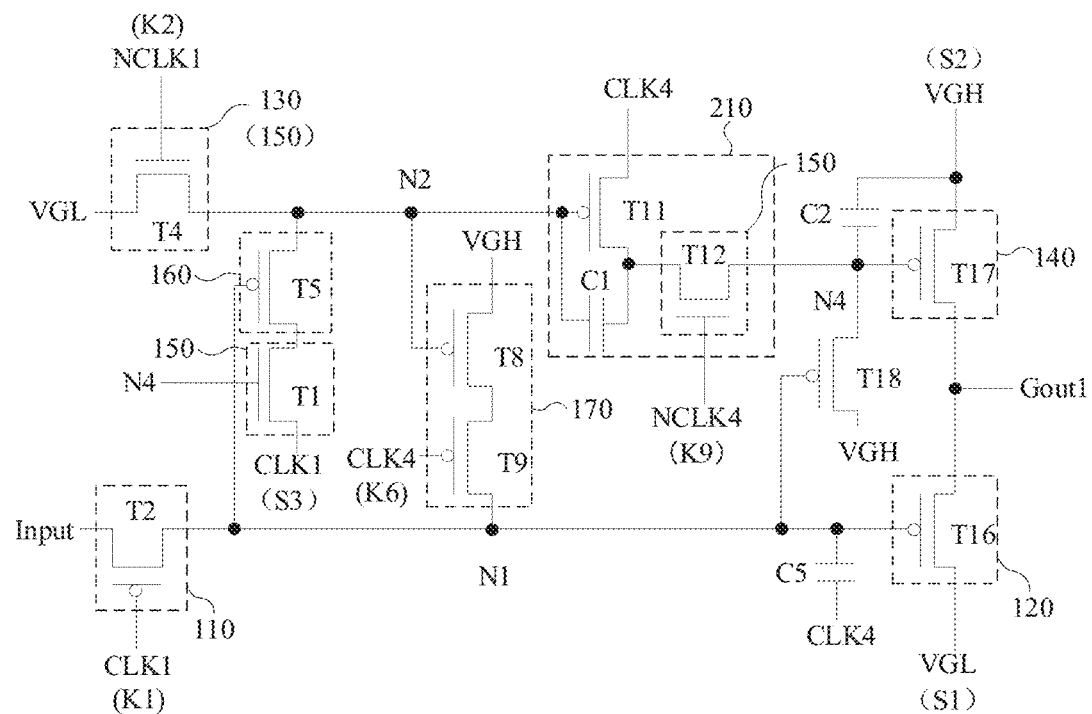
FIG. 25 is a structural diagram of a shift register, in accordance with some embodiments.

As shown in FIG. 25, in some examples, the ninth control signal terminal K9 includes the fourth auxiliary clock signal terminal NCLK4.

The second control circuit 210 includes a functional circuit 150. A functional control terminal includes the fourth auxiliary clock signal terminal NCLK4, a functional input terminal includes the fourth clock signal terminal CLK4, and a functional output terminal includes the fourth node N4.

The functional circuit 150 is configured to form the path between the fourth clock signal terminal CLK4 and the fourth node N4 in a case where the fourth auxiliary clock signal provided by the fourth auxiliary clock signal terminal NCLK4 is at a valid potential, so that the fourth clock signal provided by the fourth clock signal terminal CLK4 is transmitted to the fourth node N4.

The functional circuit 150 is further configured to block the path between the fourth clock signal terminal CLK4 and the fourth node N4 in a case where the fourth auxiliary clock signal provided by the fourth auxiliary clock signal terminal NCLK4 is at an invalid potential, so as to maintain the potential of the fourth node N4.

In some embodiments, the functional circuit 150 includes the twelfth transistor T12, and the twelfth transistor T12 includes an oxide transistor. The control electrode of the twelfth transistor T12 is coupled to the fourth auxiliary clock signal terminal NCLK4.

In some examples, the eleventh transistor T11 is a P-type transistor, and the twelfth transistor T12 is an N-type transistor. In a case where the fourth auxiliary clock signal provided by the fourth auxiliary clock signal terminal NCLK4 is at a high potential and the first node N1 is a low potential, the path is formed through the first electrode of the eleventh transistor T11 (the fourth clock signal terminal CLK4), the second electrode of the eleventh transistor T11, the first electrode of the twelfth transistor T12, and the second electrode of the twelfth transistor T12 (the fourth node N4) in sequence, so that the fourth clock signal provided by the fourth clock signal terminal CLK4 is transmitted to the fourth node N4. In a case where the fourth auxiliary clock signal provided by the fourth auxiliary clock signal terminal NCLK4 is at a low potential, the path between the first electrode of the twelfth transistor T12 and the second electrode of the twelfth transistor T12 is blocked, so that the path between the fourth clock signal terminal CLK4 and the fourth node N4 is blocked to maintain the potential of the fourth node N4.

Figure 26:
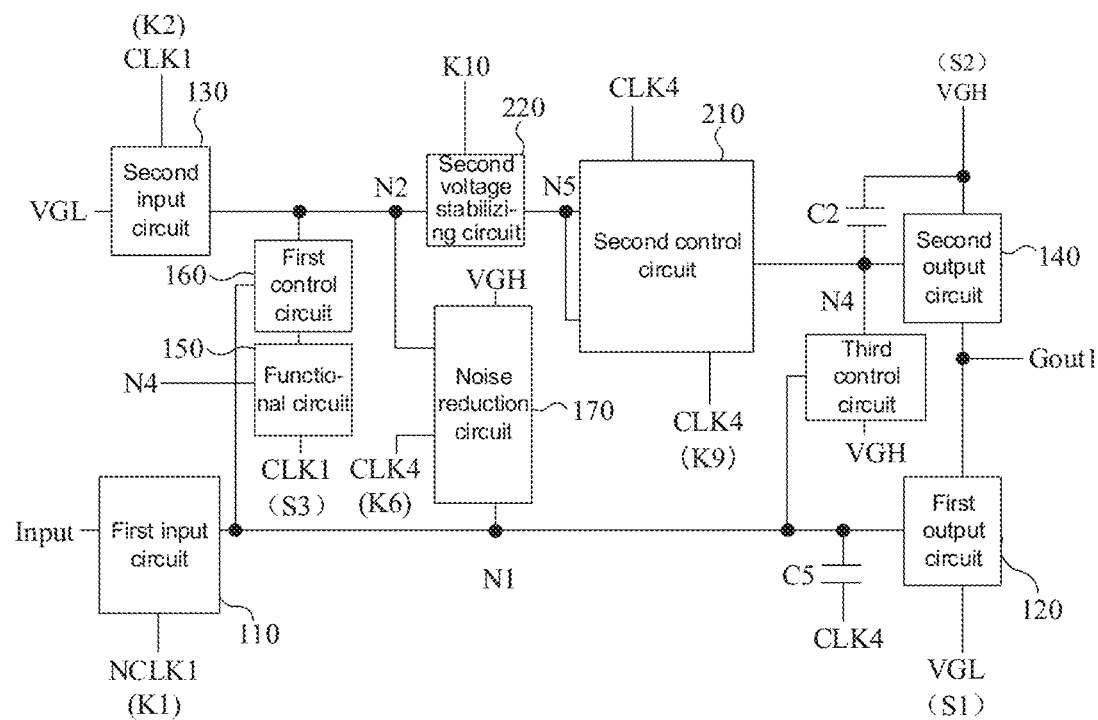
FIG. 26 is a structural diagram of a shift register, in accordance with some embodiments.

As shown in FIG. 26, in some embodiments, the shift register further includes a second voltage stabilizing circuit 220 in addition to the second control circuit 210. The circuit nodes further include a fifth node N5.

The second voltage stabilizing circuit 220 is coupled to a tenth control signal terminal K10, the second node N2 and the fifth node N5; the second control circuit 210 is coupled to the fifth node N5 and is coupled to the second node N2 through the second voltage stabilizing circuit 220. The second output circuit 140 is coupled to the second node N2 through the second control circuit 210 and the second voltage stabilizing circuit 220.

The tenth control signal terminal K10 may include one of the plurality of voltage signal terminals. For example, the tenth control signal terminal K10 may include the first voltage signal terminal VGL. For another example, the tenth control signal terminal K10 may include the second voltage signal terminal VGH.

The second voltage stabilizing circuit 220 is configured to form a path between the second node N2 and the fifth N5 in a case where a potential of the fifth node N5 and a potential of a tenth control signal provided by the tenth control signal terminal K10 are valid potentials.

In some examples, the tenth control signal terminal K10 includes the first voltage signal terminal VGL. The second voltage stabilizing circuit 220 is configured to form the path between the second node N2 and the fifth N5 under control of the potential of the fifth node N5 and the potential of the first voltage signal terminal VGL.

Figure 27:
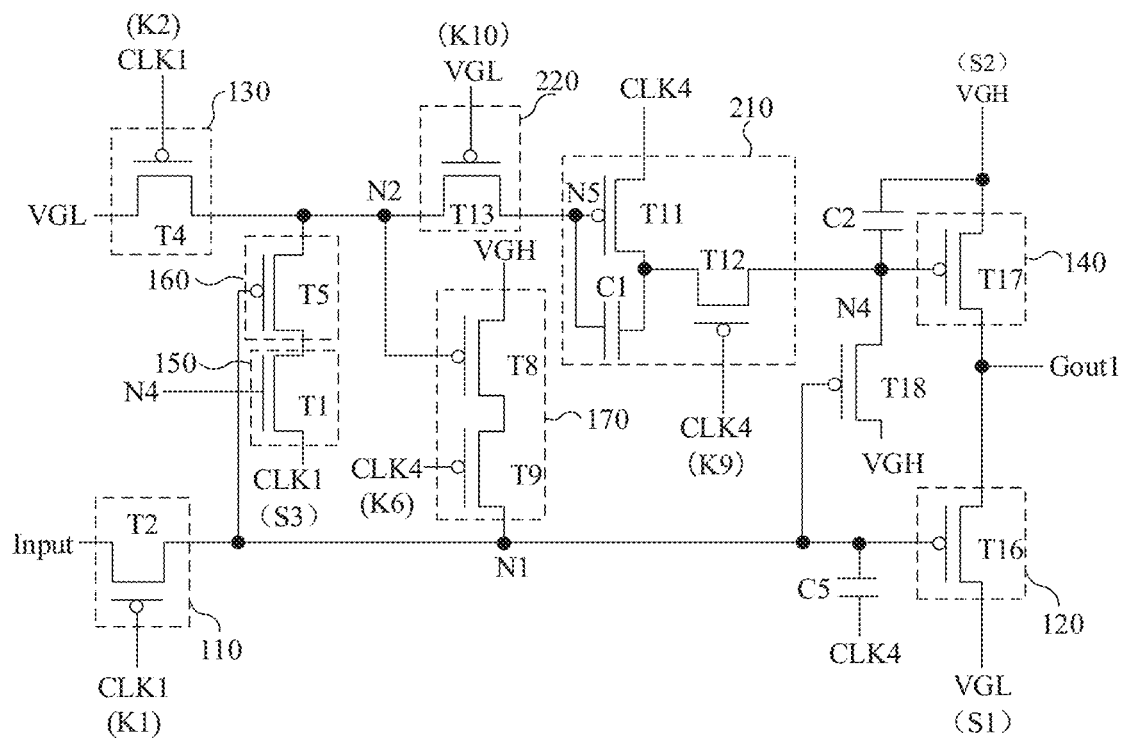
FIG. 27 is a structural diagram of a shift register, in accordance with some embodiments.
Figure 28:
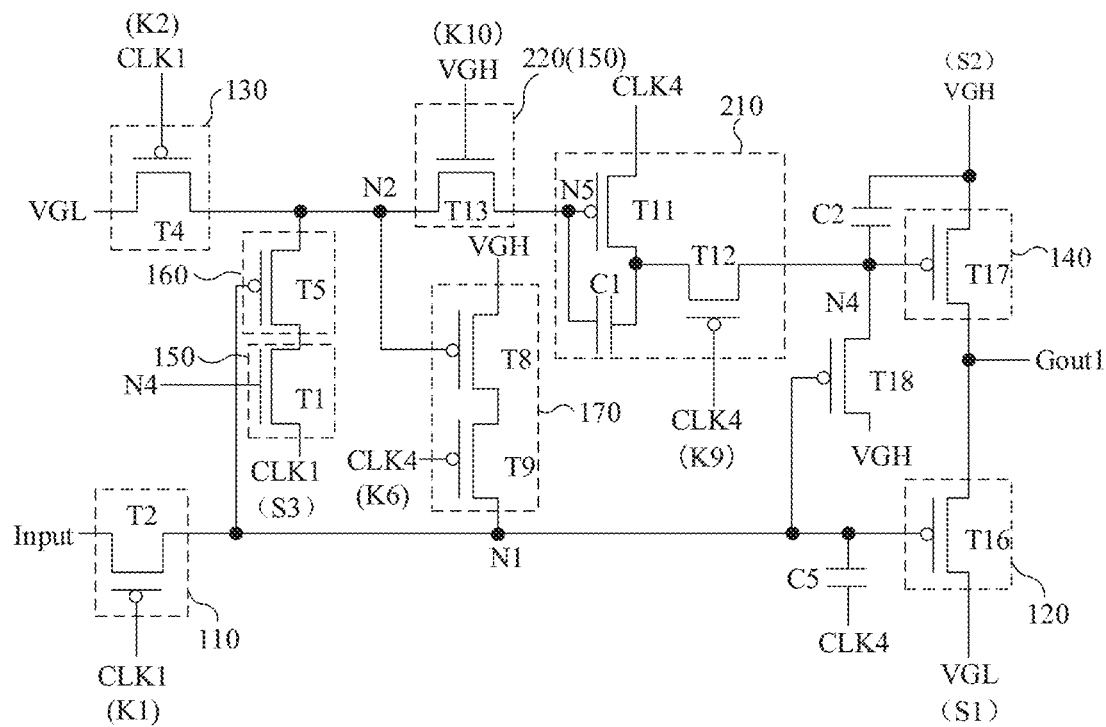
FIG. 28 is a structural diagram of a shift register, in accordance with some embodiments.

In some examples, as shown in FIGS. 27 and 28, the second voltage stabilizing circuit 220 includes a thirteenth transistor T13. A control electrode of the thirteenth transistor T13 is coupled to the tenth control signal terminal K10, a first electrode of the thirteenth transistor T13 is coupled to the second node N2, and a second electrode of the thirteenth transistor T13 is coupled to the fifth node N5.

As shown in FIG. 27, in some examples, the tenth control signal terminal K10 includes the first voltage signal terminal VGL, and the thirteenth transistor T13 is a P-type transistor. In a case where the first voltage signal provided by the first voltage signal terminal VGL is lower than the potential of the fifth node N5, the path between the first electrode of the thirteenth transistor T13 (the second node N2) and the second electrode of the thirteenth transistor T13 (the fifth node N5) is formed to transmit the potential of the second node N2 to the fifth node N5.

As shown in FIG. 28, in some embodiments, the tenth control signal terminal K10 includes the second voltage signal terminal VGH.

The second voltage stabilizing circuit 220 is further used as a functional circuit 150. A functional control terminal includes the second voltage signal terminal VGH, a functional input terminal includes the second node N2, and a functional output terminal includes the fifth node N5.

The second voltage stabilizing circuit 220 is configured to form the path between the second node N2 and the fifth node N5 under control of the potential of the fifth node N5 and the second voltage signal provided by the second voltage signal terminal VGH, so as to transmit the potential of the second node N2 to the fifth node N5.

The second voltage stabilizing circuit 220 is further configured to block the path between the second node N2 and the fifth node N5 under control of the potential of the fifth node N5 and the second voltage signal provided by the second voltage signal terminal VGH, so as to maintain the potential of the fifth node N5.

As shown in FIG. 28, in some examples, the thirteenth transistor T13 in an N-type transistor. In a case where the potential of the fifth node N5 is lower than a potential of the second voltage signal provided by the second voltage signal terminal VGH, the path between the first electrode of the thirteenth transistor T13 (the second node N2) and the second electrode of the thirteenth transistor T13 (the fifth node N5) is formed to transmit the potential of the second node N2 to the fifth node N5. In a case where the potential of the fifth node N5 is higher than the potential of the second voltage signal provided by the second voltage signal terminal VGH, the path between the first electrode of the thirteenth transistor T13 (the second node N2) and the second electrode of the thirteenth transistor T13 (the fifth node N5) is blocked to maintain the potential of the fifth node N5.

Figure 29:
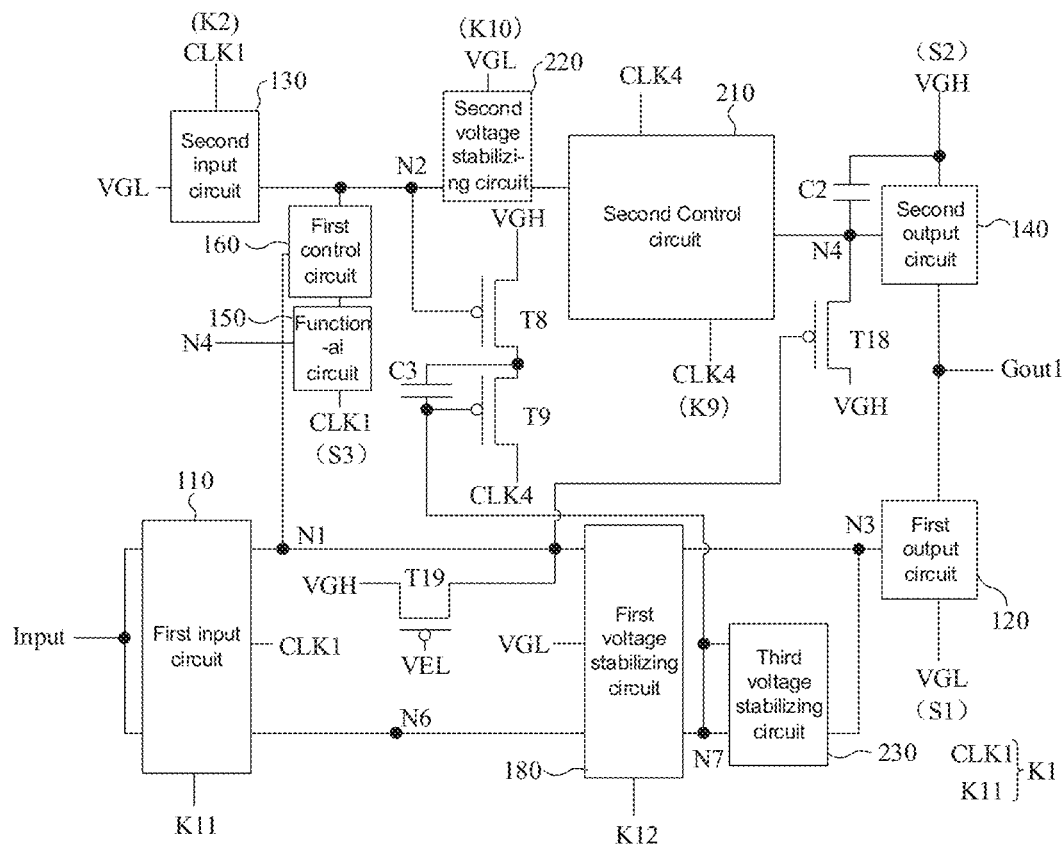
FIG. 29 is a structural diagram of a shift register, in accordance with some embodiments.

As shown in FIG. 29, in some embodiments, a combined structure of the first voltage stabilizing circuit 180 and the first input circuit 110 in the shift register is provided. The circuit nodes include a sixth node N6 and a seventh node N7.

The first control signal terminal K1 includes the first clock signal terminal CLK1 and an eleventh control signal terminal K11. The first input circuit 110 is coupled to the input signal terminal Input, the first clock signal terminal CLK1, the first node N1, the sixth node N6, and the eleventh control signal terminal K11.

The eleventh control signal terminal K11 may include one of the plurality of clock signal terminals, e.g., the first clock signal terminal CLK1. The eleventh control signal terminal K11 may also include one of the plurality of auxiliary clock signal terminals, e.g., the first auxiliary clock signal terminal NCLK1.

The first input circuit 110 is configured to transmit the input signal provided by the input signal terminal to the first node N1 under control of the first clock signal provided by the first clock signal terminal CLK1. The first input circuit 110 is further configured to transmit the input signal provided by the input signal terminal to the sixth node N6 under control of an eleventh control signal provided by the eleventh control signal terminal K11.

The first voltage stabilizing circuit 180 is coupled to the first node N1, the sixth node N6, the third node N3, the seventh node N7, the first voltage signal terminal VGL and a twelfth control signal terminal K12.

The twelfth control signal terminal K12 may include one of the plurality of voltage signal terminals. For example, the twelfth control signal terminal K12 may include the first voltage signal terminal VGL. For another example, the twelfth control signal terminal K12 may include the second voltage signal terminal VGH.

The first voltage stabilizing circuit 180 is configured to form a path between the first node N1 and the third node N3 under control of a potential of the third node N3 and the first voltage signal provided by the first voltage signal terminal VGL. The first voltage stabilizing circuit 180 is further configured to form a path between the sixth node N6 and the seventh node N7 in a case where a potential of the seventh node N7 and a potential of a twelfth control signal provided by the twelfth control signal terminal K12 are valid potentials.

In the embodiments, the first output circuit 120 is coupled to the third node N3, and is coupled to the first node N1 through the first voltage stabilizing circuit 180. The first output circuit 120 is further coupled to the seventh node N7, and is coupled to the sixth node N6 through the seventh node N7 and the first voltage stabilizing circuit 180.

Figure 30:
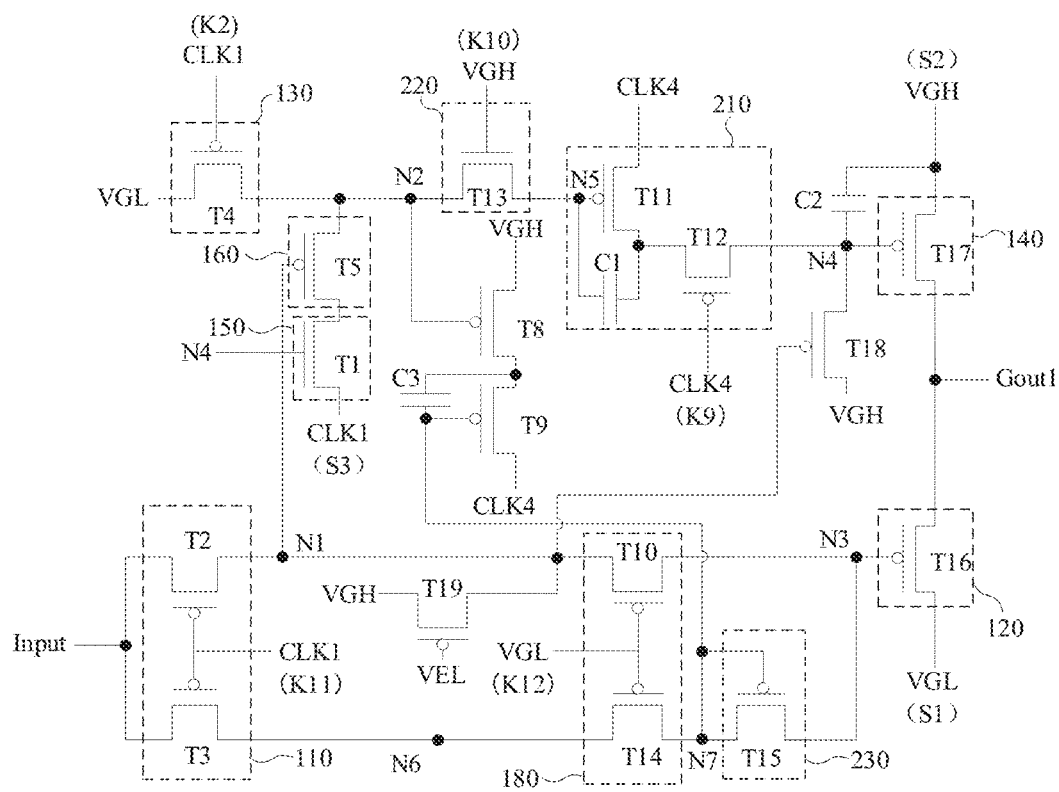
FIG. 30 is a structural diagram of a shift register, in accordance with some embodiments.

As shown in FIG. 30, in some embodiments, the first input circuit 110 includes a second transistor T2 and a third transistor T3. The first voltage stabilizing circuit 180 includes a tenth transistor T10 and a fourteenth transistor T14.

A control electrode of the second transistor T2 is coupled to the first clock signal terminal CLK1, a first electrode of the second transistor T2 is coupled to the input signal terminal, and a second electrode of the second transistor T2 is coupled to the first node N1; a control electrode of the third transistor T3 is coupled to the eleventh control signal terminal K11, a first electrode of the third transistor T3 is coupled to the input signal terminal, and a second electrode of the third transistor T3 is coupled to the sixth node N6.

A control electrode of the tenth transistor T10 is coupled to the first voltage signal terminal VGL, a first electrode of the tenth transistor T10 is coupled to the first node N1, and a second electrode of the tenth transistor T10 is coupled to the third node N3; a control electrode of the fourteenth transistor T14 is coupled to the twelfth control signal terminal K12, a first electrode of the fourteenth transistor T14 is coupled to the sixth node N6, and a second electrode of the fourteenth transistor T14 is coupled to the seventh node N7.

As shown in FIG. 30, in some examples, the eleventh control signal terminal K11 includes the first clock signal terminal CLK1, the twelfth control signal terminal K12 includes the first voltage signal terminal VGL, and the second transistor T2 and the third transistor T3 are both P-type transistors. In a case where the first clock signal provided by the first clock signal terminal CLK1 is at a low potential and the first voltage signal provided by the first voltage signal terminal VGL is at a low potential, a path is formed through the first electrode of the second transistor T2 (the input signal terminal), the second electrode of the second transistor T2, the first electrode of the tenth transistor T10, and the second electrode of the tenth transistor T10 (the third node N3) in sequence, so that the input signal provided by the input signal terminal is transmitted to the third node N3.

In the case where the first clock signal provided by the first clock signal terminal CLK1 is at the low potential and the first voltage signal provided by the first voltage signal terminal VGL is at the low potential, a path is also formed through the first electrode of the third transistor T3 (the input signal terminal), the second electrode of the third transistor T3, the first electrode of the fourteenth transistor T14, and the second electrode of the fourteenth transistor T14 (the seventh node N7) in sequence, so that the input signal provided by the input signal terminal is transmitted to the seventh node N7.

Figure 31:
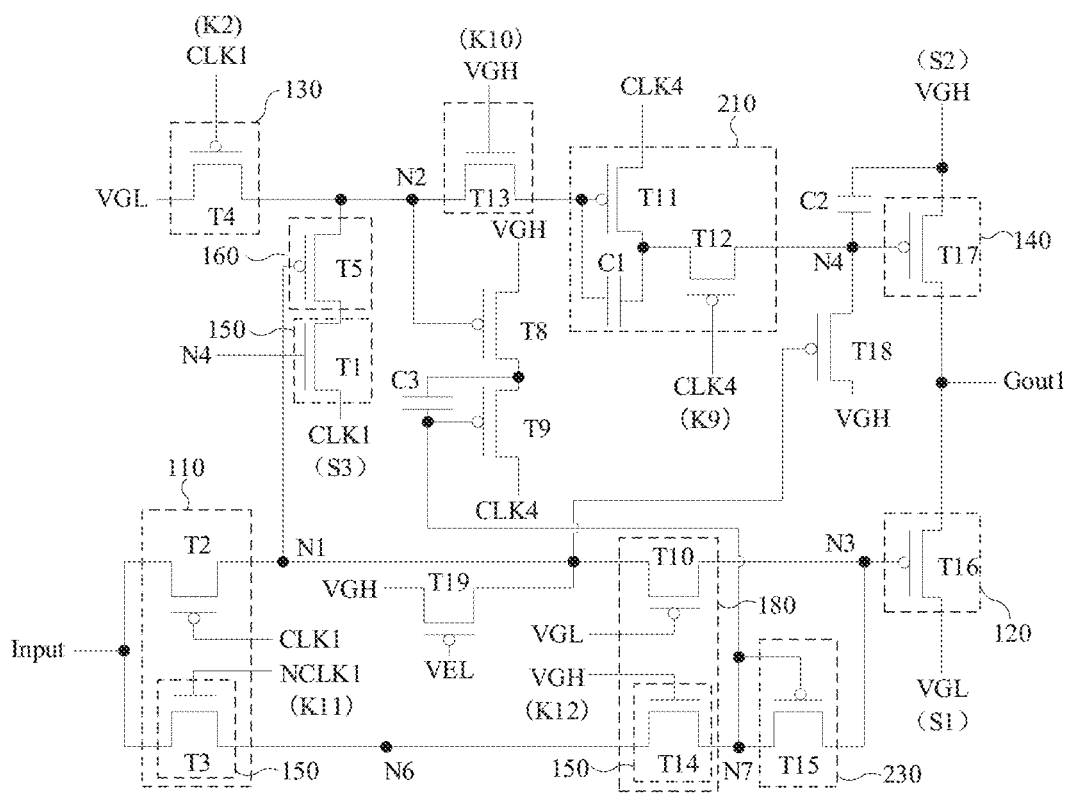
FIG. 31 is a structural diagram of a shift register, in accordance with some embodiments.

As shown in FIG. 31, in some embodiments, the eleventh control signal terminal K11 includes the first auxiliary clock signal terminal NCLK1.

The first input circuit 110 includes a functional circuit 150. A functional control terminal includes the first auxiliary clock signal terminal NCLK1, a functional input terminal includes the input signal terminal, and a functional output terminal includes the sixth node N6.

The functional circuit 150 is configured to form a path between the input signal terminal and the sixth node N6 in a case where the first auxiliary clock signal provided by the first auxiliary clock signal terminal NCLK1 is at a valid potential, so as to transmit the input signal provided by the input signal terminal to the sixth node N6.

The functional circuit 150 is further configured to block the path between the input signal terminal and the sixth node N6 in a case where the first auxiliary clock signal provided by the first auxiliary clock signal terminal NCLK1 is at an invalid potential, so as to maintain the potential of the sixth node N6.

As shown in FIG. 31, in some embodiments, the functional circuit 150 includes the third transistor T3, and the third transistor T3 includes an oxide transistor.

In some examples, the third transistor T3 is an N-type transistor. In a case where the first auxiliary clock signal provided by the first auxiliary clock signal terminal NCLK1 is at a high potential, the path between the first electrode of the third transistor T3 (the input signal terminal) and the second electrode of the third transistor T3 (the sixth node N6) is formed to transmit the input signal provided by the input signal terminal to the seventh node N7. In a case where the first auxiliary clock signal provided by the first auxiliary clock signal terminal NCLK1 is at a low potential, the path between the first electrode of the third transistor T3 (the input signal terminal) and the second electrode of the third transistor T3 (the sixth node N6) is blocked to maintain the potential of the sixth node N6.

As shown in FIG. 31, in some embodiments, the twelfth control signal terminal K12 includes the second voltage signal terminal VGH.

The first voltage stabilizing circuit 180 includes a functional circuit 150. A functional control terminal includes the second voltage signal terminal VGH, a functional input terminal includes the sixth node N6, and a functional output terminal includes the seventh node N7.

The functional circuit 150 is configured to form the path between the sixth node N6 and the seventh node N7 in a case where a potential of the second voltage signal provided by the second voltage signal terminal VGH is lower than the potential of the seventh node N7, so as to transmit the potential of the sixth node N6 to the seventh node N7.

The functional circuit 150 is further configured to block the path between the sixth node N6 and the seventh node N7 in a case where the potential of the second voltage signal provided by the second voltage signal terminal VGH is high than the potential of the seventh node N7, so as to maintain the potential of the seventh node N7.

As shown in FIG. 31, in some embodiments, the functional circuit 150 includes the fourteenth transistor T14, and the fourteenth transistor T14 includes an oxide transistor.

In some examples, the fourteenth transistor T14 is an N-type transistor. In the case where the potential of the second voltage signal provided by the second voltage signal terminal VGH is lower than the potential of the seventh node N7, the path between the first electrode of the fourteenth transistor T14 (the sixth node N6) and the second electrode of the fourteenth transistor T14 (the seventh node N7) is formed to transmit the potential of the sixth node N6 to the seventh node N7. In the case where the potential of the second voltage signal provided by the second voltage signal terminal VGH is higher than the potential of the seventh node N7, the path between the first electrode of the fourteenth transistor T14 (the sixth node N6) and the second electrode of the fourteenth transistor T14 (the seventh node N7) is blocked to maintain the potential of the seventh node N7.

As shown in FIG. 29, in some embodiments, the shift register may further include a third voltage stabilizing circuit 230.

The third voltage stabilizing circuit 230 is coupled to the seventh node N7 and the third node N3. The third voltage stabilizing circuit is configured to connect the seventh node N7 to the third node N3 under control of the potential of the seventh node N7.

In the embodiments, the third voltage stabilizing circuit is coupled in series between the fourteenth transistor T14 and the first output circuit 120. The first output circuit 120 is coupled to the third node N3 and is coupled to the seventh node N7 through the third voltage stabilizing circuit.

As shown in FIGS. 30 and 31, in some embodiments, the third voltage stabilizing circuit includes a fifteenth transistor T15.

A control electrode of the fifteenth transistor T15 is coupled to the seventh node N7, a first electrode of the fifteenth transistor T15 is coupled to the seventh node N7, and a second electrode of the fifteenth transistor T15 is coupled to the third node N3.

In some examples, the fifteenth transistor T15 is a P-type transistor. In a case where the potential of the seventh node N7 is a low potential, a path between the first electrode of the fifteenth transistor T15 (the seventh node N7) and the second electrode of the fifteenth transistor T15 (the third node N3) is formed to transmit the potential of the seventh node N7 to the third node N3.

As shown in FIGS. 5 to 13 and 24 to 31, in some embodiments, the first output signal terminal S1 includes the fourth clock signal terminal CLK4 or the first voltage signal terminal VGL.

The first output circuit 120 includes a sixteenth transistor T16. A control electrode of the sixteenth transistor T16 is coupled to the first node N1, a first electrode of the sixteenth transistor T16 is coupled to the first output signal terminal S1, and a second electrode of the sixteenth transistor T16 is coupled to the first scan signal terminal.

As shown in FIGS. 5, 6, and 11 to 13, in some examples, the first output signal terminal S1 includes the fourth clock signal terminal CLK4, and the sixteenth transistor T16 is a P-type transistor. In a case where the potential of the first node N1 is a low potential, a path between the first electrode of the sixteenth transistor T16 (the fourth clock signal terminal CLK4) and the second electrode of the sixteenth transistor T16 (the first scan signal terminal) is formed to transmit the fourth clock signal provided by the fourth clock signal terminal CLK4 to the first scan signal terminal.

As shown in FIGS. 5, 6 and 11 to 13, in some embodiments, the first output circuit 120 may further include a fourth capacitor C4. A first electrode plate of the fourth capacitor is coupled to the first scan signal terminal, and a second electrode plate of the fourth capacitor is coupled to the first node N1.

Since a potential difference between the two electrode plates cannot change abruptly, when a potential of one electrode plate changes, the fourth capacitor can adjust a potential of the other electrode plate by its own bootstrap action.

As shown in FIGS. 5 to 13, in some embodiments, the second output signal terminal S2 includes the second clock signal terminal CLK2 or the second voltage signal terminal VGH.

The second output circuit 140 includes a seventeenth transistor T17 and a second capacitor C2.

A control electrode of the seventeenth transistor T17 is coupled to the second node N2, a first electrode of the seventeenth transistor T17 is coupled to the second output signal terminal S2, and a second electrode of the seventeenth transistor T17 is coupled to the first scan signal terminal; a first electrode plate of the second capacitor is coupled to the second output signal terminal S2, and a second electrode plate of the second capacitor is coupled to the second node N2.

As shown in FIGS. 5, 6, 11 to 13, in some examples, the second output signal terminal S2 includes the second voltage signal terminal VGH, and the seventeenth transistor T17 is a P-type transistor. In a case where the potential of the second node N2 is a low potential, a path between the first electrode of the seventeenth transistor T17 (the second voltage signal terminal VGH) and the second electrode of the seventeenth transistor T17 (the first scan signal terminal) is formed to transmit the second voltage signal provided by the second voltage signal terminal VGH to the first scan signal terminal.

In some embodiments, the shift register includes the first transistor T1 in the functional circuit 150, and a structure of the first transistor T1 is the same as the structure of the oxide transistor in FIG. 4B. The second gate pattern in the first transistor T1 and the control electrode of the seventeenth transistor T17 are arranged in a same layer. It will be noted that, the "same layer" refers to a layer structure formed by forming a film layer for forming a specific pattern through a same film forming process and then performing a single patterning process using a same mask. Depending on the specific patterns, the single patterning process may include several exposure, development or etching processes, and the specific patterns in the formed layer structure may be continuous or discontinuous, and these specific patterns may also be at different heights or have different thicknesses.

Figure 32:
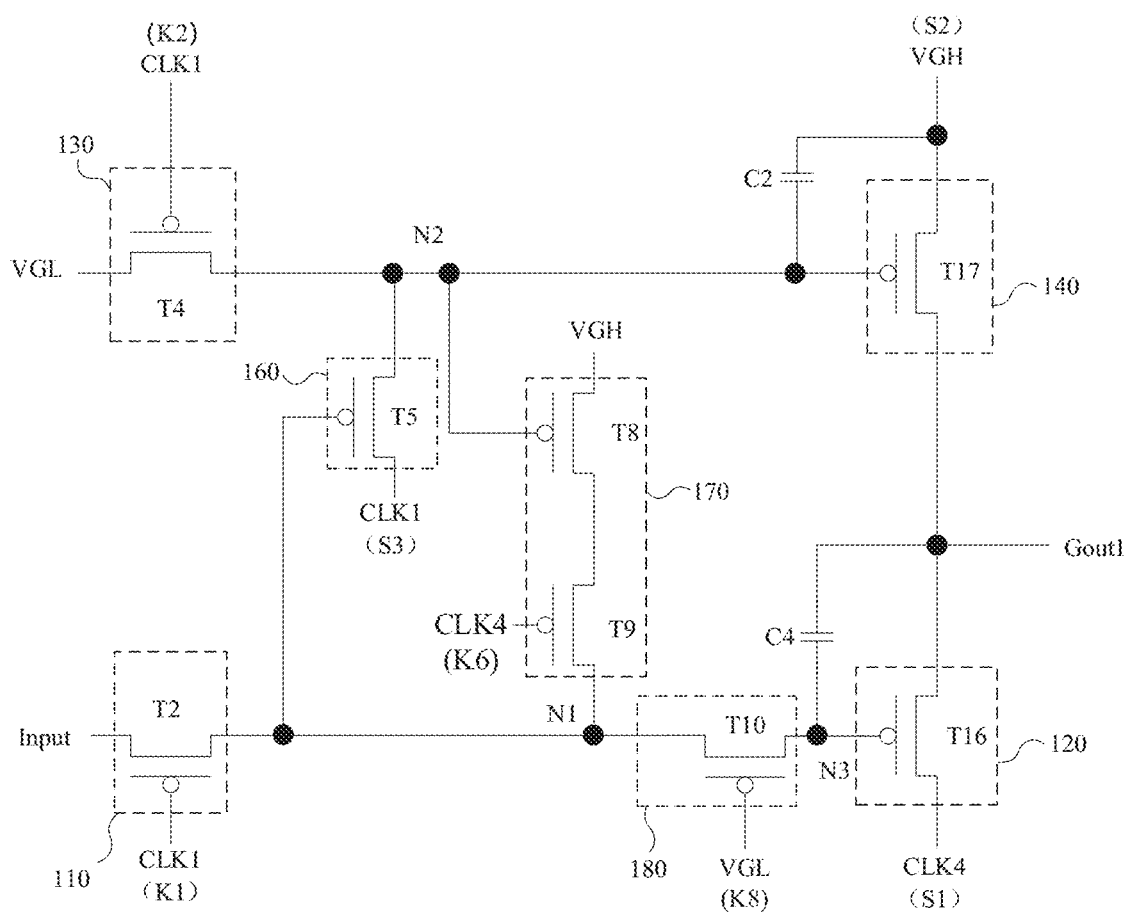
FIG. 32 is a structural diagram of a shift register, in accordance with some embodiments.

As shown in FIG. 32, in some embodiments, the shift register may be the GATE GOA N. The shift register includes a second transistor T2, a fourth transistor T4, a fifth transistor T5, an eighth transistor T8, a ninth transistor T9, a tenth transistor T10, a sixteenth transistor T16, a seventeenth transistor T17, a second capacitor C2, and a fourth capacitor C4.

A control electrode of the second transistor T2 is coupled to the first clock signal terminal CLK1, a first electrode of the second transistor T2 is coupled to the input signal terminal Input, and a second electrode of the second transistor T2 is coupled to the first node N1.

A control electrode of the fourth transistor T4 is coupled to the first clock signal terminal CLK1, a first electrode of the fourth transistor T4 is coupled to the first voltage signal terminal VGL, and a second electrode of the fourth transistor T4 is coupled to the second node N2.

A control electrode of the fifth transistor T5 is coupled to the first node N1, a first electrode of the fifth transistor T5 is coupled to the first clock signal terminal CLK1, and a second electrode of the fifth transistor T5 is coupled to the second node N2.

A control electrode of the eighth transistor T8 is coupled to the second node N2, a first electrode of the eighth transistor T8 is coupled to the second voltage signal terminal VGH, and a second electrode of the eighth transistor T8 is coupled to a first electrode of the ninth transistor T9.

A control electrode of the ninth transistor T9 is coupled to the fourth clock signal terminal CLK4, and a second electrode of the ninth transistor T9 is coupled to the first node N1.

A control electrode of the tenth transistor T10 is coupled to the first voltage signal terminal VGL, a first electrode of the tenth transistor T10 is coupled to the first node N1, and a second electrode of the tenth transistor T10 is coupled to the third node N3.

A control electrode of the sixteenth transistor T16 is coupled to the third node N3, a first electrode of the sixteenth transistor T16 is coupled to the fourth clock signal terminal CLK4, and a second electrode of the sixteenth transistor T16 is coupled to the first scan signal terminal.

A control electrode of the seventeenth transistor T17 is coupled to the second node N2, a first electrode of the seventeenth transistor T17 is coupled to the second voltage signal terminal VGH, and a second electrode of the seventeenth transistor T17 is coupled to the first scan signal terminal.

A first electrode plate of the second capacitor is coupled to the second voltage signal terminal VGH, and a second electrode plate of the second capacitor is coupled to the second node N2.

A first electrode plate of the fourth capacitor is coupled to the first scan signal terminal, and a second electrode plate of the fourth capacitor is coupled to the third node N3.

Figure 33:
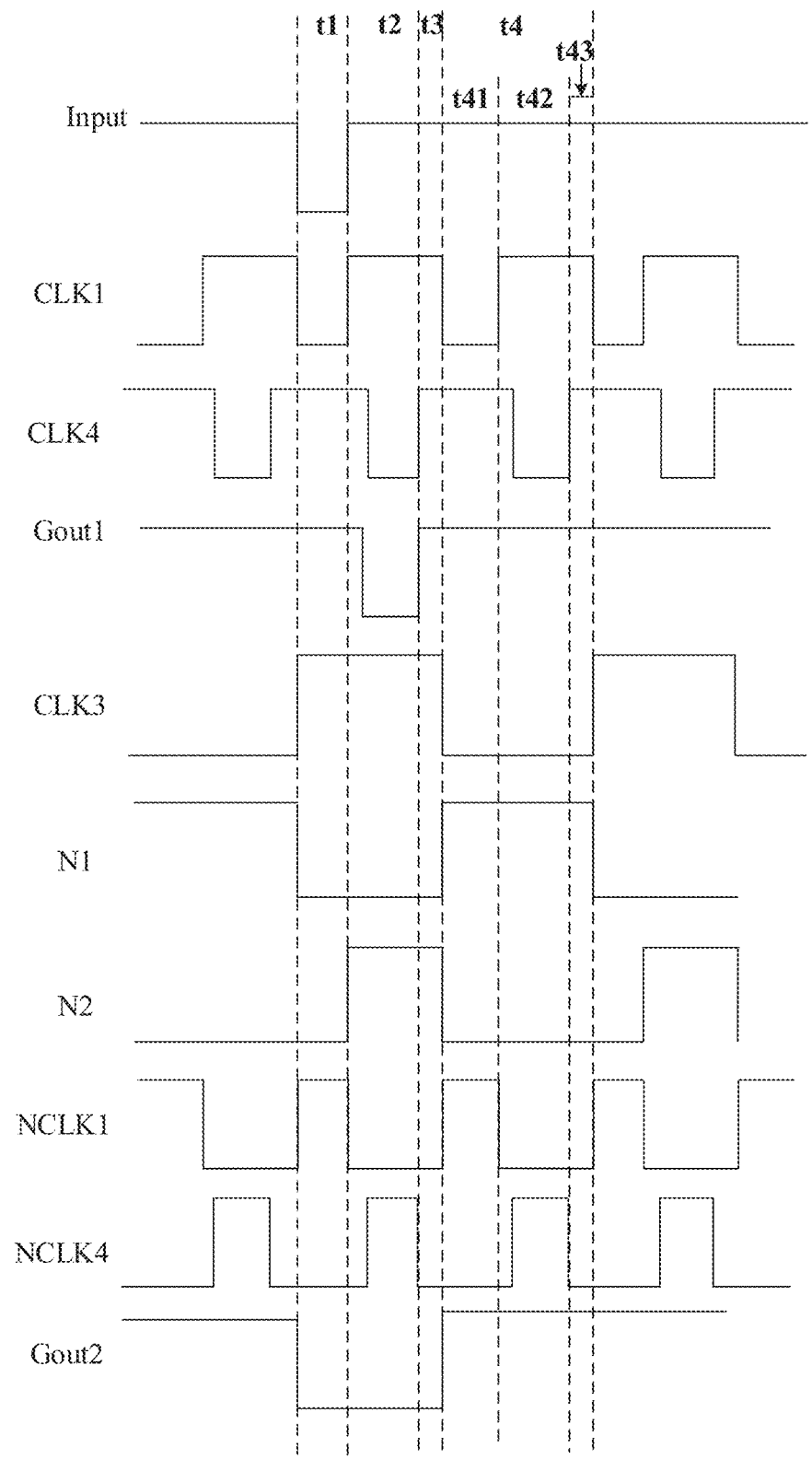
FIG. 33 is a timing diagram of a plurality of signal terminals and a plurality of nodes in the shift register shown in FIG. 32.

As shown in FIG. 33, FIG. 33 includes a timing of the input signal provided by the input signal terminal, a timing of the first clock signal provided by the first clock signal terminal CLK1, a timing of the fourth clock signal provided by the fourth clock signal terminal CLK4, a timing of the first scan signal provided by the first scan signal terminal, a timing of the first node N1, and a timing of the second node N2. In addition, the first voltage signal terminal VGL continuously provides the first voltage signal with a low potential, and the second voltage signal terminal VGH continuously provides the second voltage signal with a high potential. An operation phase in FIG. 33 includes a first phase t1, a second phase t2, a third phase t3, and a fourth phase t4. The fourth phase t4 includes a first sub-phase t41, a second sub-phase t42, and a third sub-phase t43.

The second transistor T2, the fourth transistor T4, the fifth transistor T5, the eighth transistor T8, the ninth transistor T9, the tenth transistor T10, the sixteenth transistor T16, and the seventeenth transistor T17 are all P-type transistors for the following description.

In the first phase t1, the first clock signal provided by the first clock signal terminal CLK1 is a low potential signal, the fourth clock signal provided by the fourth clock signal terminal CLK4 is a high potential signal, and the input signal provided by the input signal terminal is a low potential signal, for example, the potential of the input signal is equal to the potential of the first voltage signal. Since the first clock signal is the low potential signal, the second transistor T2 is in the on state, and the input signal is transmitted to the first node N1 through the second transistor T2. Since the second transistor T2 has a threshold loss when transmitting the low potential signal, the potential of the first node N1 is (Vin (the potential of the input signal)−Vth2 (a threshold voltage of the second transistor T2)), i. e., (VGL (the potential of the first voltage signal)−Vth2). Since the control electrode of the tenth transistor T10 receives the first voltage signal, so that the tenth transistor T10 is in the on state, the voltage (VGL−Vth2) is transmitted to the third node N3 through the tenth transistor T10. For example, a threshold voltage of the tenth transistor T10 is represented as Vth10; similarly, since the tenth transistor T10 has a threshold loss when transmitting the low potential signal, the potential of the third node N3 is (VGL−VthN3), where VthN3 is the smaller one of Vth2 and Vth10 (the threshold voltage of the tenth transistor T10). The potential of the third node N3 may control the sixteenth transistor T16 to be in the on state, and the fourth clock signal is written into the first scan signal terminal through the sixteenth transistor T16 as the first scan signal. That is, in the first phase t1, the output signal is the fourth clock signal with the high potential. For example, the high potential of the fourth clock signal is equal to the potential of the second voltage signal, i.e., VGH (the potential of the second voltage signal).

In the first phase t1, since the first clock signal is the low potential signal, the fourth transistor T4 is in the on state, and the first voltage signal VGL is transmitted to the second node N2 through the fourth transistor T4; since the potential of the first node N1 is (VGL−Vth2), the fifth transistor T5 is in the on state, the first clock signal at the low potential is transmitted to the second node N2 through the fifth transistor T5. For example, a threshold voltage of the fifth transistor T5 is represented as Vth5, a threshold voltage of the fourth transistor T4 is represented as Vth4; in a case where Vth4 is less than a sum of Vth5 and Vth2 (Vth4<Vth5+Vth2), the potential of the second node N2 is (VGL−Vth5 Vth2); and in a case where Vth4 is greater than a sum of Vth5 and Vth2 (Vth4>Vth5+Vth2), the potential of the second node N2 is (VGL−Vth4). At this time, the seventeenth transistor T17 and the eighth transistor T8 are both in the on state. Since the fourth clock signal is the high potential signal, the ninth transistor T9 is in the off state.

In the second phase t2, the first clock signal provided by the first clock signal terminal CLK1 is a high potential signal, the fourth clock signal provided by the fourth clock signal terminal CLK4 is a low potential signal, and the input signal provided by the input signal terminal is a high potential signal. The second transistor T2 and the fourth transistor T4 are both in the off state. The potential of the first node N1 is still (VGL−Vth2), the fifth transistor T5 is in the on state, the first clock signal with the high potential is transmitted to the second node N2 through the fifth transistor T5. That is, the potential of the second node N2 is equal to the potential of the second voltage signal. Therefore, the seventeenth transistor T17 and the eighth transistor T8 are both in the off state. Since the fourth clock signal is the low potential signal, the ninth transistor T9 is in the on state.

In the second phase t2, the sixteenth transistor T16 is in the on state, and the fourth clock signal is written into the first scan signal terminal through the sixteenth transistor T16 as the output signal. In the first phase t1, the potential of a terminal, connected to the first scan signal terminal, of the first electrode plate of the fourth capacitor C4 is equal to the potential of the second voltage signal, and the potential of a terminal, connected to the third node N3, of the second electrode plate of the fourth capacitor C4 is (VGL−VthN3); in the second phase t2, the potential of the terminal, connected to the first scan signal terminal, of the first electrode plate of the fourth capacitor C4 changes to VGL, and the potential of the terminal, connected to the third node N3, of the second electrode plate of the fourth capacitor C4 is changed to (2VGL−VthN3−VGH) due to the bootstrap action of the fourth capacitor C4. That is, the potential of the third node N3 changes to (2VGL−VthN3−VGH). In this case, the tenth transistor T10 is in the off state, the sixteenth transistor T16 may be better turned on, and the potential of the first scan signal terminal is equal to the potential of the first voltage signal.

In the third phase t3, the first clock signal provided by the first clock signal terminal CLK1 and the fourth clock signal provided by the fourth clock signal terminal CLK4 are both high potential signals, and the input signal provided by the input signal terminal is a high potential signal. The second transistor T2 and the fourth transistor T4 are both in the off state. The potential of the third node N3 changes to (VGL−VthN3); at this time, the tenth transistor T10 is in the on state, the potential of the first node N1 is also (VGL−VthN3), the fifth transistor T5 is in the on state, and the first clock signal with the high potential is transmitted to the second node N2 through the fifth transistor T5. That is, the potential of the second node N2 is equal to the potential of the second voltage signal, and thus the seventeenth transistor T17 and the eighth transistor T8 are both in the off state. Since the fourth clock signal is the high potential signal, the ninth transistor T9 is in the off state.

In the third phase t3, the sixteenth transistor T16 is in the on state, and the fourth clock signal is written into the first scan signal terminal through the sixteenth transistor T16 as the first scan signal; at this time, the first scan signal is the fourth clock signal with the high potential, i.e., the second voltage signal VGH. Due to the bootstrap action of the fourth capacitor C4, the potential of the third node N3 changes to (VGL−VthN3).

In the first sub-phase t41 of the fourth phase t4, the first clock signal provided by the first clock signal terminal CLK1 is a low potential signal, the fourth clock signal provided by the fourth clock signal terminal CLK4 is a high potential signal, and the input signal provided by the input signal terminal is a high potential signal. For example, the input signal is equal to the second voltage signal VGH. Since the first clock signal is the low potential signal, the second transistor T2 is in the on state, and the input signal is transmitted to the first node N1 through the second transistor T2. Since the second transistor T2 transmitting the high potential signal has no threshold loss, the potential of the first node N1 is Vin (equal to the potential of the second voltage signal), and the fifth transistor T5 is in the off state. Since the tenth transistor T10 is in the on state, the potential of the third node N3 is the same as the potential of the first node N1. That is to say, the potential of the third node N3 is equal to the potential of the second voltage signal, and the sixteenth transistor T16 is in the off state. Since the first clock signal is the low potential signal, the fourth transistor T4 is in the on state. The potential of the second node N2 is (VGL−Vth4), the seventeenth transistor T17 and the eighth transistor T8 are both in the on state, and the second voltage signal VGH is transmitted to the first scan signal terminal through the seventeenth transistor T17. That is, the first scan signal is the second voltage signal VGH.

In the second sub-phase t42 of the fourth phase t4, the first clock signal provided by the first clock signal terminal CLK1 is a high potential signal, the fourth clock signal provided by the fourth clock signal terminal CLK4 is a low potential signal, and the input signal provided by the input signal terminal is a high potential signal. The potential of the third node N3 and the potential of the first node N1 are Vin (equal to the potential of the second voltage signal), and the sixteenth transistor T16 and the fifth transistor T5 are both in the off state. The first clock signal is the high potential signal, so that the second transistor T2 and the fourth transistor T4 are both in the off state. Due to the holding action of the second capacitor C2, the potential of the second node N2 is still (VGL−Vth4). Thus, the seventeenth transistor T17 and the eighth transistor T8 are both in the on state, the second voltage signal VGH is transmitted to the first scan signal terminal through the seventeenth transistor T17, and the first scan signal is the second voltage signal VGH. In the second sub-phase t42 of the fourth phase t4, since the fourth clock signal is the low potential signal, the ninth transistor T9 is in the on state; the second voltage signal VGH is transmitted to the first node N1 and the third node N3 through the eighth transistor T8 and the ninth transistor T9, so that the potential of the third node N3 and the potential of the first node N1 are kept at a high potential.

In the third sub-phase t43 of the fourth phase t4, the first clock signal provided by the first clock signal terminal CLK1 and the fourth clock signal provided by the fourth clock signal terminal CLK4 are both high potential signals, and the input signal provided by the input signal terminal is a high potential signal. The potential of the first node N1 and the potential of the third node N3 are equal to the potential of the second voltage signal, and the sixteenth transistor T16 and the fifth transistor T5 are both in the off state. The first clock signal is the high potential signal, so that the second transistor T2 and the fourth transistor T4 are both in the off state, the potential of the second node N2 is still (VGL−Vth4), and the seventeenth transistor T17 and the eighth transistor T8 are both in the on state. The second voltage signal VGH is transmitted to the first scan signal terminal through the seventeenth transistor T17, and the first scan signal is the second voltage signal VGH.

For the shift register shown in FIG. 5, in some embodiments, the difference from the shift register shown in FIG. 32 includes that the first transistor T1 is added, and the first transistor T1 includes the oxide transistor. The first transistor T1 is coupled in series between the second node N2 and the first clock signal terminal CLK1. For example, the first transistor T1 is coupled in series between the second node N2 and the fifth transistor T5. For another example, the first transistor T1 is coupled in series between the fifth transistor T5 and the first clock signal terminal CLK1. A control electrode of the first transistor T1 is coupled to the third clock signal terminal CLK3.

The following is described by taking an example in which the first transistor T1 is an N-type transistor.

As shown in FIGS. 5 and 33, in the first phase t1, the third clock signal provided by the third clock signal terminal CLK3 is a high potential signal, the first node N1 is at the low potential (the voltage value is (VGL−Vth2)), the first transistor T1 and the fifth transistor T5 are both in the on state, and the first clock signal provided by the first clock signal terminal CLK1 is the low potential signal and is transmitted to the second node N2 through the first transistor T1 and the fifth transistor T5.

In the second phase t2, the third clock signal provided by the third clock signal terminal CLK3 is the high potential signal, the first node N1 is at the low potential (the voltage value is (VGL−Vth2)), the first transistor T1 and the fifth transistor T5 are both in the on state, and the first clock signal provided by the first clock signal terminal CLK1 is the high potential signal and is transmitted to the second node N2 through the first transistor T1 and the fifth transistor T5.

In the third phase t3, the third clock signal provided by the third clock signal terminal CLK3 is the high potential signal, the first node N1 is at the low potential (the voltage value is (VGL−VthN3)), the first transistor T1 and the fifth transistor T5 are both in the on state, and the first clock signal provided by the first clock signal terminal CLK1 is the high potential signal and is transmitted to the second node N2 through the first transistor T1 and the fifth transistor T5.

In the first sub-phase t41 of the fourth phase t4, the third clock signal provided by the third clock signal terminal CLK3 is a low potential signal, the first node N1 is at the high potential (the voltage value is VGH), the first transistor T1 and the fifth transistor T5 are both in the off state, and the first transistor T1 can block the path between the first clock signal terminal CLK1 and the second node N2 to maintain the potential of the second node N2.

In the second sub-phase t42 of the fourth phase t4, the third clock signal provided by the third clock signal terminal CLK3 is the low potential signal, the potential of the first node N1 is at the high potential (the voltage value is VGH), the first transistor T1 and the fifth transistor T5 are both in the off state, and the first transistor T1 can block the path between the first clock signal terminal CLK1 and the second node N2, thereby preventing the first clock signal with the high potential provided by the first clock signal terminal CLK1 from boosting the potential of the second node N2. As a result, the potential of the second node N2 is maintained.

In the third sub-phase t43 of the fourth phase t4, the third clock signal provided by the third clock signal terminal CLK3 is the low potential signal, the first node N1 is at the high potential (the voltage value is VGH), the first transistor T1 and the fifth transistor T5 are both in the off state, and the first transistor T1 can block the path between the first clock signal terminal CLK1 and the second node N2, thereby preventing the first clock signal with the high potential provided by the first clock signal terminal CLK1 from boosting the potential of the second node N2. As a result, the potential of the second node N2 is maintained.

As described above, it can be seen from the fact that the first transistor T1 is coupled in series between the second node N2 and the first clock signal terminal CLK1, on the basis of the normal operation of the first control circuit 160, it is also possible to effectively prevent the first clock signal provided by the first clock signal terminal CLK1 from affecting the potential of the second node N2, improve the stability of the potential of the second node N2, and thus improve the reliability of the shift register.

For the operation process of other transistors, reference may be made to the above schematic description, and details are not described here.

For the shift register shown in FIG. 6, in some embodiments, the difference from the shift register shown in FIG. 32 includes that the second transistor T2 is the oxide transistor. A control electrode of the second transistor T2 in the embodiments is coupled to the first auxiliary clock signal terminal NCLK1.

The second transistor T2 is taken as an N-type transistor for description.

As shown in FIGS. 6 and 33, in the first phase t1, the first auxiliary clock signal provided by the first auxiliary clock signal terminal NCLK1 is a high potential signal, and the second transistor T2 is in the on state; the input signal provided by the input signal terminal is the low potential, and the input signal is transmitted to the first node N1 through the second transistor T2.

In the second phase t2, the first auxiliary clock signal provided by the first auxiliary clock signal terminal NCLK1 is a low potential signal, the second transistor T2 is in the off state, and the path between the input signal terminal and the first node N1 is blocked, thereby preventing the input signal with the high potential provided by the input signal terminal from boosting the potential of the first node N1. As a result, the low potential of the first node N1 is maintained.

In the third phase t3, the first auxiliary clock signal provided by the first auxiliary clock signal terminal NCLK1 is the low potential signal, the second transistor T2 is in the off state, and the path between the input signal terminal and the first node N1 is blocked, thereby preventing the input signal with the high potential provided by the input signal terminal from boosting the potential of the first node N1. As a result, the low potential of the first node N1 is maintained.

In the first sub-phase t41 of the fourth phase t4, the first auxiliary clock signal provided by the first auxiliary clock signal terminal NCLK1 is a high potential signal, the second transistor T2 is in the on state, the input signal provided by the input signal terminal is the high potential, and the input signal is transmitted to the first node N1 through the second transistor T2.

In the second sub-phase t42 of the fourth phase t4, the first auxiliary clock signal provided by the first auxiliary clock signal terminal NCLK1 is a low potential signal, the second transistor T2 is in the off state, and the path between the input signal terminal and the first node N1 is blocked to maintain the low potential of the first node N1.

In the third sub-phase t43 of the fourth phase t4, the first auxiliary clock signal provided by the first auxiliary clock signal terminal NCLK1 is the low potential signal, the second transistor T2 is in the off state, and the path between the input signal terminal and the first node N1 is blocked to maintain the low potential of the first node N1.

As described above, it can be seen from the fact that the second transistor T2 is used as the oxide transistor, and the control electrode of the second transistor T2 is coupled to the first auxiliary clock signal terminal NCLK1, in a case where the second transistor T2 is in the off state on the basis of the normal operation of the first input circuit 110, it is possible to prevent the input signal provided by the input signal terminal from affecting the potential of the first node N1, improve the stability of the potential of the first node N1, and thus improve the reliability of the shift register.

For the operation process of other transistors, reference may be made to the above schematic description, and details are not described here.

For the shift register shown in FIG. 11, in some embodiments, the difference from the shift register shown in FIG. 32 includes that the fourth transistor T4 is the oxide transistor. A control electrode of the fourth transistor T4 in the embodiments is coupled to the first auxiliary clock signal terminal NCLK1.

The fourth transistor T4 is taken as an N-type transistor for description.

As shown in FIGS. 11 and 33, in the first phase t1, the first auxiliary clock signal provided by the first auxiliary clock signal terminal NCLK1 is a high potential signal, the fourth transistor T4 is in the on state, and the first voltage signal provided by the first voltage signal terminal VGL is transmitted to the second node N2 through the fourth transistor T4.

In the second phase t2, the first node N1 is at the low potential, the fifth transistor T5 is in the on state, and the first clock signal with a high potential is transmitted to the second node N2. The first auxiliary clock signal provided by the first auxiliary clock signal terminal NCLK1 is a low potential signal, the fourth transistor T4 is in the off state, and the path between the first voltage signal terminal VGL and the second node N2 is blocked, which prevents the first voltage signal of the low potential signal from affecting the high potential at the second node N2, and improve the stability of the potential of the second node N2.

In the third phase t3, the first node N1 is at the low potential, the fifth transistor T5 is in the on state, and the first clock signal with the high potential is transmitted to the second node N2. The first auxiliary clock signal provided by the first auxiliary clock signal terminal NCLK1 is the low potential signal, the fourth transistor T4 is in the off state, and the path between the first voltage signal terminal VGL and the second node N2 is blocked to maintain the high potential of the second node N2.

In the first sub-phase t41 of the fourth phase t4, the first auxiliary clock signal provided by the first auxiliary clock signal terminal NCLK1 is a high potential signal, the fourth transistor T4 is in the on state, and the first voltage signal provided by the first voltage signal terminal VGL is transmitted to the second node N2 through the fourth transistor T4.

In the second sub-phase t42 of the fourth phase t4, the first node N1 is at the high potential, and the fifth transistor T5 is in the off state. The first auxiliary clock signal provided by the first auxiliary clock signal terminal NCLK1 is a low potential signal, the fourth transistor T4 is in the off state, and the path between the first voltage signal terminal VGL and the second node N2 is blocked to maintain the low potential of the second node N2.

In the third sub-phase t43 of the fourth phase t4, the first node N1 is at the high potential, and the fifth transistor T5 is in the off state. The first auxiliary clock signal provided by the first auxiliary clock signal terminal NCLK1 is the low potential signal, the fourth transistor T4 is in the off state, and the path between the first voltage signal terminal VGL and the second node N2 is blocked to maintain the low potential of the second node N2.

As described above, it can be seen from the face that the fourth transistor T4 is used as the oxide transistor, and the control electrode of the fourth transistor T4 is coupled to the first auxiliary clock signal terminal NCLK1, in a case where the fourth transistor T4 is in the off state on the basis of the normal operation of the second input circuit 130, it is possible to prevent the first voltage signal provided by the first voltage signal terminal VGL from affecting the potential of the second node N2, improve the stability of the potential of the second node N2, and thus improve the reliability of the shift register.

For the operation process of other transistors, reference may be made to the above schematic description, and details are not described here.

For the shift register shown in FIG. 22, in some embodiments, the difference from the shift register shown in FIG. 32 includes that the tenth transistor T10 is the oxide transistor. A control electrode of the tenth transistor T10 in the embodiments is coupled to the second voltage signal terminal VGH.

The tenth transistor T10 is taken as an N-type transistor for description.

As shown in FIGS. 22 and 33, in the first phase t1, the first node N1 is at a low potential (the voltage value is (VGL−Vth2). The second voltage signal provided by the second voltage signal terminal VGH is a high potential signal, the tenth transistor T10 is in the on state, and the potential of the first node N1 is transmitted to the third node N3 through the tenth transistor T10.

In the second phase t2, the third node N3 is at a low potential (2VGL−VthN3−VGH). The second voltage signal provided by the second voltage signal terminal VGH is the high potential signal, the tenth transistor T10 is in the off state, and the path between the first node N1 and the third node N3 is blocked to maintain the low potential of the third node N3.

In the third phase t3, the first node N1 is at a low potential (the voltage value is (VGL−VthN3)). The second voltage signal provided by the second voltage signal terminal VGH is the high potential signal, the tenth transistor T10 is in the on state, and the potential of the first node N1 is transmitted to the third node N3 through the tenth transistor T10.

In the first sub-phase t41, the second sub-phase t42 and the third sub-phase t43 of the fourth phase t4, the potential of the first node N1 is a high potential. The second voltage signal provided by the second voltage signal terminal VGH is the high potential signal, the tenth transistor T10 is in the on state, and the potential of the first node N1 is transmitted to the third node N3 through the tenth transistor T10.

As described above, it can be seen from the fact that the tenth transistor T10 is used as the oxide transistor, and the control electrode of the tenth transistor T10 is coupled to the second voltage signal terminal VGH, in a case where the tenth transistor T10 is in the off state on the basis of the normal operation of the first voltage stabilizing circuit 180, it is possible to prevent the potential of the first node N1 from affecting the potential of the third node N3, improve the stability of the potential of the third node N3, and thus improve the reliability of the shift register.

For the operation process of other transistors, reference may be made to the above schematic description, and details are not described here.

For the shift register shown in FIG. 20, in some embodiments, the difference from the shift register shown in FIG. 32 includes that the first transistor T1 is added, and the first transistor T1 includes the oxide transistor. The first transistor T1 is coupled in series between the second voltage signal terminal VGH and the first node N1, and the control electrode of the first transistor T1 is coupled to the first node N1. For the first transistor T1 coupled in series between the second voltage signal terminal VGH and the first node N1, there may be a plurality of series positions, which have been described above in detail and will not be described in detail here.

The description is made by taking a case where the first transistor T1 is an N-type transistor, and the first transistor T1 is located between the eighth transistor T8 and the ninth transistor T9.

As shown in FIGS. 20 and 33, in the first phase t1, the second node N2 is at the low potential, and the eighth transistor T8 is in the on state. The fourth clock signal provided by the fourth clock signal terminal CLK4 is a high potential signal, and the ninth transistor T9 is in the off state. The first node N1 is at the low potential, the first transistor T1 is in the off state, and the path between the second voltage signal terminal VGH and the first node N1 is blocked to prevent the second voltage signal with the high potential from affecting the low potential of the first node N1, thereby maintaining stability of the first node N1.

In the second phase t2, the second node N2 is at the high potential, and the eighth transistor T8 is in the off state. The fourth clock signal provided by the fourth clock signal terminal CLK4 is a low potential signal, and the ninth transistor T9 is in the on state. The first node N1 is still at the low potential, the first transistor T1 is in the off state, and the path between the second voltage signal terminal VGH and the first node N1 is blocked to prevent the second voltage signal with the high potential from affecting the low potential of the first node N1, thereby maintaining the stability of the first node N1.

In the third phase t3, the second node N2 is at the low potential, and the eighth transistor T8 is in the on state. The fourth clock signal provided by the fourth clock signal terminal CLK4 is a high potential signal, and the ninth transistor T9 is in the off state. The first node N1 is still at the low potential, the first transistor T1 is in the off state, and the path between the second voltage signal terminal VGH and the first node N1 is blocked to prevent the second voltage signal with the high potential from affecting the low potential of the first node N1, thereby maintaining the stability of the first node N1.

In the first sub-phase t41 of the fourth phase t4, the second node N2 is at the high potential, and the eighth transistor T8 is in the off state. The fourth clock signal provided by the fourth clock signal terminal CLK4 is the high potential signal, and the ninth transistor T9 is in the off state. The first node N1 is at the high potential, and the first transistor T1 is in the on state. Since the first node N1 and the second voltage signal are both at the high potential, the second voltage signal will not affect the potential of the first node N1.

In the second sub-phase t42 of the fourth phase t4, the second node N2 is at the low potential, and the eighth transistor T8 is in the on state. The fourth clock signal provided by the fourth clock signal terminal CLK4 is a low potential signal, and the ninth transistor T9 is in the on state. The first node N1 is at the high potential, the first transistor T1 is in the on state, the path between the second voltage signal terminal VGH and the first node N1 is formed, and the second voltage signal is transmitted to the first node N1.

In the third sub-phase t43 of the fourth phase t4, the second node N2 is at the low potential, and the eighth transistor T8 is in the on state. The fourth clock signal provided by the fourth clock signal terminal CLK4 is a high potential signal, and the ninth transistor T9 is in the off state. The first node N1 is at the high potential, and the first transistor T1 is in the on state. Since the first node N1 and the second voltage signal are both at the high potential, the second voltage signal will not affect the potential of the first node N1.

As described above, it can be seen from the fact that the first transistor T1 is coupled in series between the second voltage signal terminal VGH and the first node N1, on the basis of the normal operation of the noise reduction circuit 170, it is also possible to effectively prevent the second voltage signal from affecting the potential of the first node N1 in a case where at least one of the eighth transistor T8 and the ninth transistor T9 is in the off state and the potential of the first node N1 is different from the potential of the second voltage signal, improve the stability of the potential of the first node N1, and thus improve the reliability of the shift register.

For the operation process of other transistors, reference may be made to the above schematic description, and details are not described here.

For the shift register shown in FIG. 21, in some embodiments, the difference from the shift register shown in FIG. 32 includes that the ninth transistor T9 is the oxide transistor. The control electrode of the ninth transistor T9 in the embodiments is coupled to the fourth auxiliary clock signal terminal NCLK4.

The ninth transistor T9 is taken as an N-type transistor for description.

As shown in FIGS. 21 and 33, in the first phase t1, the potential of the first node N1 and the potential of the second node N2 are both low potentials, and the eighth transistor T8 is in the on state. The fourth auxiliary clock signal provided by the fourth auxiliary clock signal terminal NCLK4 is a low potential signal, and the ninth transistor T9 is in the off state. The path between the first node N1 and the second voltage signal terminal VGH is blocked by the ninth transistor T9, which prevents the second voltage signal with the high potential from affecting the potential of the first node N1, improves the stability of the potential of the first node N1, and thus improves the reliability of the shift register.

In the second phase t2, the first node N1 is at the low potential, the second node N2 is at the high potential, and the eighth transistor T8 is in the off state. The fourth auxiliary clock signal provided by the fourth auxiliary clock signal terminal NCLK4 is a high potential signal, and the ninth transistor T9 is in the on state.

In the third phase t3, the first node N1 is at the low potential, the second node N2 is at the high potential, and the eighth transistor T8 is in the off state. The fourth auxiliary clock signal provided by the fourth auxiliary clock signal terminal NCLK4 is a low potential signal, and the ninth transistor T9 is in the off state. The path between the second voltage signal terminal VGH and the first node N1 is blocked by the ninth transistor T9, which prevents the second voltage signal with the high potential from affecting the low potential at the first node N1, improves the stability of the potential of the first node N1, and thus improves the reliability of the shift register.

In the first sub-phase t41 of the fourth phase t4, the first node N1 is at the high potential, the second node N2 is at the low potential, and the eighth transistor T8 is in the on state. The fourth auxiliary clock signal provided by the fourth auxiliary clock signal terminal NCLK4 is at a low potential, the ninth transistor T9 is in the off state, and the path between the second voltage signal terminal VGH and the first node N1 is blocked.

In the second sub-phase t42 of the fourth phase t4, the second node N2 is at the low potential, and the eighth transistor T8 is in the on state. The fourth auxiliary clock signal provided by the fourth auxiliary clock signal terminal NCLK4 is a high potential signal, the ninth transistor T9 is in the on state, and the path between the second voltage signal terminal VGH and the first node N1 is formed; the second voltage signal is transmitted to the first node N1, and the first node N1 is controlled to be at the high potential.

In the third sub-phase t43 of the fourth phase t4, the first node N1 is at the high potential, the second node N2 is at the low potential, and the eighth transistor T8 is in the on state. The fourth auxiliary clock signal provided by the fourth auxiliary clock signal terminal NCLK4 is at a low potential, the ninth transistor T9 is in the off state, and the path between the second voltage signal terminal VGH and the first node N1 is blocked.

As described above, it can be seen that on the basis of normal operation of the ninth transistor T9, it is also possible to effectively prevent the second voltage signal provided by the second voltage signal terminal VGH from affecting the potential of the first node N1, improve the stability of the potential of the first node N1, and thus improve the reliability of the shift register.

For the operation process of other transistors, reference may be made to the above schematic description, and details are not described here.

For the shift register shown in FIG. 17, in some embodiments, the difference from the shift register shown in FIG. 32 includes that a sixth transistor T6 and a seventh transistor T7 are added, the sixth transistor T6 being the oxide transistor. In the embodiments, the shift register includes GATE GOA P and the GATE GOA N. That is, the shift register includes both the first scan signal terminal for controlling the P-type transistor in the pixel circuit and the second scan signal terminal for controlling the N-type transistor in the pixel circuit.

A control electrode of the sixth transistor T6 is coupled to the first node N1, a first electrode of the sixth transistor T6 is coupled to the first voltage signal terminal VGL, and a second electrode of the sixth transistor T6 is coupled to the second scan signal terminal.

A control electrode of the seventh transistor T7 is coupled to the first node N1, a first electrode of the seventh transistor T7 is coupled to the second voltage signal terminal VGH, and a second electrode of the seventh transistor T7 is coupled to the second scan signal terminal.

The sixth transistor T6 is an N-type transistor, and the seventh transistor T7 is a P-type transistor.

As shown in FIGS. 17 and 33, in the first phase t1, the second phase t2 and the third phase t3, the first node N1 is at the low potential, the sixth transistor T6 is in the off state, the seventh transistor T7 is in the on state, and the second voltage signal provided by the second voltage signal terminal VGH is transmitted to the second scan signal terminal, so that the second scan signal output by the second scan signal terminal is a high potential signal. The path between the second scan signal terminal and the first voltage signal terminal VGL is blocked by the sixth transistor T6, which prevents the low potential (VGL) signal of the first voltage signal terminal VGL from affecting the high potential of the second scan signal terminal, so as to maintain the potential of the second scan signal terminal.

In the first sub-phase t41, the second sub-phase t42 and the third sub-phase t43 of the fourth phase t4, the first node N1 is at the high potential, the sixth transistor T6 is in the on state, the seventh transistor T7 is in the off state, and the first voltage signal provided by the first voltage signal terminal VGL is transmitted to the second scan signal terminal, so that the second scan signal output by the second scan signal terminal is a low potential signal.

As described above, the sixth transistor T6 and the seventh transistor T7 can normally control the potential of the second scan signal provided by the second scan signal terminal. At the same time, in the case where the sixth transistor T6 is in the off state, it is possible to effectively prevent the low potential (VGL) signal of the first voltage signal terminal VGL from affecting the high potential of the second scan signal terminal, thereby improving the stability of the potential of the second scan signal terminal, and thus improving the reliability of the shift register.

For the operation process of other transistors, reference may be made to the above schematic description, and details are not described here.

For the shift register shown in FIG. 17, in some embodiments, the difference from the shift register shown in FIG. 32 includes that the fifth transistor T5 is the oxide transistor. A control electrode of the fifth transistor T5 in the embodiments is coupled to the second scan signal terminal.

The fifth transistor T5 is taken as an N-type transistor for description.

As shown in FIGS. 17 and 33, in the first phase t1, the second phase t2 and the third phase t3, the second scan signal provided by the second scan signal terminal is the high potential signal, the fifth transistor T5 is in the on state, the path between the first clock signal terminal CLK1 and the second node N2 is formed, and the first clock signal provided by the first clock signal terminal CLK1 is transmitted to the second node N2.

In the first sub-phase t41, the second sub-phase t42 and the third sub-phase t43 of the fourth phase t4, the second scan signal provided by the second scan signal terminal is the low potential signal, the fifth transistor T5 is in the off state, the path between the first clock signal terminal CLK1 and the second node N2 is blocked, and the first clock signal provided by the first clock signal terminal CLK1 is prevented from affecting the potential of the second node N2.

As described above, while the fifth transistor T5 can operate normally, in the case where the fifth transistor T5 is in the off state, it is also possible to effectively prevent the first clock signal provided by the first clock signal terminal CLK1 from affecting the potential of the second node N2, improve the stability of the potential of the second node N2, and thus improve the reliability of the shift register. In addition, an additional control signal coupled to the control electrode of the fifth transistor T5 can also be reduced, thereby reducing the manufacturing cost of the shift register.

For the operation process of other transistors, reference may be made to the above schematic description, and details are not described here.

Figure 34:
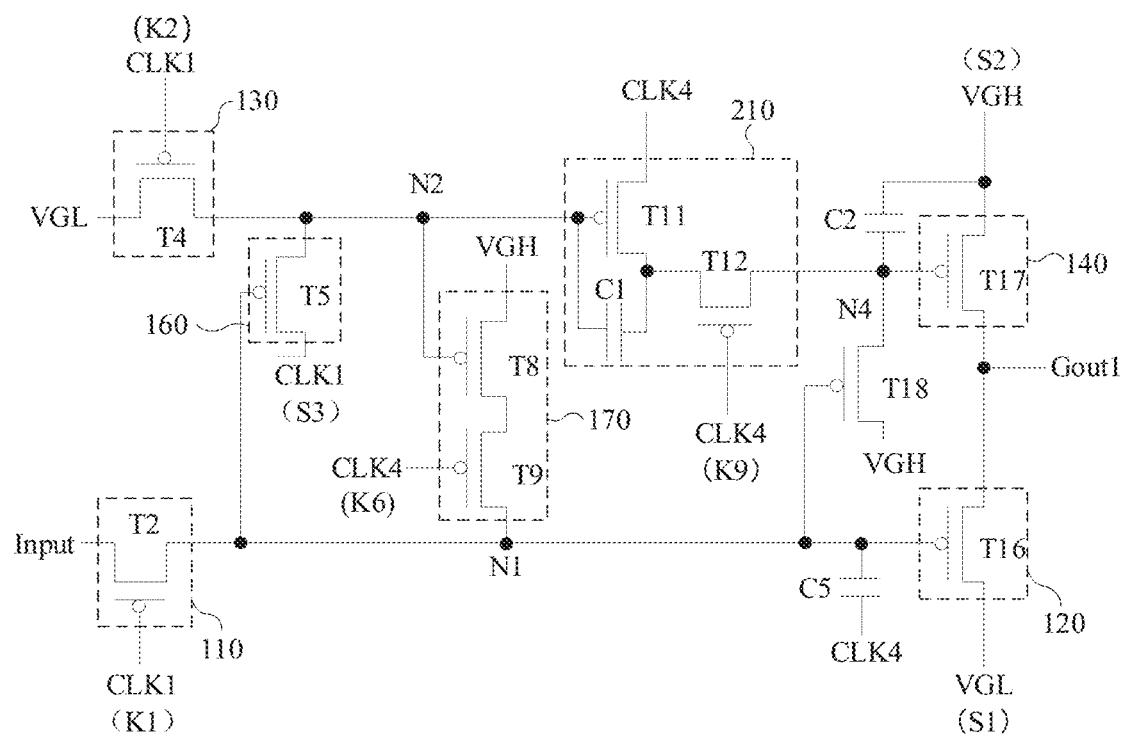
FIG. 34 is a structural diagram of a shift register, in accordance with some embodiments.

As shown in FIG. 34, in some embodiments, the shift register may be a light-emitting scan shift register. The shift register may include a second transistor T2, a fourth transistor T4, a fifth transistor T5, an eighth transistor T8, a ninth transistor T9, an eleventh transistor T11, a twelfth transistor T12, a sixteenth transistor T16, a seventeenth transistor T17, an eighteenth transistor T18, a second capacitor C2, a first capacitor C1, and a fifth capacitor C5.

A control electrode of the second transistor T2 is coupled to the first clock signal terminal CLK1, a first electrode of the second transistor T2 is coupled to the input signal terminal, and a second electrode of the second transistor T2 is coupled to the first node N1.

A control electrode of the fourth transistor T4 is coupled to the first clock signal terminal CLK1, a first electrode of the fourth transistor T4 is coupled to the first voltage signal terminal VGL, and a second electrode of the fourth transistor T4 is coupled to the second node N2.

A control electrode of the fifth transistor T5 is coupled to the first node N1, a first electrode of the fifth transistor T5 is coupled to the first clock signal terminal CLK1, and a second electrode of the fifth transistor T5 is coupled to the second node N2.

A control electrode of the eighth transistor T8 is coupled to the second node N2, a first electrode of the eighth transistor T8 is coupled to the second voltage signal terminal VGH, and a second electrode of the eighth transistor T8 is coupled to a first electrode of the ninth transistor T9.

A control electrode of the ninth transistor T9 is coupled to the fourth clock signal terminal CLK4, and a second electrode of the ninth transistor T9 is coupled to the first node N1.

A control electrode of the eleventh transistor T11 is coupled to the second node N2, a first electrode of the eleventh transistor T11 is coupled to the fourth clock signal terminal CLK4, and a second electrode of the eleventh transistor T11 is coupled to a first electrode of the twelfth transistor T12.

A control electrode of the twelfth transistor T12 is coupled to the fourth clock signal terminal CLK4, and a second electrode of the twelfth transistor T12 is coupled to the fourth node N4.

A control electrode of the sixteenth transistor T16 is coupled to the first node N1, a first electrode of the sixteenth transistor T16 is coupled to the first voltage signal terminal VGL, and a second electrode of the sixteenth transistor T16 is coupled to the first scan signal terminal.

A control electrode of the seventeenth transistor T17 is coupled to the fourth node N4, a first electrode of the seventeenth transistor T17 is coupled to the second voltage signal terminal VGH, and a second electrode of the seventeenth transistor T17 is coupled to the first scan signal terminal.

A control electrode of the eighteenth transistor T18 is coupled to the first node N1, a first electrode of the eighteenth transistor T18 is coupled to the second voltage signal terminal VGH, and a second electrode of the eighteenth transistor T18 is coupled to the fourth node N4.

A first electrode plate of the first capacitor C1 is coupled to the second node N2, and a second electrode plate of the first capacitor C1 is coupled to the first electrode of the twelfth transistor T12.

A first electrode plate of the second capacitor C2 is coupled to the second voltage signal terminal VGH, and a second electrode plate of the second capacitor C2 is coupled to the fourth node N4.

A first electrode plate of the fifth capacitor C5 is coupled to the first node N1, and a second electrode plate of the fifth capacitor C5 is coupled to the fourth clock signal terminal CLK4.

Figure 35:
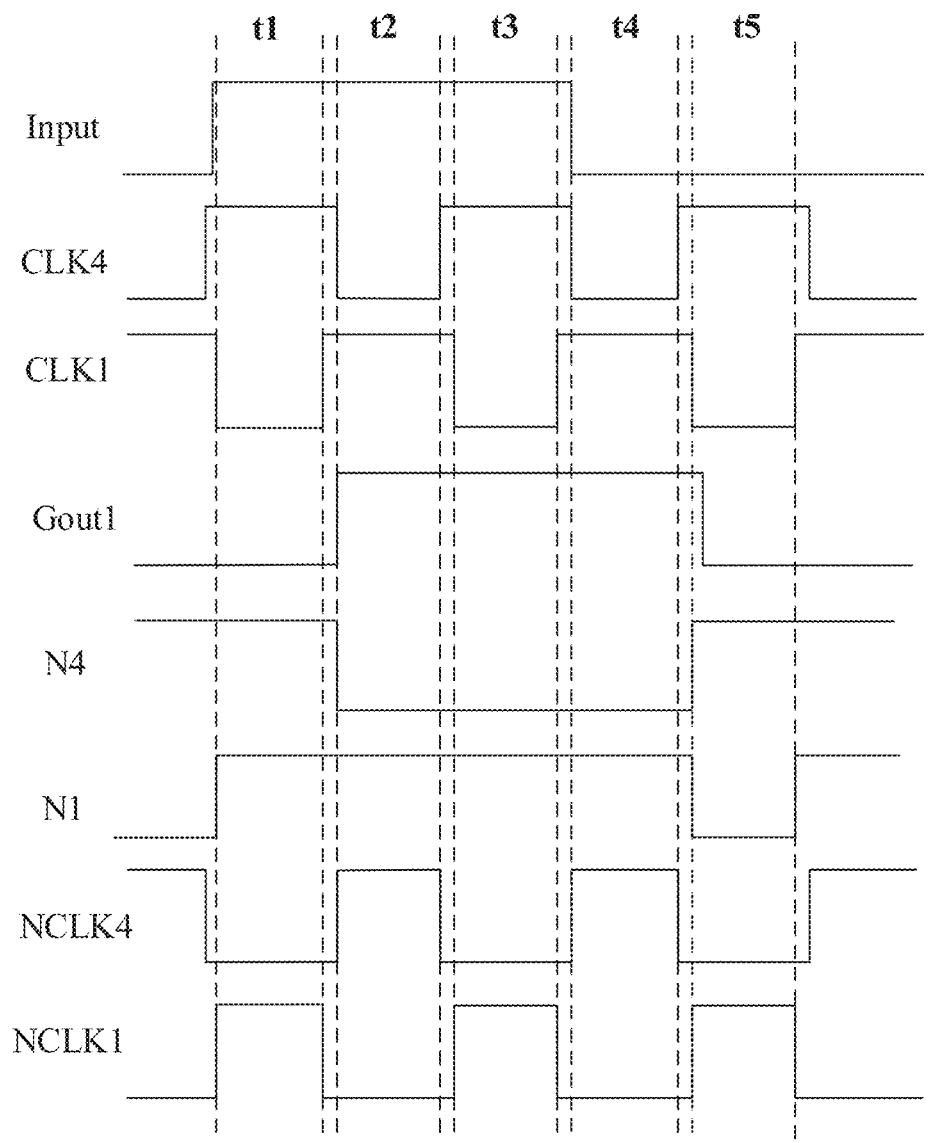
FIG. 35 is a timing diagram of a plurality of signal terminals and a plurality of nodes in the shift register shown in FIG. 34.

As shown in FIG. 35, FIG. 35 includes a timing variation of an input signal provided by the input signal terminal, a timing variation of a first clock signal provided by the first clock signal terminal CLK1, a timing variation of a fourth clock signal provided by the fourth clock signal terminal CLK4, and a timing variation of a first scan signal provided by the first scan signal terminal. In addition, the first voltage signal terminal VGL continuously provides a first voltage signal with a low potential, and the second voltage signal terminal VGH continuously provides a second voltage signal with a high potential. An operation phase in FIG. 35 includes a first phase t1, a second phase t2, a third phase t3, a fourth phase t4, and a fifth phase t5. A buffering phase is further included between two adjacent operation phases.

The second transistor T2, the fourth transistor T4, the fifth transistor T5, the eighth transistor T8, the ninth transistor T9, the eleventh transistor T11, the twelfth transistor T12, the sixteenth transistor T16, the seventeenth transistor T17 and the eighteenth transistor T18 are all taken as P-type transistors for description.

In the first phase t1, the first clock signal provided by the first clock signal terminal CLK1 is a low potential signal, the fourth clock signal provided by the fourth clock signal terminal CLK4 is a high potential signal, and the input signal provided by the input signal terminal is a high potential signal. For example, the input signal is equal to the second voltage signal. Since the first clock signal is the low potential signal, the second transistor T2 is in the on state, and the input signal is transmitted to the first node N1 through the second transistor T2. Therefore, the potential of the first node N1 is equal to the potential of the second voltage signal. The first node N1 is at the high potential, so that the fifth transistor T5, the eighteenth transistor T18, and the sixteenth transistor T16 are all in the off state. The fourth transistor T4 is in the on state, the first voltage signal provided by the first voltage signal terminal VGL is transmitted to the second node N2 through the fourth transistor T4, and the second node N2 is at the low potential (VGL). Since the fourth clock signal is the high potential signal, the ninth transistor T9 and the twelfth transistor T12 are both in the off state; the fourth node N4 maintains the high potential at the previous phase, the seventeenth transistor T17 is in the off state, and the first scan signal terminal maintains the low potential at the previous phase.

In the second phase t2, the first clock signal provided by the first clock signal terminal CLK1 is a high potential signal, the fourth clock signal provided by the fourth clock signal terminal CLK4 is a low potential signal, and the input signal provided by the input signal terminal is a high potential signal. Since the first clock signal is the high potential signal, the second transistor T2 and the fourth transistor T4 are both in the off state. The first node N1 maintains the high potential at the first phase t1, so that the fifth transistor T5, the eighteenth transistor T18 and the sixteenth transistor T16 are all in the off state. The second node N2 maintains the low potential at the first phase t1, and the fourth clock signal is the low potential signal, so that the eighth transistor T8, the ninth transistor T9, the eleventh transistor T11, and the twelfth transistor T12 are all in the on state. In this way, the second voltage signal provided by the second voltage signal terminal VGH is transmitted to the first node N1 through the eighth transistor T8 and the ninth transistor T9, and the first node N1 is controlled to be at a high potential; the fourth clock signal is transmitted to the fourth node N4 through the eleventh transistor T11 and the twelfth transistor T12, and the fourth node N4 is at a low potential (VGL), so that the seventeenth transistor T17 is in the on state; the second voltage signal provided by the second voltage signal terminal VGH is transmitted to the first scan signal terminal, and the first scan signal provided by the first scan signal terminal is a high potential signal.

In the third phase t3, the first clock signal provided by the first clock signal terminal CLK1 is a low potential signal, the fourth clock signal provided by the fourth clock signal terminal CLK4 is a high potential signal, and the input signal provided by the input signal terminal is a high potential signal. Since the first clock signal is the low potential signal, the second transistor T2 is in the on state, and the input signal is transmitted to the first node N1 through the second transistor T2. Therefore, the potential of the first node N1 is equal to the potential of the second voltage signal. The first node N1 is at the high potential, so that the fifth transistor T5, the eighteenth transistor T18, and the sixteenth transistor T16 are all in the off state. The fourth transistor T4 is in the on state, the first voltage signal is transmitted to the second node N2 through the fourth transistor T4, and the potential of the second node N2 is equal to the potential of the first voltage signal. Since the fourth clock signal is the high potential signal, the ninth transistor T9 and the twelfth transistor T12 are both in the off state; the fourth node N4 maintains the low potential at the second phase t2, the seventeenth transistor T17 is in the on state, the second voltage signal provided by the second voltage signal terminal VGH is transmitted to the first scan signal terminal, and the first scan signal provided by the first scan signal terminal is the high potential signal.

In the fourth phase t4, the first clock signal provided by the first clock signal terminal CLK1 is a high potential signal, the fourth clock signal provided by the fourth clock signal terminal CLK4 is a low potential signal, and the input signal provided by the input signal terminal is a low potential signal. Since the first clock signal is the high potential signal, the second transistor T2 and the fourth transistor T4 are both in the off state. The first node N1 maintains the high potential at the third phase t3, so that the fifth transistor T5, the eighteenth transistor T18, and the sixteenth transistor T16 are all in the off state. The second node N2 maintains the low potential at the third phase t3, and the fourth clock signal is the low potential signal, so that the eighth transistor T8, the ninth transistor T9, the eleventh transistor T11, and the twelfth transistor T12 are all in the on state. In this way, the second voltage signal provided by the second voltage signal terminal VGH is transmitted to the first node N1 through the eighth transistor T8 and the ninth transistor T9, and the first node N1 is controlled to be at a high potential; the fourth clock signal is transmitted to the fourth node N4 through the eleventh transistor T11 and the twelfth transistor T12, and the fourth node N4 is at a low potential (VGL), so that the seventeenth transistor T17 is in the on state; the second voltage signal provided by the second voltage signal terminal VGH is transmitted to the first scan signal terminal, and the first scan signal provided by the first scan signal terminal is a high potential signal.

In the fifth phase t5, the first clock signal provided by the first clock signal terminal CLK1 is a low potential signal, the fourth clock signal provided by the fourth clock signal terminal CLK4 is a high potential signal, and the input signal provided by the input signal terminal is a low potential signal. Since the first clock signal is the low potential signal, the second transistor T2 and the fourth transistor T4 are both in the on state. The input signal is transmitted to the first node N1 through the second transistor T2, so that the potential of the first node N1 is equal to the potential of the first voltage signal. The first node N1 is at the low potential, and the fifth transistor T5, the eighteenth transistor T18 and the sixteenth transistor T16 are all in the on state. The second voltage signal is transmitted to the fourth node N4 through the eighteenth transistor T18, and the potential of the fourth node N4 is equal to the potential of the second voltage signal. The fourth node N4 is at the high potential, so that the seventeenth transistor T17 is in the off state. The first voltage signal is transmitted to the first scan signal terminal through the sixteenth transistor T16, and the first scan signal provided by the first scan signal terminal is a low potential signal.

For the shift register shown in FIG. 24, in some embodiments, the difference from the shift register shown in FIG. 34 includes that the first transistor T1 is added, and the first transistor T1 includes the oxide transistor. The first transistor T1 is coupled in series between the second node N2 and the first clock signal terminal CLK1. For example, the first transistor T1 is coupled in series between the second node N2 and the fifth transistor T5. For another example, the first transistor T1 is coupled in series between the fifth transistor T5 and the first clock signal terminal CLK1. In addition, a control electrode of the first transistor T1 is coupled to the fourth node N4.

The first transistor T1 is taken as an N-type transistor for description.

As shown in FIGS. 24 and 35, in the first phase t1, the first node N1 is at the high potential, the second node N2 is at the low potential, and the fifth transistor T5 is in the off state. The fourth node N4 is at the high potential, the first transistor T1 is in the on state, and the first clock signal used as the low potential signal does not affect the low potential at the second node N2.

In the second phase t2, the first node N1 is at the high potential, the second node N2 is at the low potential, and the fifth transistor T5 is in the off state. The fourth node N4 is at the low potential, the first transistor T1 is in the off state, and the path between the first clock signal terminal CLK1 and the second node N2 is blocked, which prevents the first clock signal as the high potential signal from affecting the low potential of the second node N2, and maintains the stability of the potential of the second node N2.

In the third phase t3, the first node N1 is at the high potential, the second node N2 is at the low potential, and the fifth transistor T5 is in the off state. The fourth node N4 is at the low potential, the first transistor T1 is in the off state, the path between the first clock signal terminal CLK1 and the second node N2 is blocked, and the stability of the potential of the second node N2 is maintained.

In the fourth phase t4, the first node N1 is at the high potential, the second node N2 is at the low potential, and the fifth transistor T5 is in the off state. The fourth node N4 is at the low potential, the first transistor T1 is in the off state, and the path between the first clock signal terminal CLK1 and the second node N2 is blocked, which prevents the first clock signal as the high potential signal from affecting the low potential of the second node N2, and maintains the stability of the potential of the second node N2.

In the fifth phase t5, the first node N1 is at the low potential, the second node N2 is at the low potential, and the fifth transistor T5 is in the on state. The fourth node N4 is at the high potential, the first transistor T1 is in the on state, and the path between the first clock signal terminal CLK1 and the second node N2 is formed, so that the first clock signal as the low potential signal is transmitted to the second node N2 through the first transistor T1 and the fifth transistor T5, and the second node N2 is controlled to be at a low potential.

As described above, it can be seen from the fact that the first transistor T1 is coupled in series between the second node N2 and the first clock signal terminal CLK1, on the basis of the normal operation of the first control circuit 160, it is also possible to effectively prevent the first clock signal provided by the first clock signal terminal CLK1 from affecting the potential of the second node N2, improve the stability of the potential of the second node N2, and thus improve the reliability of the shift register.

For the operation process of other transistors, reference may be made to the above schematic description, and details are not described here.

Figure 36:
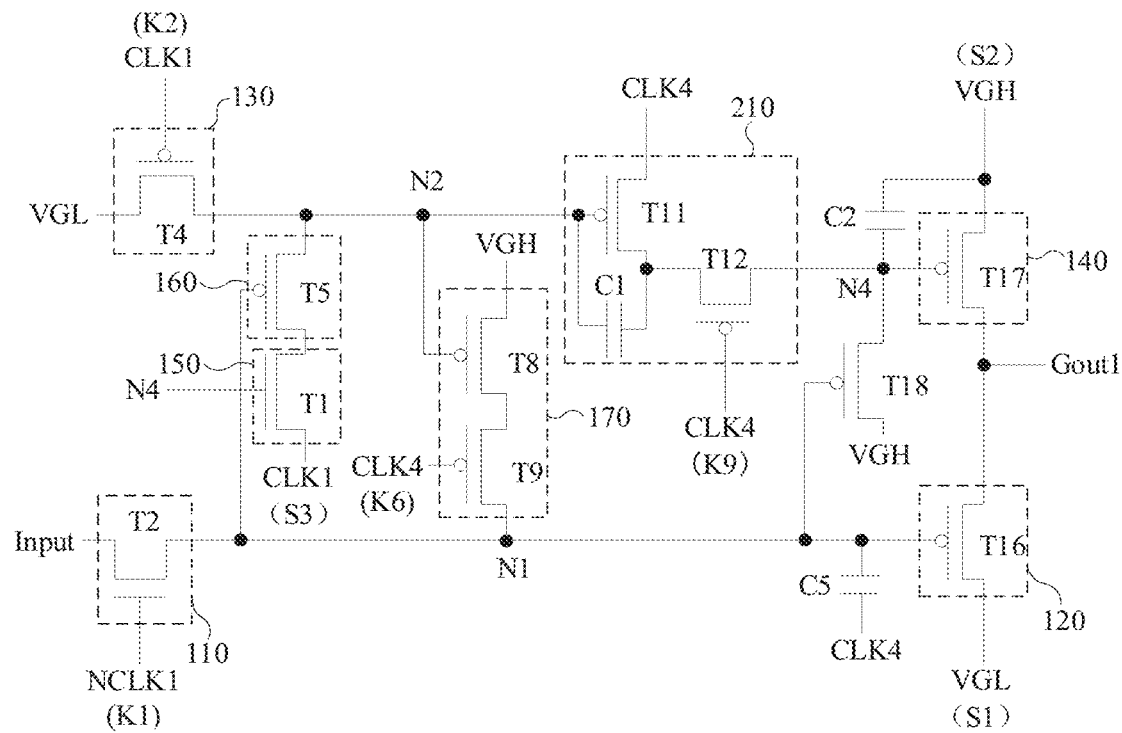
FIG. 36 is a structural diagram of a shift register, in accordance with some embodiments.

For the shift register shown in FIG. 36, in some embodiments, the difference from the shift register shown in FIG. 34 includes that the second transistor T2 is the oxide transistor. A control electrode of the second transistor T2 in the embodiments is coupled to the first auxiliary clock signal terminal NCLK1.

The second transistor T2 is taken as an N-type transistor for description.

As shown in FIGS. 35 and 36, in the first phase t1 and the third phase t3, the first auxiliary clock signal provided by the first auxiliary clock signal terminal NCLK1 is a high potential signal, and the second transistor T2 is in the on state; the input signal provided by the input signal terminal is at the high potential, and the input signal is transmitted to the first node N1 through the second transistor T2.

In the second phase t2 and the fourth phase t4, the first auxiliary clock signal provided by the first auxiliary clock signal terminal NCLK1 is a low potential signal, the second transistor T2 is in the off state, and the path between the input signal terminal and the first node N1 is blocked by the second transistor T2. In the fourth phase t4, the input signal is the low potential signal, and the first node N1 is at the high potential. The second transistor T2 blocks the path between the input signal terminal and the first node N1, which may prevent the input signal as the low potential signal from affecting the high potential at the first node N1, improve the stability of the potential of the first node N1, and thus improve the reliability of the shift register.

In the fifth phase t5, the first auxiliary clock signal provided by the first auxiliary clock signal terminal NCLK1 is a high potential signal, and the second transistor T2 is in the on state; the input signal provided by the input signal terminal is a low potential; the path between the input signal terminal and the first node N1 is formed, and the input signal is transmitted to the first node N1 through the second transistor T2.

As described above, it can be seen form the fact that the second transistor T2 is used as the oxide transistor, on the basis of the normal operation of the first input circuit 110, it is also possible to effectively prevent the input signal provided by the input signal terminal from affecting the potential of the first node N1, improve the stability of the potential of the first node N1, and thus improve the reliability of the shift register.

For the operation process of other transistors, reference may be made to the above schematic description, and details are not described here.

Figure 37:
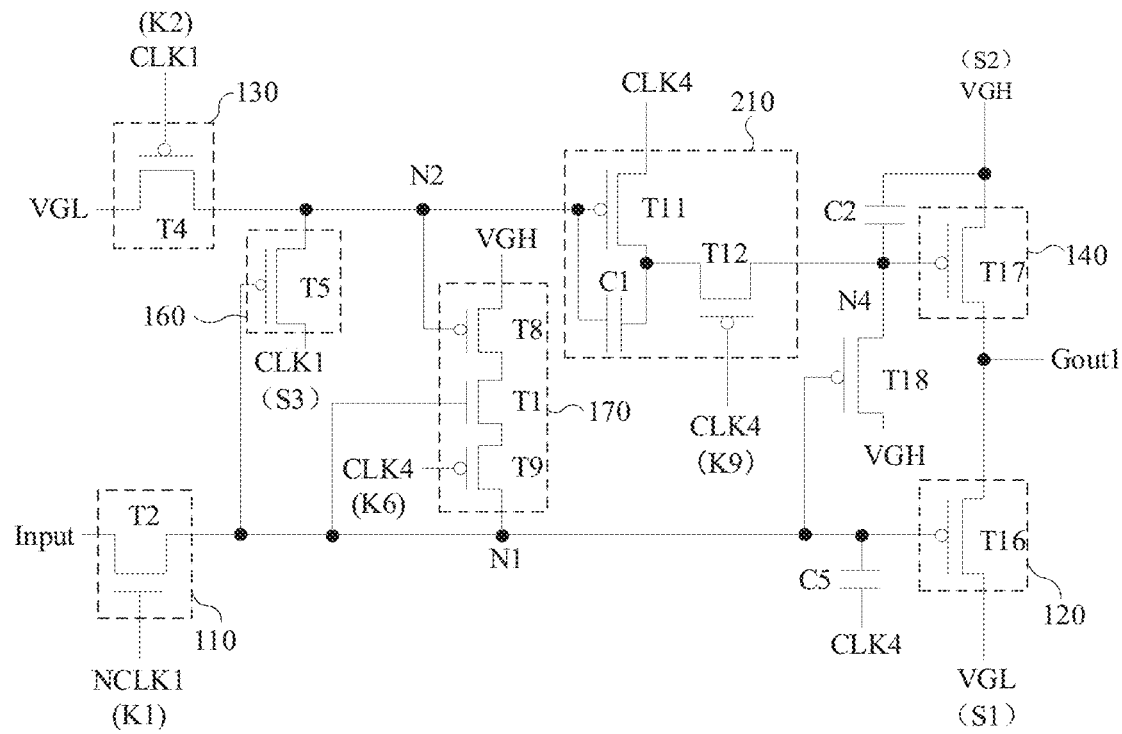
FIG. 37 is a structural diagram of a shift register, in accordance with some embodiments.

In some embodiments, compared with the shift register shown in FIG. 34, in the shift register shown in FIG. 37, the first transistor T1 is added, and the first transistor T1 includes the oxide transistor. The first transistor T1 is coupled in series between the second voltage signal terminal VGH and the first node N1, and the control electrode of the first transistor T1 is coupled to the first node N1. For the first transistor T1 coupled in series between the second voltage signal terminal VGH and the first node N1, there may be a plurality of series positions, which have been described above in detail and will not be described in detail here.

The description is made by taking a case where the first transistor T1 is an N-type transistor, and the first transistor T1 is located between the eighth transistor T8 and the ninth transistor T9.

As shown in FIGS. 35 and 37, in the first phase t1 and the third phase t3, the first node N1 is at the high potential, and the first transistor T1 is in the on state; the fourth clock signal provided by the fourth clock signal terminal CLK4 is the high potential signal, and the ninth transistor T9 is in the off state; the second node N2 is at the low potential, and the eighth transistor T8 is in the on state. The second voltage signal as the high potential signal does not affect the high potential at the first node N1.

In the second phase t2 and the fourth phase t4, the first node N1 is at the high potential, and the first transistor T1 is in the on state; the fourth clock signal provided by the fourth clock signal terminal CLK4 is the low potential signal, and the ninth transistor T9 is in the on state; the second node N2 is at the low potential, and the eighth transistor T8 is in the on state. The second voltage signal as the high potential signal does not affect the high potential at the first node N1. The second voltage signal as the high potential signal is transmitted to the first node N1 through the eighth transistor T8, the first transistor T1, and the ninth transistor T9, and the first node N1 is controlled to be at the high potential.

In the fifth phase t5, the first node N1 is at the low potential, and the first transistor T1 is in the off state; the fourth clock signal provided by the fourth clock signal terminal CLK4 is the high potential signal, and the ninth transistor T9 is in the off state; the second node N2 is at the low potential, and the eighth transistor T8 is in the on state. The first transistor T1 blocks the path between the second voltage signal terminal and the first node N1, which prevents the second voltage signal as the high potential from affecting the low potential at the first node N1, improves the stability of the potential of the first node N1, and thus improves the reliability of the shift register.

As described above, it can be seen from the fact that the first transistor T1 is coupled in series between the first node N1 and the second voltage signal terminal VGH, on the basis of the normal operation of the noise reduction circuit 170, it is possible to effectively prevent the second voltage signal provided by the second voltage signal terminal VGH from affecting the potential of the first node N1, improve the stability of the potential of the first node N1, and thus improve the reliability of the shift register.

For the operation process of other transistors, reference may be made to the above schematic description, and details are not described here.

Figure 38:
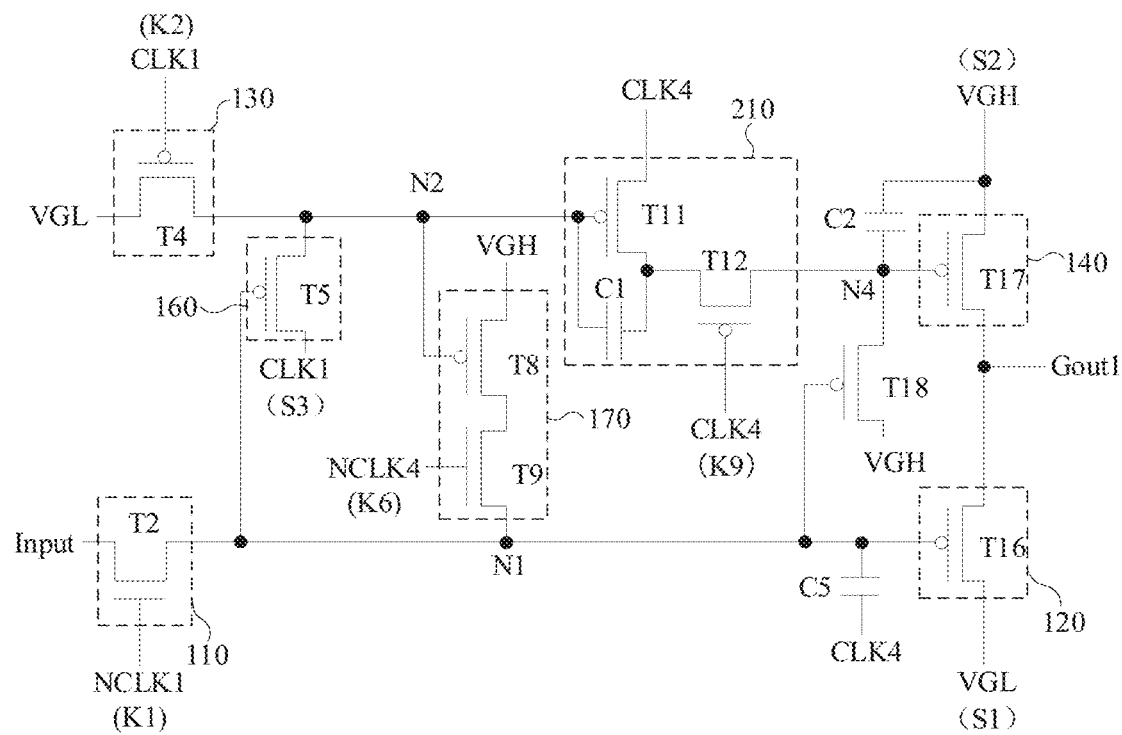
FIG. 38 is a structural diagram of a shift register, in accordance with some embodiments.

As shown in FIG. 38, in some embodiments, the ninth transistor T9 may be the oxide transistor. The difference from the ninth transistor T9 in FIG. 34 is that the control electrode of the ninth transistor T9 is coupled to the fourth auxiliary clock signal terminal NCLK4.

The ninth transistor T9 is taken as an N-type transistor for description.

As shown in FIGS. 35 and 38, in the first phase t1 and the third phase t3, the first node N1 is at the high potential, the second node N2 is at the low potential, and the eighth transistor T8 is in the on state. The fourth auxiliary clock signal provided by the fourth auxiliary clock signal terminal NCLK4 is a low potential signal, the ninth transistor T9 is in the off state, and the path between the second voltage signal terminal VGH and the first node N1 is blocked.

In the second phase t2 and the fourth phase t4, the second node N2 is at the low potential, and the eighth transistor T8 is in the on state. The fourth auxiliary clock signal provided by the fourth auxiliary clock signal terminal NCLK4 is a high potential signal, the ninth transistor T9 is in the on state, and the path between the second voltage signal terminal VGH and the first node N1 is formed; the second voltage signal is transmitted to the first node through the eighth transistor T8 and the ninth transistor T9, and the first node N1 is controlled to be at a high potential.

In the fifth phase t5, the first node N1 is at the low potential, the second node N2 is at the low potential, and the eighth transistor T8 is in the on state. The fourth auxiliary clock signal provided by the fourth auxiliary clock signal terminal NCLK4 is a low potential signal, the ninth transistor T9 is in the off state, and the ninth transistor T9 blocks the path between the second voltage signal terminal VGH and the first node N1. As a result, it is possible to prevent the second voltage signal as the high potential signal from affecting the low potential at the first node N1, improve the stability of the potential of the first node N1, and thus improve the reliability of the shift register.

As described above, it can be seen that, due to the ninth transistor T9 as the oxide transistor, on the basis of the normal operation of the noise reduction circuit 170, it is also possible to effectively prevent the second voltage signal provided by the second voltage signal terminal VGH from affecting the potential of the first node N1, improve the stability of the potential of the first node N1, and thus improve the reliability of the shift register.

For the operation process of other transistors, reference may be made to the above schematic description, and details are not described here.

For the shift register shown in FIG. 25, in some embodiments, the difference from the shift register shown in FIG. 34 includes that the twelfth transistor T12 is the oxide transistor. A control electrode of the twelfth transistor T12 is coupled to the fourth auxiliary clock signal terminal NCLK4.

The following is described by taking the twelfth transistor T12 as an N-type transistor.

As shown in FIGS. 25 and 35, in the first phase t1, the third phase t3 and the fifth phase t5, the second node N2 is at the low potential, and the eleventh transistor T11 is in the on state. The fourth auxiliary clock signal provided by the fourth auxiliary clock signal terminal NCLK4 is a low potential signal, the twelfth transistor T12 is in the off state, and the path between the fourth clock signal terminal CLK4 and the fourth node N4 is blocked. In the first phase t1 and the third phase t3, the path between the fourth clock signal terminal CLK4 and the fourth node N4 is blocked, which prevents the second voltage signal as the high potential signal from affecting the low potential at the fourth node N4.

In the second phase t2 and the fourth phase t4, the second node N2 is at the low potential, and the eleventh transistor T11 is in the on state. The fourth auxiliary clock signal provided by the fourth auxiliary clock signal terminal NCLK4 is a high potential signal, and the twelfth transistor T12 is in the on state; the path between the fourth clock signal terminal CLK4 and the fourth node N4 is formed, and the fourth clock signal as a low potential signal is transmitted to the fourth node N4 to control the fourth node N4 to be at the low potential.

As described above, it can be seen from the fact that the twelfth transistor T12 includes the oxide transistor, on the basis of the normal operation of the second control circuit 210, it is also possible to effectively prevent the fourth clock signal provided by the fourth clock signal terminal CLK4 from affecting the potential of the fourth node N4, improve the stability of the potential of the fourth node N4, and thus improve the reliability of the shift register.

For the operation process of other transistors, reference may be made to the above schematic description, and details are not described here.

Figure 39:
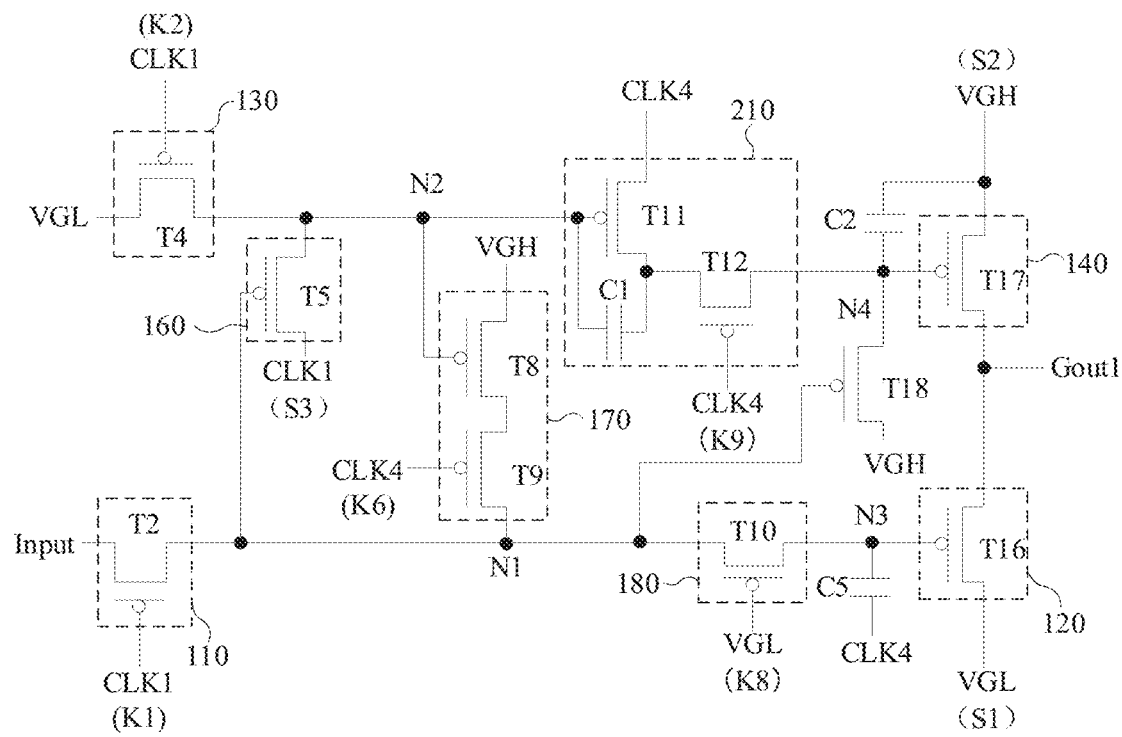
FIG. 39 is a structural diagram of a shift register, in accordance with some embodiments.

For the shift register shown in FIG. 39, in some embodiments, the difference from the shift register shown in FIG. 34 includes that the tenth transistor T10 is added. A control electrode of the tenth transistor T10 is coupled to the first voltage signal terminal VGL, a first electrode of the tenth transistor T10 is coupled to the first node N1, and a second electrode of the tenth transistor T10 is coupled to the third node N3.

The following is described by taking the tenth transistor T10 as a P-type transistor.

As shown in FIGS. 35 and 39, in the first phase t1 to the fourth phase t4, the first node N1 is at the high potential, and the tenth transistor T10 is in the on state; the path between the first node N1 and the third node N3 is formed, and a potential change of the third node N3 is the same as a potential change of the first node N1.

Figure 40:
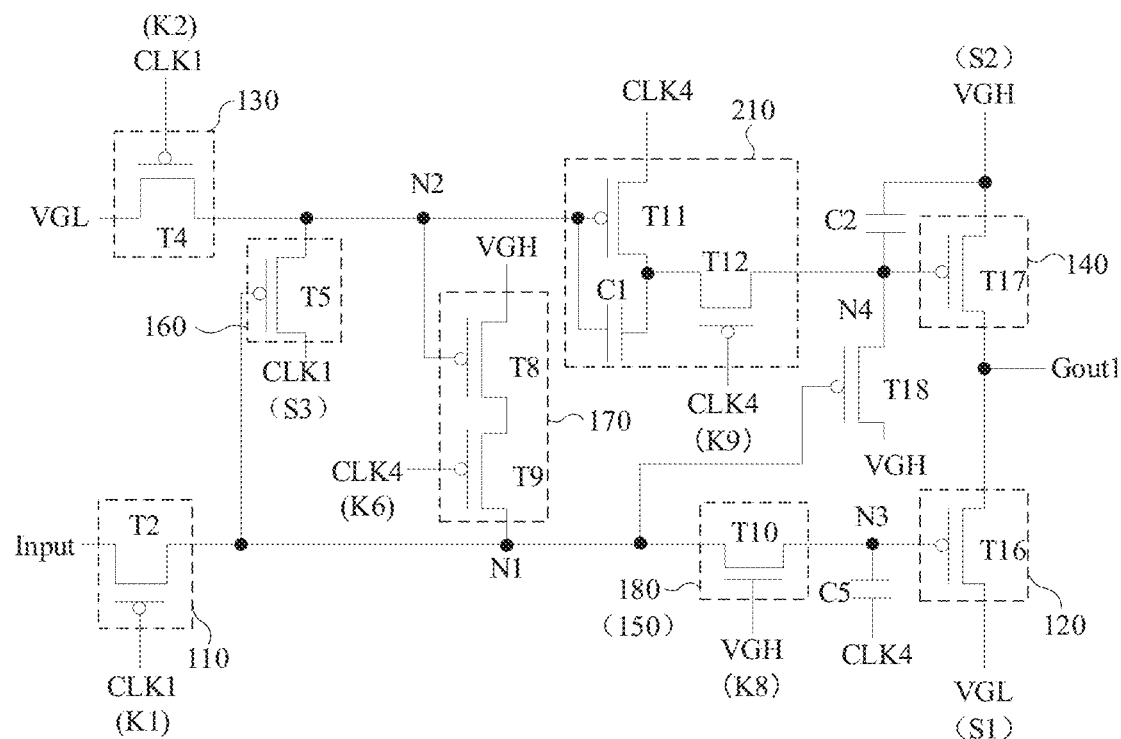
FIG. 40 is a structural diagram of a shift register, in accordance with some embodiments.

As shown in FIG. 40, in some embodiments, the tenth transistor T10 is the oxide transistor. The difference from the tenth transistor T10 in FIG. 39 is that the control electrode of the tenth transistor T10 is coupled to the second voltage signal terminal VGH.

The operation process of the tenth transistor T10 in FIG. 40 may refer to the description of the tenth transistor T10 in FIG. 39, and details are not described here.

For the operation process of other transistors, reference may be made to the above schematic description, and details are not described here.

For the shift register shown in FIG. 27, in some embodiments, the difference from the shift register shown in FIG. 34 includes that the thirteenth transistor T13 is added. The thirteenth transistor T13 is coupled in series between the second node N2 and the fifth node N5. In an example where the thirteenth transistor T13 is a P-type transistor, and a control electrode of the thirteenth transistor T13 is coupled to the first voltage signal terminal VGL.

The thirteenth transistor T13 is taken as the P-type transistor for description.

As shown in FIGS. 27 and 35, in the first phase t1, the third phase t3 and the fifth phase t5, the second node N2 is at the low potential, the thirteenth transistor T13 is in the on state, and the path between the second node N2 and the fifth node N5 is formed, so that the fifth node N5 is at the low potential. The eleventh transistor T11 is in the on state, and the path between the fourth clock signal terminal CLK4 and the first electrode plate of the first capacitor is formed; the first electrode plate of the first capacitor is at a high potential, and the second electrode plate of the first capacitor (i.e., the fifth node N5) is at a low potential.

In the second phase t2 and the fourth phase t4, the second node N2 is at the low potential, and the eleventh transistor T11 is in the on state; the fourth clock signal provided by the fourth clock signal terminal CLK4 is converted from a high potential signal to a low potential signal, so that the first electrode plate of the first capacitor is at a low potential. Due to the bootstrap action of the first capacitor, the potential of the second electrode plate of the first capacitor (i.e., the fifth node N5) is further reduced, and the thirteenth transistor T13 is in the off state and the eleventh transistor T11 is better turned on.

For the shift register shown in FIG. 28, in some embodiments, the difference from the shift register shown in FIG. 27 includes that the thirteenth transistor T13 includes the oxide transistor. In an example where the thirteenth transistor T13 is an N-type transistor, the control electrode of the thirteenth transistor T13 is coupled to the second voltage signal terminal VGH. In the embodiments, the operation process of the thirteenth transistor T13 is substantially the same as the operation process of the thirteenth transistor T13 in the shift register in FIG. 27. In addition, when the thirteenth transistor T13 is in the off state in the second phase t2 and the fourth phase t4, the path between the second node N2 and the fifth node N5 can be blocked, which prevents the second node N2 of a relatively high potential from affecting a relatively low potential of the fifth node N5, and maintain the stability of the potential of the fifth node N5.

For the operation process of other transistors, reference may be made to the above schematic description, and details are not described here.

Figure 41:
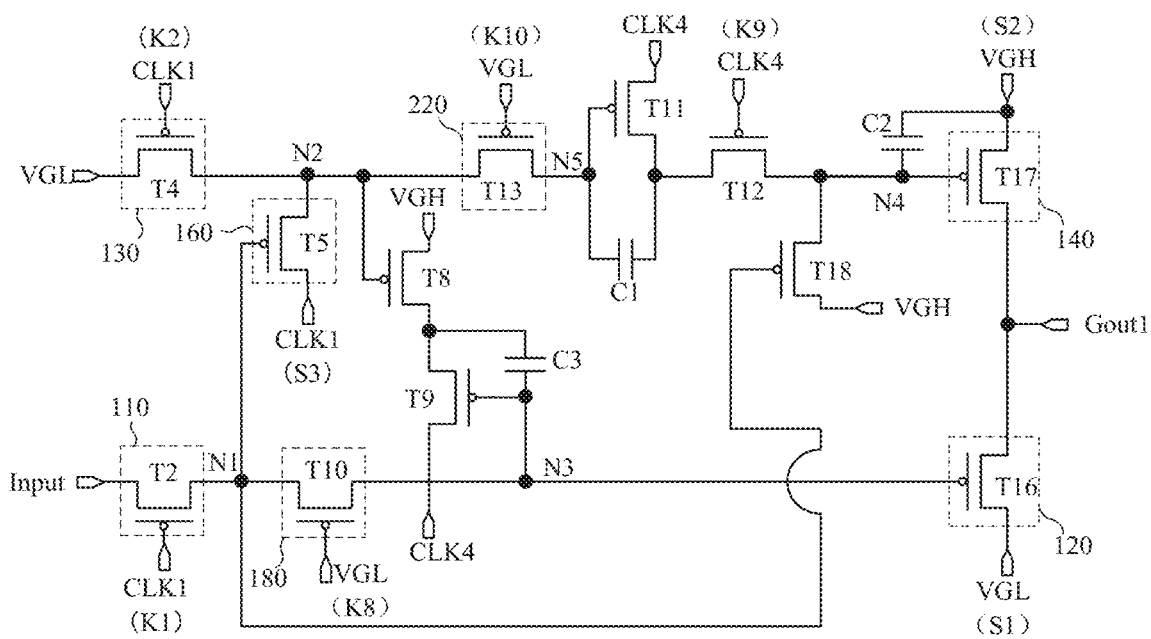
FIG. 41 is a structural diagram of a shift register, in accordance with some embodiments.

As shown in FIG. 41, in some embodiments, the shift register may be a light-emitting scan shift register or a GATE GOA N. The shift register may include a second transistor T2, a fourth transistor T4, a fifth transistor T5, an eighth transistor T8, a ninth transistor T9, a tenth transistor T10, an eleventh transistor T11, a twelfth transistor T12, a sixteenth transistor T16, a seventeenth transistor T17, an eighteenth transistor T18, a first capacitor C1, a second capacitor C2, and a third capacitor C3.

A control electrode of the second transistor T2 is coupled to the first clock signal terminal CLK1, a first electrode of the second transistor T2 is coupled to the input signal terminal Input, and a second electrode of the second transistor T2 is coupled to the first node N1.

A control electrode of the fourth transistor T4 is coupled to the first clock signal terminal CLK1, a first electrode of the fourth transistor T4 is coupled to the first voltage signal terminal VGL, and a second electrode of the fourth transistor T4 is coupled to the second node N2.

A control electrode of the fifth transistor T5 is coupled to the first node N1, a first electrode of the fifth transistor T5 is coupled to the first clock signal terminal CLK1, and a second electrode of the fifth transistor T5 is coupled to the second node N2.

A control electrode of the eighth transistor T8 is coupled to the second node N2, a first electrode of the eighth transistor T8 is coupled to the second voltage signal terminal VGH, and a second electrode of the eighth transistor T8 is coupled to a first electrode plate of the third capacitor.

A control electrode of the ninth transistor T9 is coupled to the third node N3, a first electrode of the ninth transistor T9 is coupled to the fourth clock signal terminal CLK4, and a second electrode of the ninth transistor T9 is coupled to the first electrode plate of the third capacitor.

A control electrode of the tenth transistor T10 is coupled to the first voltage signal terminal VGL, a first electrode of the tenth transistor T10 is coupled to the first node N1, and a second electrode of the tenth transistor T10 is coupled to the third node N3.

A control electrode of the eleventh transistor T11 is coupled to the second node N2, a first electrode of the eleventh transistor T11 is coupled to the fourth clock signal terminal CLK4, and a second electrode of the eleventh transistor T11 is coupled to a first electrode of the twelfth transistor T12.

A control electrode of the twelfth transistor T12 is coupled to the fourth clock signal terminal CLK4, and a second electrode of the twelfth transistor T12 is coupled to the fourth node N4.

A control electrode of the sixteenth transistor T16 is coupled to the third node N3, a first electrode of the sixteenth transistor T16 is coupled to the first voltage signal terminal VGL, and a second electrode of the sixteenth transistor T16 is coupled to the first scan signal terminal.

A control electrode of the seventeenth transistor T17 is coupled to the fourth node N4, a first electrode of the seventeenth transistor T17 is coupled to the second voltage signal terminal VGH, and a second electrode of the seventeenth transistor T17 is coupled to the first scan signal terminal.

A control electrode of the eighteenth transistor T18 is coupled to the first node N1, a first electrode of the eighteenth transistor T18 is coupled to the second voltage signal terminal VGH, and a second electrode of the eighteenth transistor T18 is coupled to the fourth node N4.

A first electrode plate of the first capacitor is coupled to the second node N2, and a second electrode plate of the first capacitor is coupled to the first electrode of the twelfth transistor T12.

A first electrode plate of the second capacitor is coupled to the second voltage signal terminal VGH, and a second electrode plate of the second capacitor is coupled to the fourth node N4.

A second electrode plate of the third capacitor is coupled to the third node N3.

Figure 42:
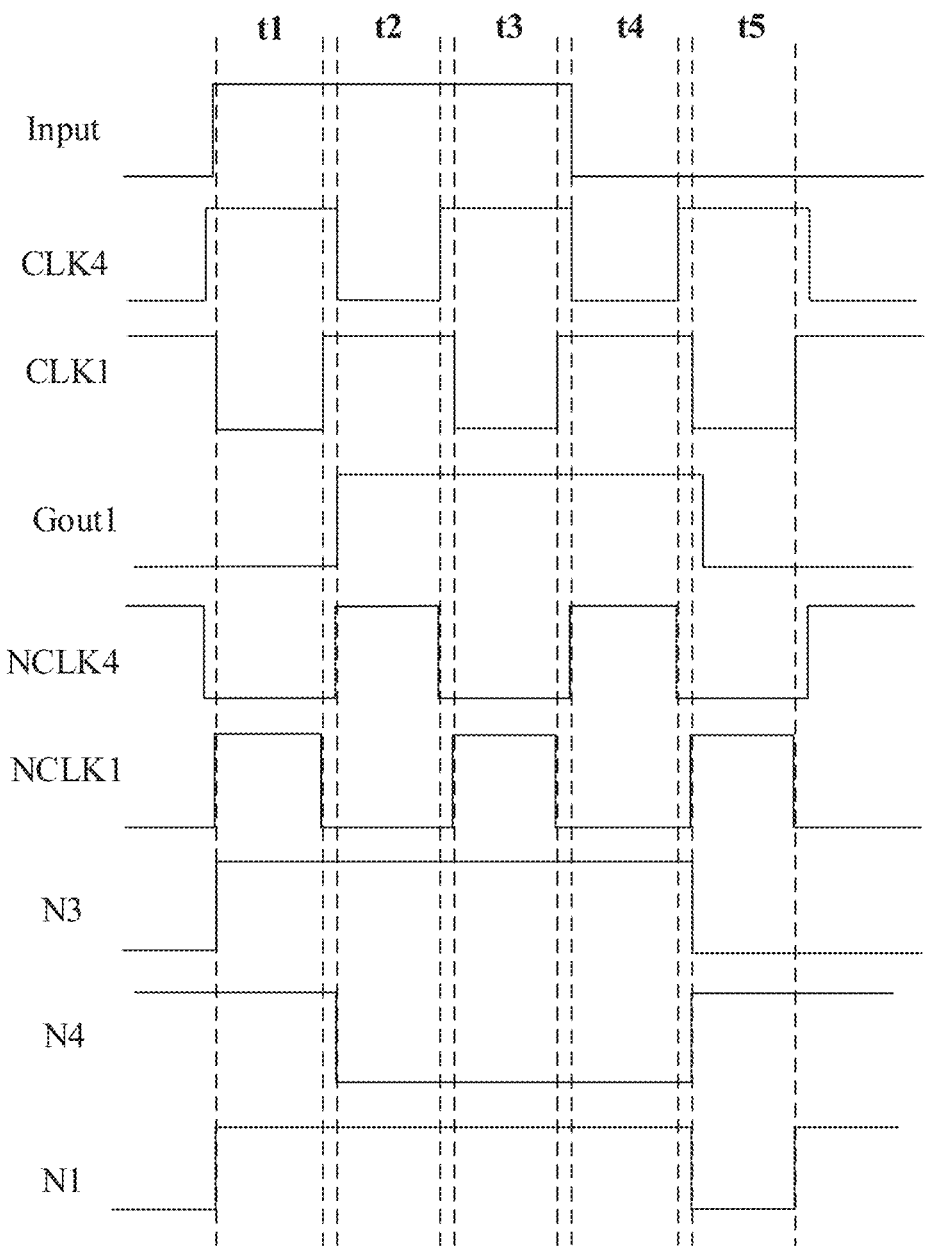
FIG. 42 is a timing diagram of a plurality of signal terminals and a plurality of nodes in the shift register shown in FIG. 41.

As shown in FIG. 42, FIG. 42 includes a timing of an input signal provided by the input signal terminal, a timing of a first clock signal provided by the first clock signal terminal CLK1, a timing of a fourth clock signal provided by the fourth clock signal terminal CLK4, and a timing of a first scan signal provided by the first scan signal terminal. In addition, the first voltage signal terminal VGL continuously provides a first voltage signal with a low potential, and the second voltage signal terminal VGH continuously provides a second voltage signal with a high potential. An operation phase in FIG. 42 includes a first phase t1, a second phase t2, a third phase t3, a fourth phase t4, and a fifth phase t5. A buffering phase is further included between two adjacent operation phases.

The operation processes of the plurality of transistors and the plurality of circuit nodes in the shift register in the embodiments are substantially similar to the operation processes of the plurality of transistors and the plurality of circuit nodes in the shift register shown in FIG. 34, and the difference includes a different influence of the ninth transistor T9 and the third capacitor on the first node N1, which is described below with respect to the difference.

In the first phase t1, the second phase t2, the third phase t3 and the fourth phase t4, the second node N2 is at a low potential, and the third node N3 is at a high potential. The ninth transistor T9 is in the off state, and the eighth transistor T8 is in the on state; the path between the second voltage signal terminal VGH and the first electrode plate of the third capacitor is formed, the second voltage signal as a high potential signal is transmitted to the first electrode plate of the third capacitor, and the first electrode plate of the third capacitor and the second electrode plate of the third capacitor are both at high potentials.

In the fifth phase t5, the second node N2 is at a low potential, the third node N3 is at a low potential, and the fifth transistor T5 is turned on. The eighth transistor T8 is in the on state, the path between the second voltage signal terminal VGH and the first electrode plate of the third capacitor is formed, and the second voltage signal as the high potential signal is transmitted to the first electrode plate of the third capacitor; the ninth transistor T9 is in the on state, the path between the fourth clock signal terminal CLK4 and the first electrode plate of the third capacitor is formed, and the fourth clock signal as the high potential signal is transmitted to the first electrode plate of the third capacitor, thereby maintaining the stability of the low potential of the second electrode plate.

Figure 43:
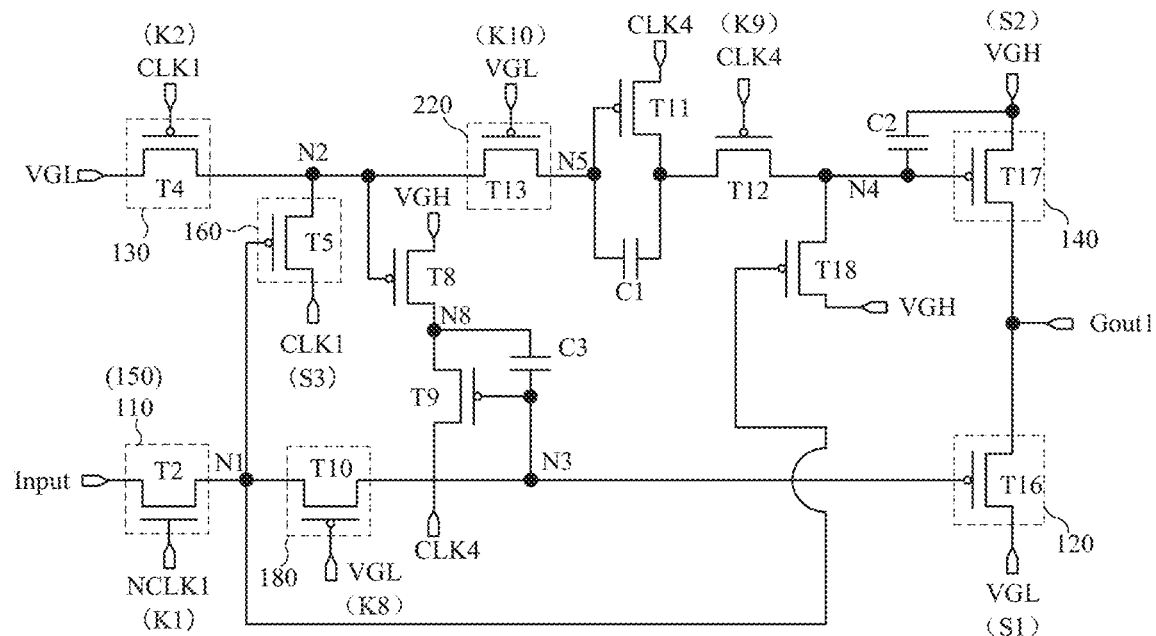
FIG. 43 is a structural diagram of a shift register, in accordance with some embodiments.

For the shift register shown in FIG. 43, in some embodiments, the difference from the shift register shown in FIG. 41 includes that the second transistor T2 is the oxide transistor. The connection relationship of the second transistor T2 is the same as the connection relationship of the second transistor T2 in FIG. 36, and the operation states of the second transistors T2 in the above phases are substantially the same, which can play the same role and will not be repeated here.

Figure 44:
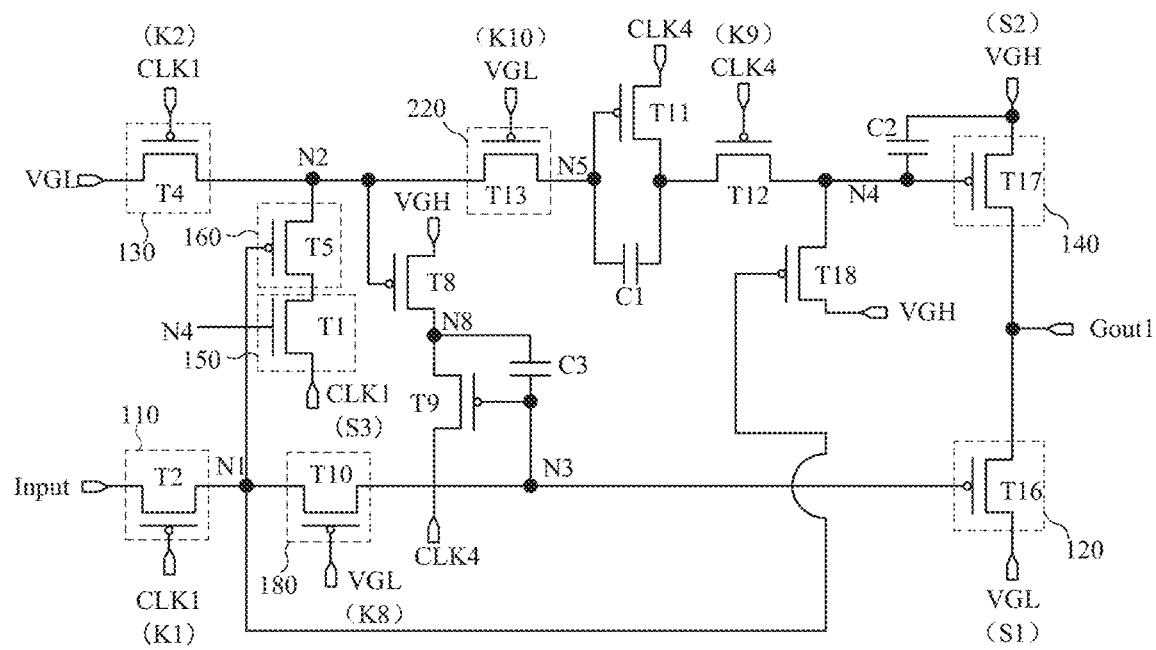
FIG. 44 is a structural diagram of a shift register, in accordance with some embodiments.

For the shift register shown in FIG. 44, in some embodiments, the difference from the shift register shown in FIG. 41 includes that the first transistor T1 is added, and the first transistor T1 includes the oxide transistor. The first transistor T1 is coupled in series between the second node N2 and the first clock signal terminal CLK1. For example, the first transistor T1 is coupled in series between the second node N2 and the fifth transistor T5. For another example, the first transistor T1 is coupled in series between the fifth transistor T5 and the first clock signal terminal CLK1. The connection relationship of the first transistor T1 is the same as the connection relationship of the first transistor T1 in FIG. 36, and the operation states of the first transistors T1 in above phases are substantially the same, which can play the same role and will not be repeated here.

Figure 45:
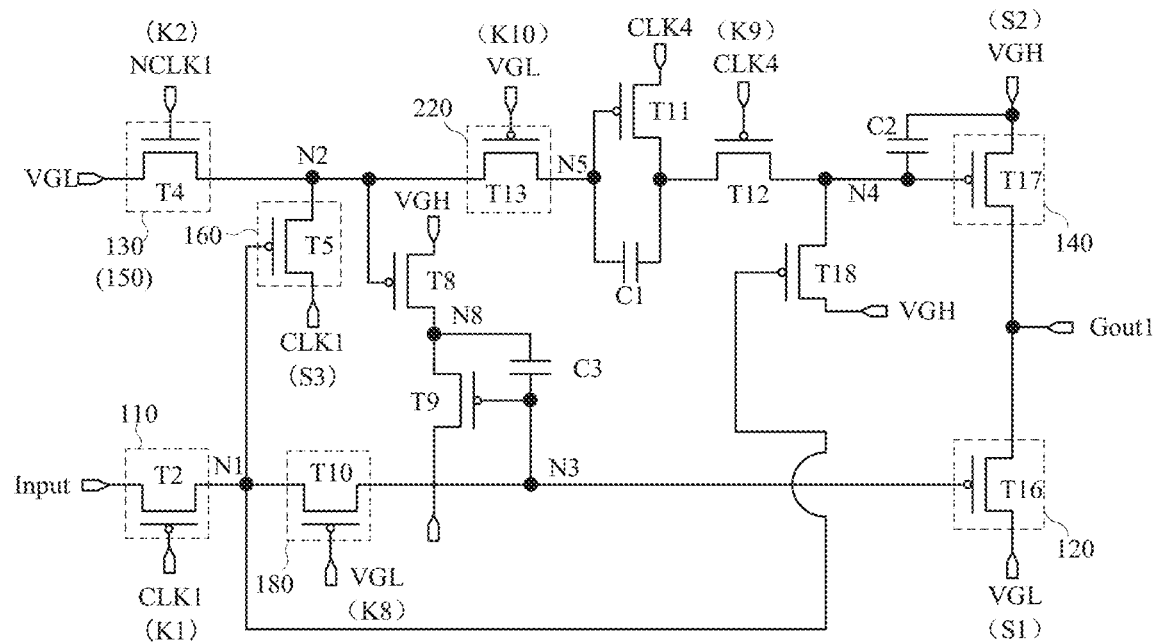
FIG. 45 is a structural diagram of a shift register, in accordance with some embodiments.

For the shift register shown in FIG. 45, in some embodiments, the difference from the shift register shown in FIG. 41 includes that the fourth transistor T4 is the oxide transistor. The connection relationship of the fourth transistor T4 is the same as the connection relationship of the fourth transistor T4 in FIG. 25, and the operation states of the fourth transistors T4 in above phases are substantially the same, which can play the same role and will not be repeated here.

Figure 46:
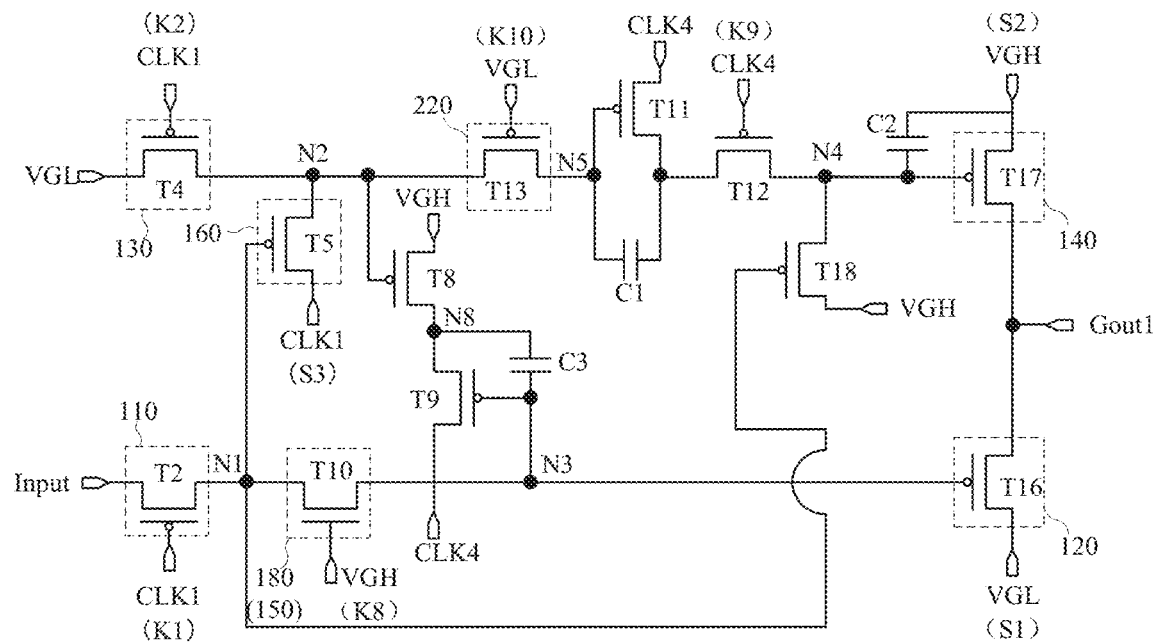
FIG. 46 is a structural diagram of a shift register, in accordance with some embodiments.

For the shift register shown in FIG. 46, in some embodiments, the difference from the shift register shown in FIG. 41 includes that the tenth transistor T10 is the oxide transistor. The connection relationship of the tenth transistor T10 is the same as the connection relationship of the tenth transistor T10 in FIG. 40, and the operation states of the tenth transistors T10 in above phases are substantially the same, which can play the same role and will not be repeated here.

Figure 47:
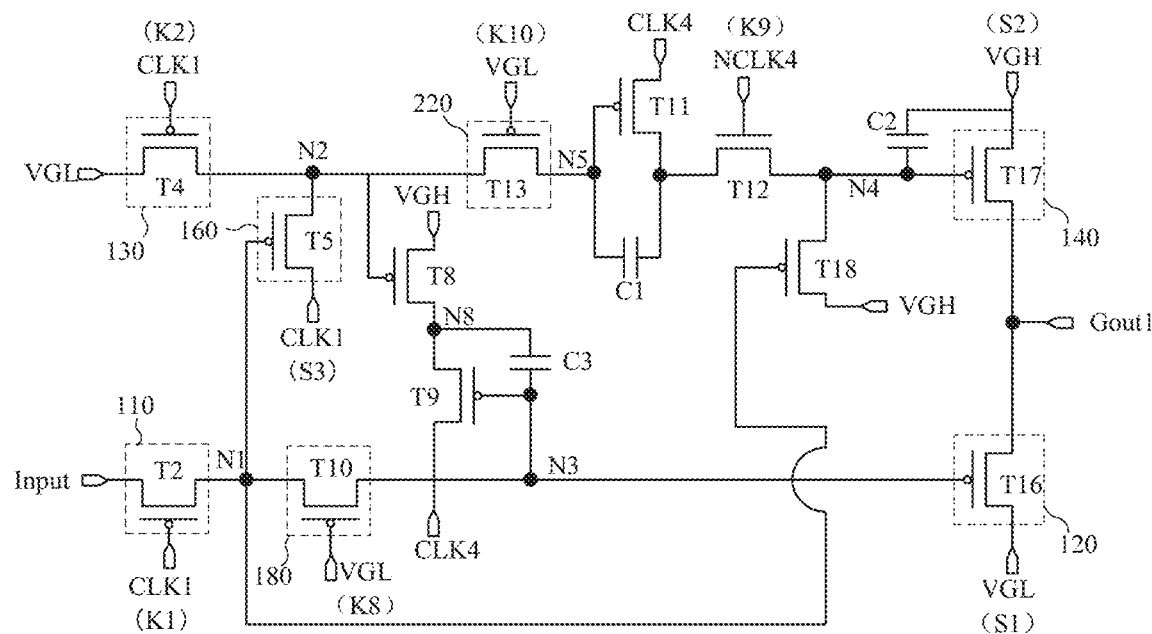
FIG. 47 is a structural diagram of a shift register, in accordance with some embodiments.

For the shift register shown in FIG. 47, in some embodiments, the difference from the shift register shown in FIG. 41 includes that the twelfth transistor T12 is the oxide transistor. The connection relationship of the twelfth transistor T12 is the same as the connection relationship of the twelfth transistor T12 in FIG. 25, and the operation states of the twelfth transistors T12 in above phases are substantially the same, which can play the same role and will not be repeated here.

Figure 48:
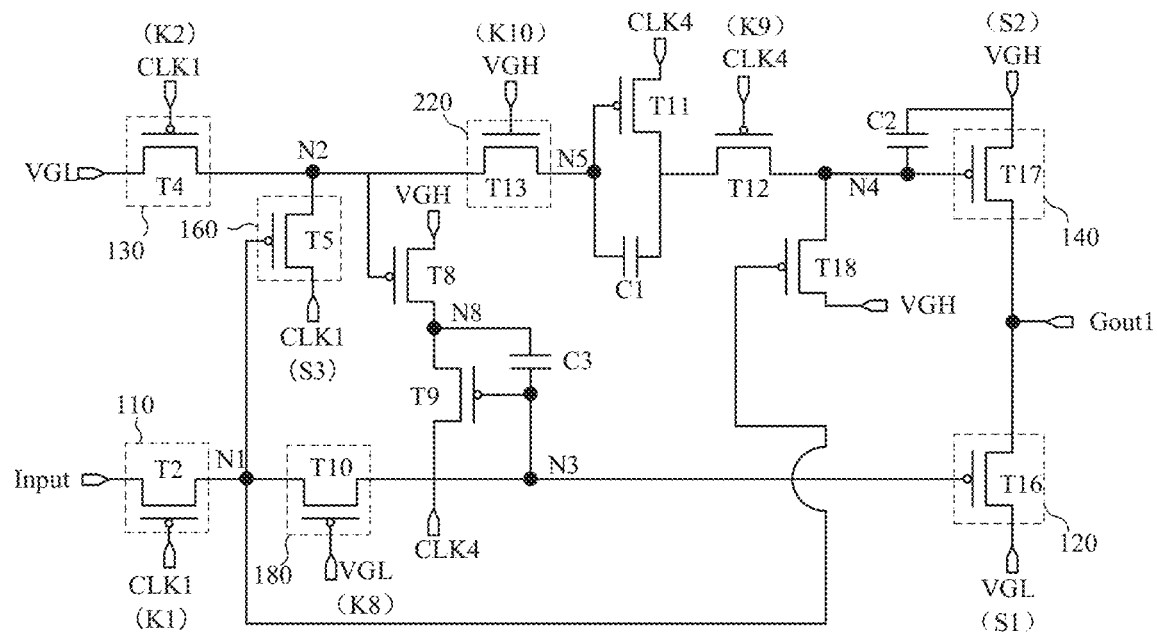
FIG. 48 is a structural diagram of a shift register, in accordance with some embodiments.

For the shift register shown in FIG. 48, in some embodiments, the difference from the shift register shown in FIG. 41 includes that the thirteenth transistor T13 is added The connection relationship of the thirteenth transistor T13 is the same as the connection relationship of the thirteenth transistor T13 in FIG. 28, and the operation states of the thirteenth transistors T13 in above phases are substantially the same, which can play the same role and will not be repeated here.

Figure 49:
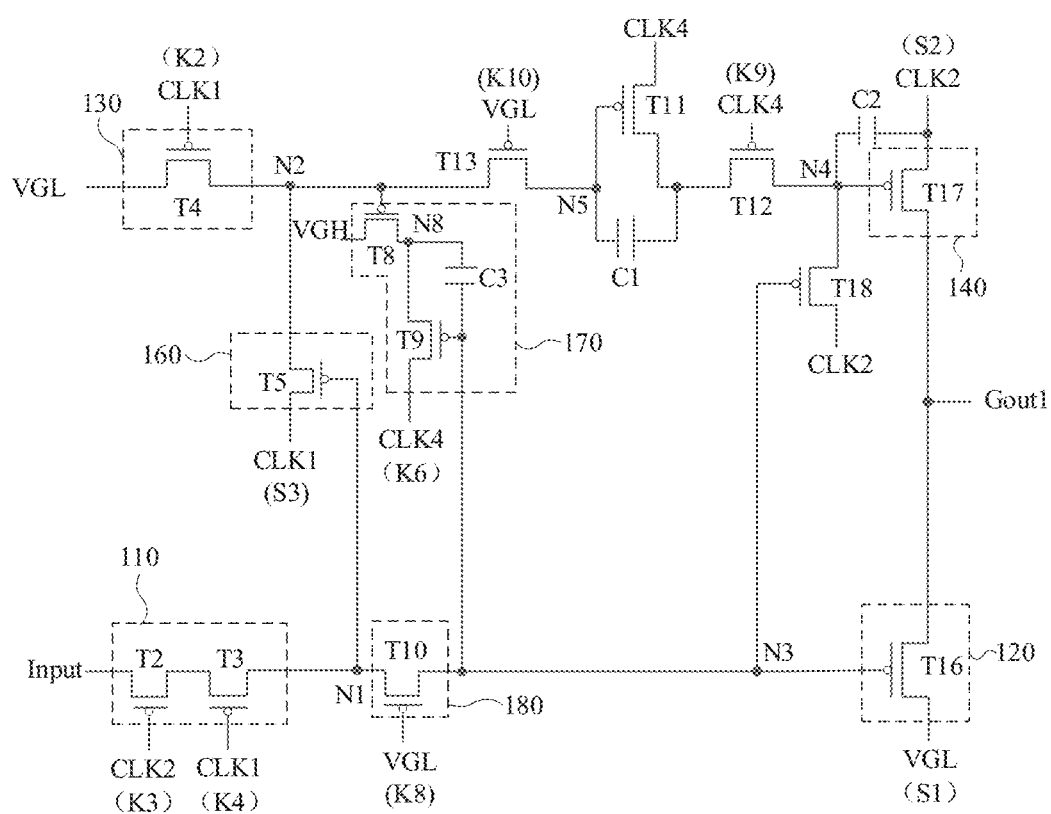
FIG. 49 is a structural diagram of a shift register, in accordance with some embodiments.

As shown in FIG. 49, in some embodiments, the shift register may be a light-emitting scan shift register or a GATE GOA N. The shift register may include a second transistor T2, a third transistor T3, a fourth transistor T4, a fifth transistor T5, an eighth transistor T8, a ninth transistor T9, an eleventh transistor T11, a twelfth transistor T12, a thirteenth transistor T13, a sixteenth transistor T16, a seventeenth transistor T17, an eighteenth transistor T18, a first capacitor C1, a second capacitor C2, and a third capacitor C3.

A control electrode of the second transistor T2 is coupled to the second clock signal terminal CLK2, a first electrode of the second transistor T2 is coupled to the input signal terminal Input, and a second electrode of the second transistor T2 is coupled to a first electrode of the third transistor T3.

A control electrode of the third transistor T3 is coupled to the first clock signal terminal CLK1, and a second electrode of the third transistor T3 is coupled to the first node N1.

A control electrode of the fourth transistor T4 is coupled to the first clock signal terminal CLK1, a first electrode of the fourth transistor T4 is coupled to the first voltage signal terminal VGL, and a second electrode of the fourth transistor T4 is coupled to the second node N2.

A control electrode of the fifth transistor T5 is coupled to the first node N1, a first electrode of the fifth transistor T5 is coupled to the first clock signal terminal CLK1, and a second electrode of the fifth transistor T5 is coupled to the second node N2.

A control electrode of the eighth transistor T8 is coupled to the second node N2, a first electrode of the eighth transistor T8 is coupled to the second voltage signal terminal VGH, and a second electrode of the eighth transistor T8 is coupled to the eighth node.

A control electrode of the ninth transistor T9 is coupled to the third node N3, a first electrode of the ninth transistor T9 is coupled to the fourth clock signal terminal CLK4, and a second electrode of the ninth transistor T9 is coupled to the eighth node.

A control electrode of the eleventh transistor T11 is coupled to the fifth node N5, a first electrode of the eleventh transistor T11 is coupled to the fourth clock signal terminal CLK4, and a second electrode of the eleventh transistor T11 is coupled to a first electrode of the twelfth transistor T12.

A control electrode of the twelfth transistor T12 is coupled to the fourth clock signal terminal CLK4, and a second electrode of the twelfth transistor T12 is coupled to the fourth node N4.

A control electrode of the thirteenth transistor T13 is coupled to the first voltage signal terminal VGL, a first electrode of the thirteenth transistor T13 is coupled to the second node N2, and a second electrode of the thirteenth transistor T13 is coupled to the fifth node N5.

A control electrode of the sixteenth transistor T16 is coupled to the third node N3, a first electrode of the sixteenth transistor T16 is coupled to the first voltage signal terminal VGL, and a second electrode of the sixteenth transistor T16 is coupled to the first scan signal terminal.

A control electrode of the seventeenth transistor T17 is coupled to the fourth node N4, a first electrode of the seventeenth transistor T17 is coupled to the second clock signal terminal CLK2, and a second electrode of the seventeenth transistor T17 is coupled to the first scan signal terminal.

A control electrode of the eighteenth transistor T18 is coupled to the first node N1, a first electrode of the eighteenth transistor T18 is coupled to the second clock signal terminal CLK2, and a second electrode of the eighteenth transistor T18 is coupled to the fourth node N4.

A first electrode plate of the first capacitor is coupled to the fifth node N5, and a second electrode plate of the first capacitor is coupled to the second electrode of the eleventh transistor T11.

A first electrode plate of the second capacitor is coupled to the second clock signal terminal CLK2, and a second electrode plate of the second capacitor is coupled to the fourth node N4.

A first electrode plate of the third capacitor is coupled to the second electrode of the eighth transistor T8, and a second electrode plate of the third capacitor is coupled to the third node N3.

Figure 50:
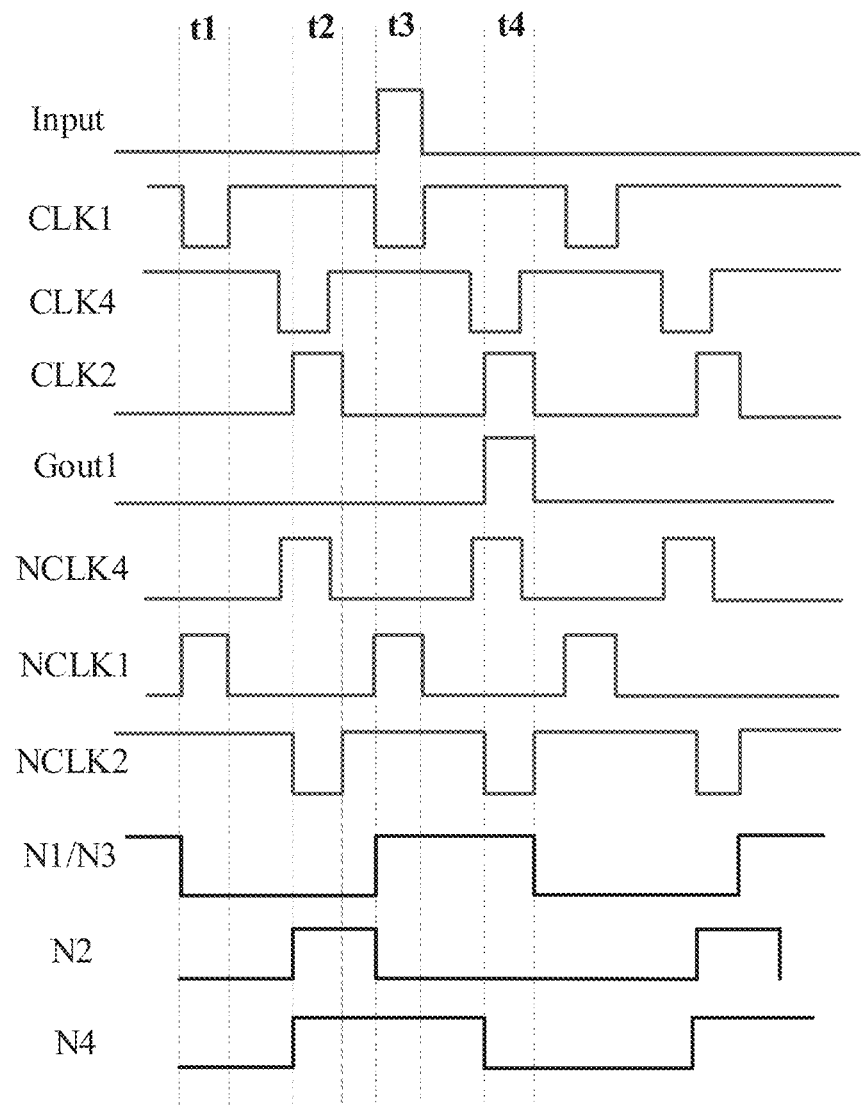
FIG. 50 is a timing diagram of a plurality of signal terminals and a plurality of nodes in the shift register shown in FIG. 49.

As shown in FIG. 50, FIG. 50 includes a timing variation of an input signal provided by the input signal terminal, a timing variation of a first clock signal provided by the first clock signal terminal CLK1, a timing variation of a second clock signal provided by the second clock signal terminal CLK2, a timing variation of a fourth clock signal provided by the fourth clock signal terminal CLK4, and a timing variation of a first scan signal provided by the first scan signal terminal. In addition, the first voltage signal terminal VGL continuously provides a first voltage signal with a low potential, and the second voltage signal terminal VGH continuously provides a second voltage signal with a high potential. An operation phase in FIG. 50 includes a first phase t1, a second phase t2, a third phase t3, and a fourth phase t4. A buffering phase is further included between two adjacent operation phases.

The second transistor T2, the third transistor T3, the fourth transistor T4, the fifth transistor T5, the eighth transistor T8, the ninth transistor T9, the eleventh transistor T11, the twelfth transistor T12, the thirteenth transistor T13, the sixteenth transistor T16, the seventeenth transistor T17, and the eighteenth transistor T18 are all P-type transistors for the following description.

As shown in FIGS. 49 and 50, in the first phase t1, the input signal provided by the input signal terminal is a low potential signal, the second clock signal provided by the second clock signal terminal CLK2 is a low potential signal, the first clock signal provided by the first clock signal terminal CLK1 is a low potential signal, and the fourth clock signal provided by the fourth clock signal terminal CLK4 is a high potential signal. The first clock signal and the second clock signal are both low potential signals, and the second transistor T2, the third transistor T3, and the tenth transistor T10 are in the on state. The input signal is transmitted to the first node N1 through the second transistor T2 and the third transistor T3, and the first node N1 is a low potential. The potential of the first node N1 is transmitted to the third node N3 through the tenth transistor T10, and a potential of the third node N3 is the low potential. The fifth transistor T5, the ninth transistor T9, the sixteenth transistor T16, and the eighteenth transistor T18 are all in the on state. The eighteenth transistor T18 is in the on state, the path between the second clock signal terminal CLK2 and the fourth node N4 is formed, the second clock signal as the low potential signal is transmitted to the fourth node N4, and the fourth node N4 is at a low potential; the seventeenth transistor T17 is in the on state, the path between the second clock signal terminal CLK2 and the first scan signal terminal is formed, and the second clock signal as the low potential signal is transmitted to the first scan signal terminal. In addition, the path between the first voltage signal terminal VGL and the first scan signal terminal is formed by the sixteenth transistor T16, the first voltage signal is transmitted to the first scan signal terminal, and the first scan signal provided by the first scan signal terminal is a low potential signal.

In the second phase t2, the input signal provided by the input signal terminal is a low potential signal, the second clock signal provided by the second clock signal terminal CLK2 is a high potential signal, the first clock signal provided by the first clock signal terminal CLK1 is a high potential signal, and the fourth clock signal provided by the fourth clock signal terminal CLK4 is changed from a low potential signal to a high potential signal.

In a phase where the fourth clock signal is the low potential signal, the first clock signal is the high potential signal, the third transistor T3 is in the off state, the potential of the first node N1 maintains the low potential in the first phase t1, and the fourth transistor T4 is in the off state. The fifth transistor T5 is in the on state, the path between the first clock signal terminal CLK1 and the second node N2 is formed, and the first clock signal as the high potential signal is transmitted to the second node N2, so that the second node N2 is at a high potential. The ninth transistor T9 is in the off state; the third node N3 is at a low potential, and the eighteenth transistor T18 is in the on state; the path between the second clock signal terminal CLK2 and the fourth node N4 is formed, the second clock signal as the high potential signal is transmitted to the fourth node N4, and the fourth node N4 is at the high potential; the seventeenth transistor T17 is in the off state, the sixteenth transistor T16 is in the on state, the path between the first voltage signal terminal VGL and the first scan signal terminal is formed, and the first voltage signal is transmitted to the first scan signal terminal. The first scan signal provided by the first scan signal terminal is a low potential signal.

In the third phase t3, the input signal provided by the input signal terminal is a high potential signal, the second clock signal provided by the second clock signal terminal CLK2 is a low potential signal, the first clock signal provided by the first clock signal terminal CLK1 is a low potential signal, and the fourth clock signal provided by the fourth clock signal terminal CLK4 is a high potential signal. The second transistor T2 and the third transistor T3 are both in the on state, the path between the input signal terminal and the first node N1 is formed, the input signal as a high potential signal is transmitted to the first node N1 through the second transistor T2 and the third transistor T3, and the first node N1 is at a high potential. The fourth transistor T4 is in the on state, the path between the first voltage signal terminal VGL and the second node N2 is formed, and the first voltage signal is transmitted to the second node N2 through the fourth transistor T4, so that the potential of the second node N2 is a low voltage. The tenth transistor T10 is in the on state, the high potential signal of the first node N1 is transmitted to the third node N3, and the sixteenth transistor T16 and the eighteenth transistor T18 are both in the off state. The fourth clock signal is the high potential signal, the twelfth transistor T12 is in the off state, and the fourth node N4 maintains the high potential in the second phase t2; the seventeenth transistor T17 is in the off state, and the first scan signal terminal maintains the low potential signal in the second phase t2.

In the fourth phase t4, the input signal provided by the input signal terminal is a low potential signal, the second clock signal provided by the second clock signal terminal CLK2 is a high potential signal, the first clock signal provided by the first clock signal terminal CLK1 is a high potential signal, and the fourth clock signal provided by the fourth clock signal terminal CLK4 is changed from a low potential signal to a high potential signal.

In a phase where the fourth clock signal is the low potential signal, the second transistor T2 and the third transistor T3 are both in the off state, the potential of the first node N1 maintains the high potential in the third phase t3, and the potential of the third node N3 maintains the high potential in the third phase t3. The eighteenth transistor T18, the fifth transistor T5, and the fourth transistor T4 are all in the off state, the potential of the second node N2 maintains the low potential in the third phase t3, and the potential of the fifth node N5 maintains the low potential in the third phase t3; the eleventh transistor T11 and the twelfth transistor T12 are both in the on state, the path between the fourth clock signal terminal CLK4 and the fourth node N4 is formed, and the fourth clock signal as the low potential signal is transmitted to the fourth node N4, so that the fourth node N4 is at a low potential; the seventeenth transistor T17 is in the on state, the path between the second clock signal terminal CLK2 and the first scan signal terminal is formed, and the second clock signal as the high potential signal is transmitted to the first scan signal terminal. The first scan signal provided by the first scan signal terminal is a high potential signal.

For the shift register shown in FIG. 7, in some embodiments, the difference from the shift register shown in FIG. 49 includes that the first transistor T1 is added, and the first transistor T1 includes the oxide transistor. The first transistor T1 is coupled in series between the second node N2 and the first clock signal terminal CLK1. For example, the first transistor T1 is coupled in series between the second node N2 and the fifth transistor T5. For another example, the first transistor T1 is coupled in series between the fifth transistor T5 and the first clock signal terminal CLK1. In addition, the control electrode of the first transistor T1 is coupled to the fourth auxiliary clock signal terminal NCLK4.

The following is described by taking the first transistor T1 as an N-type transistor.

As shown in FIGS. 7 and 50, in the first phase t1, the first node N1 is at the low potential, the second node N2 is at the low potential, and the fifth transistor T5 is in the on state. The fourth auxiliary clock signal is a low potential signal, the first transistor T1 is in the off state, and the path between the second node N2 and the first clock signal terminal CLK1 is blocked, which does not affect the first node N1 to maintain the low potential.

In the second phase t2, the fourth auxiliary clock signal is changed from a high potential signal to a low potential signal; and in a phase where the fourth auxiliary clock signal is the high potential signal, the first node N1 is at the low potential, and the fifth transistor T5 is in the on state. The first transistor T1 is in the on state, the path between the first clock signal terminal CLK1 and the second node N2 is formed, the first clock signal as the high potential signal is transmitted to the second node N2, and the second node N2 is controlled to be at a high potential.

In the third phase t3, the first node N1 is at the high potential, the second node N2 is at the low potential, and the fifth transistor T5 is in the off state. The fourth auxiliary clock signal is a low potential signal, the first transistor T1 is in the off state, and the path between the first clock signal terminal CLK1 and the second node N2 is blocked, which does not affect the second node N2 to maintain the low potential.

In the fourth phase t4, the fourth auxiliary clock signal is changed from a high potential signal to a low potential signal. In a phase where the fourth auxiliary clock signal is the low potential signal, the first node N1 is at the high potential, the second node N2 is at the low potential, and the fifth transistor T5 is in the off state. The first transistor T1 is in the off state, and the path between the first clock signal terminal CLK1 and the second node N2 is blocked, which prevents the first clock signal as the high potential signal from affecting the low potential of the second node N2, and maintains the stability of the potential of the second node N2.

As described above, it can be seen from the fact that the first transistor T1 includes the oxide transistor, on the basis of the normal operation of the first control circuit 160, it is also possible to effectively prevent the first clock signal provided by the first clock signal terminal CLK1 from affecting the potential of the second node N2, improve the stability of the potential of the second node N2, and thus improve the reliability of the shift register.

For the operation process of other transistors, reference may be made to the above schematic description, and details are not described here.

For the shift register shown in FIG. 10, in some embodiments, the difference from the shift register shown in FIG. 7 includes that the third transistor T3 may be the oxide transistor. In the embodiments, the control electrode of the third transistor T3 is coupled to the first auxiliary clock signal terminal NCLK1.

The third transistor T3 is taken as an N-type transistor for description.

As shown in FIGS. 10 and 50, in the first phase t1, the first auxiliary clock signal provided by the first auxiliary clock signal terminal NCLK1 is a high potential signal, and the third transistor T3 is in the on state. The second clock signal provided by the second clock signal terminal CLK2 is a low potential signal, and the second transistor T2 is in the on state; the input signal provided by the input signal terminal is a low potential signal, and the input signal is transmitted to the first node N1 through the second transistor T2 and the third transistor T3.

In the second phase t2, the first auxiliary clock signal provided by the first auxiliary clock signal terminal NCLK1 is a low potential signal, the third transistor T3 is in the off state, and the path between the input signal terminal and the first node N1 is blocked, which does not affect maintenance of the low potential of the first node N1.

In the third phase t3, the first auxiliary clock signal provided by the first auxiliary clock signal terminal NCLK1 is a high potential signal, and the third transistor T3 is in the on state. The second clock signal provided by the second clock signal terminal CLK2 is a low potential signal, and the second transistor T2 is turned on; the input signal provided by the input signal terminal is a high potential signal, and the input signal is transmitted to the first node N1 through the second transistor T2 and the third transistor T3.

In the fourth phase t4, the first auxiliary clock signal provided by the first auxiliary clock signal terminal NCLK1 is a low potential signal, the third transistor T3 is in the off state, and the path between the input signal terminal and the first node N1 is blocked, which prevents the input signal provided by the input signal terminal as a low potential signal from affecting the high potential at the first node N1, and maintain the stability of the potential of the first node N1.

As described above, it can be seen from the fact that the third transistor T3 includes the oxide transistor, on the basis of the normal operation of the first input circuit 110, it is also possible to effectively prevent the input signal provided by the input signal terminal from affecting the potential of the first node N1, improve the stability of the potential of the first node N1, and thus improve the reliability of the shift register.

For the operation process of other transistors, reference may be made to the above schematic description, and details are not described here.

For the shift register shown in FIG. 9, in some embodiments, the difference from the shift register shown in FIG. 7 includes that the second transistor T2 may be the oxide transistor. In the embodiments, the control electrode of the second transistor T2 is coupled to the second auxiliary clock signal terminal NCLK2.

The second transistor T2 is taken as an N-type transistor for description.

As shown in FIGS. 9 and 50, in the first phase t1, the second auxiliary clock signal provided by the second auxiliary clock signal terminal NCLK2 is a high potential signal, and the second transistor T2 is in the on state. The first clock signal provided by the first clock signal terminal CLK1 is a low potential signal, and the third transistor T3 is turned on; the input signal provided by the input signal terminal is a low potential signal, and the input signal is transmitted to the first node N1 through the second transistor T2 and the third transistor T3.

In the second phase t2, the second auxiliary clock signal provided by the second auxiliary clock signal terminal NCLK2 is a low potential signal, and the second transistor T2 is in the off state; the path between the input signal terminal and the first node N1 is blocked, which does not affect maintenance of the low potential of the first node N1.

In the third phase t3, the second auxiliary clock signal provided by the second auxiliary clock signal terminal NCLK2 is a high potential signal, and the second transistor T3 is in the on state. The first clock signal provided by the first clock signal terminal CLK1 is a low potential signal, and the third transistor T3 is turned on; the input signal provided by the input signal terminal is a high potential signal, and the input signal is transmitted to the first node N1 through the second transistor T2 and the third transistor T3.

In the fourth phase t4, the second auxiliary clock signal provided by the second auxiliary clock signal terminal NCLK2 is a low potential signal, the second transistor T2 is in the off state, and the path between the input signal terminal and the first node N1 is blocked, which prevents the input signal provided by the input signal terminal as a low potential signal from affecting the high potential at the first node N1, and maintain the stability of the potential of the first node N1.

As described above, it can be seen from the fact that the second transistor T2 includes the oxide transistor, on the basis of the normal operation of the first input circuit 110, it is also possible to effectively prevent the input signal provided by the input signal terminal from affecting the potential of the first node N1, improve the stability of the potential of the first node N1, and thus improve the reliability of the shift register.

For the operation process of other transistors, reference may be made to the above schematic description, and details are not described here.

Figure 51:
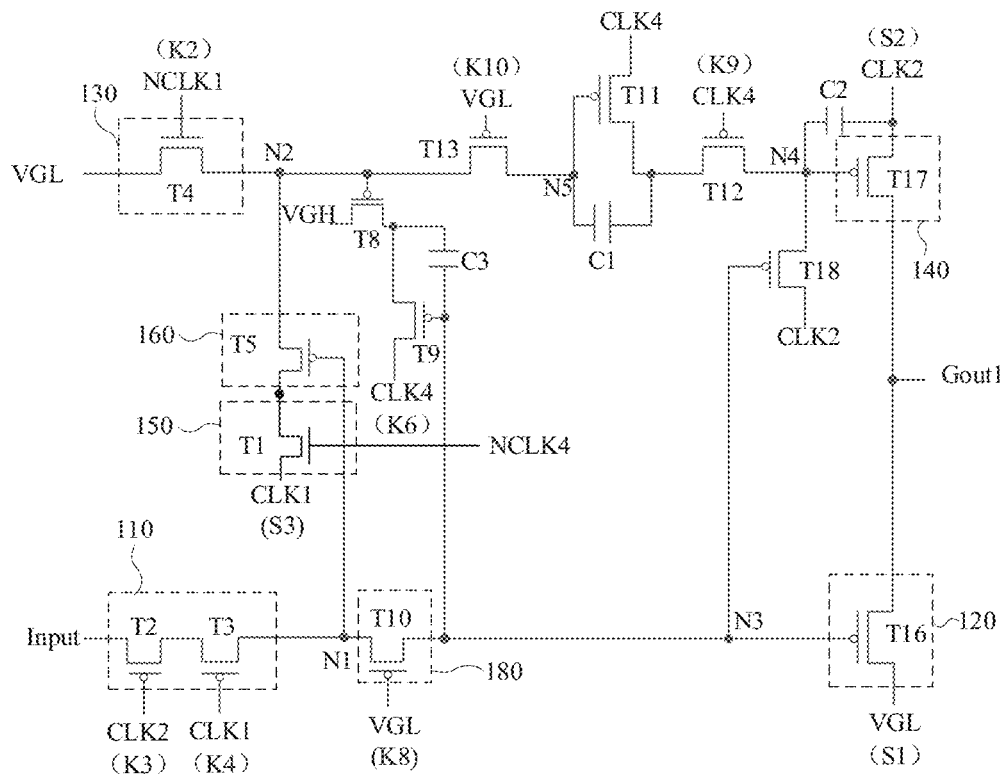
FIG. 51 is a structural diagram of a shift register, in accordance with some embodiments.

For the shift register shown in FIG. 51, in some embodiments, the difference from the shift register shown in FIG. 7 includes that the fourth transistor T4 is the oxide transistor. In the embodiments, the control electrode of the fourth transistor T4 is coupled to the first auxiliary clock signal terminal NCLK1.

The fourth transistor T4 is taken as an N-type transistor for description.

As shown in FIGS. 50 and 51, in the first phase t1, the first auxiliary clock signal provided by the first auxiliary clock signal terminal NCLK1 is a high potential signal, the fourth transistor T4 is in the on state, and the first voltage signal provided by the first voltage signal terminal VGL is transmitted to the second node N2 through the fourth transistor T4.

In the second phase t2, the first node N1 is at the low potential, the fifth transistor T5 is in the on state, and the first clock signal with a high potential is transmitted to the second node N2. The first auxiliary clock signal provided by the first auxiliary clock signal terminal NCLK1 is a low potential signal, the fourth transistor T4 is in the off state, and the path between the first voltage signal terminal VGL and the second node N2 is blocked, which prevents the first voltage signal of the low potential signal from affecting the high potential at the second node N2, and improve the stability of the potential of the second node N2.

In the third phase t3, the first auxiliary clock signal provided by the first auxiliary clock signal terminal NCLK1 is a high potential signal, the fourth transistor T4 is in the on state, and the first voltage signal provided by the first voltage signal terminal VGL is transmitted to the second node N2 through the fourth transistor T4.

In the fourth phase t4, the second node N2 is at the low potential; the first auxiliary clock signal provided by the first auxiliary clock signal terminal NCLK1 is a low potential signal, and the fourth transistor T4 is in the off state; the path between the first voltage signal terminal VGL and the second node N2 is blocked, and the second node N2 is not affected to maintain the low potential.

As described above, it can be seen from the fact that the fourth transistor T4 includes the oxide transistor, on the basis of the normal operation of the second input circuit 130, it is also possible to effectively prevent the first voltage signal provided by the first voltage signal terminal VGL from affecting the potential of the second node N2, improve the stability of the potential of the second node N2, and thus improve the reliability of the shift register.

For the operation process of other transistors, reference may be made to the above schematic description, and details are not described here.

Figure 52:
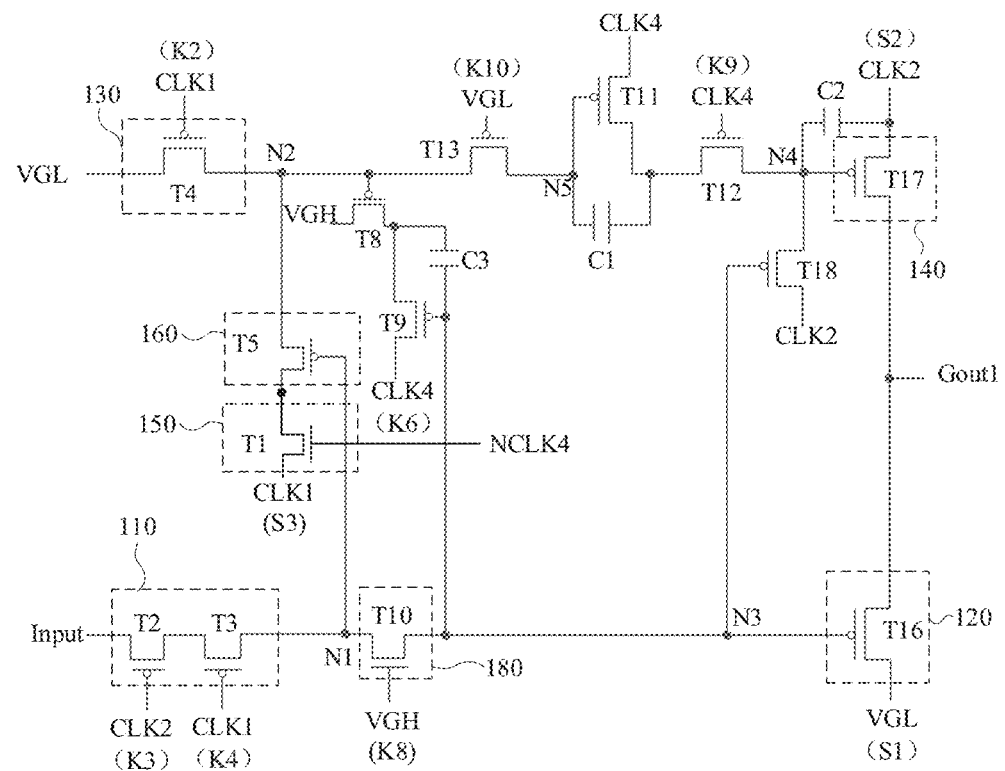
FIG. 52 is a structural diagram of a shift register, in accordance with some embodiments.

For the shift register shown in FIG. 52, in some embodiments, the difference from the shift register shown in FIG. 7 includes that the tenth transistor T10 is the oxide transistor. In the embodiments, the control electrode of the tenth transistor T10 is coupled to the second voltage signal terminal VGH.

The tenth transistor T10 is taken as an N-type transistor for description.

As shown in FIGS. 50 and 52, in the first phase t1, the first node N1 is at a low potential. The second voltage signal provided by the second voltage signal terminal VGH is the high potential signal, the tenth transistor T10 is in the on state, and the potential of the first node N1 is transmitted to the third node N3 through the tenth transistor T10.

In the second phase t2, the first node N1 is at the low potential, and the third node N3 is at the low potential (2VGL−VthN3−VGH) due to the bootstrap action of the third capacitor. The second voltage signal provided by the second voltage signal terminal VGH is the high potential signal, the tenth transistor T10 is in the off state, and the path between the first node N1 and the third node N3 is blocked to maintain the low potential of the third node N3.

In the third phase t3, the first node N1 is at a high potential. The second voltage signal provided by the second voltage signal terminal VGH is the high potential signal, the tenth transistor T10 is in the on state, and the potential of the first node N1 is transmitted to the third node N3 through the tenth transistor T10.

In the fourth phase t4, the potential of the first node N1 is the high potential. The second voltage signal provided by the second voltage signal terminal VGH is the high potential signal, the tenth transistor T10 is in the on state, and the potential of the first node N1 is transmitted to the third node N3 through the tenth transistor T10.

As described above, it can be seen from the fact that the tenth transistor T10 is used as the oxide transistor, and the control electrode of the tenth transistor T10 is coupled to the second voltage signal terminal VGH, in a case where the tenth transistor T10 is in the off state on the basis of the normal operation of the first voltage stabilizing circuit 180, it is possible to prevent the potential of the first node N1 from affecting the potential of the third node N3, improve the stability of the potential of the third node N3, and thus improve the reliability of the shift register.

For the operation process of other transistors, reference may be made to the above schematic description, and details are not described here.

Figure 53:
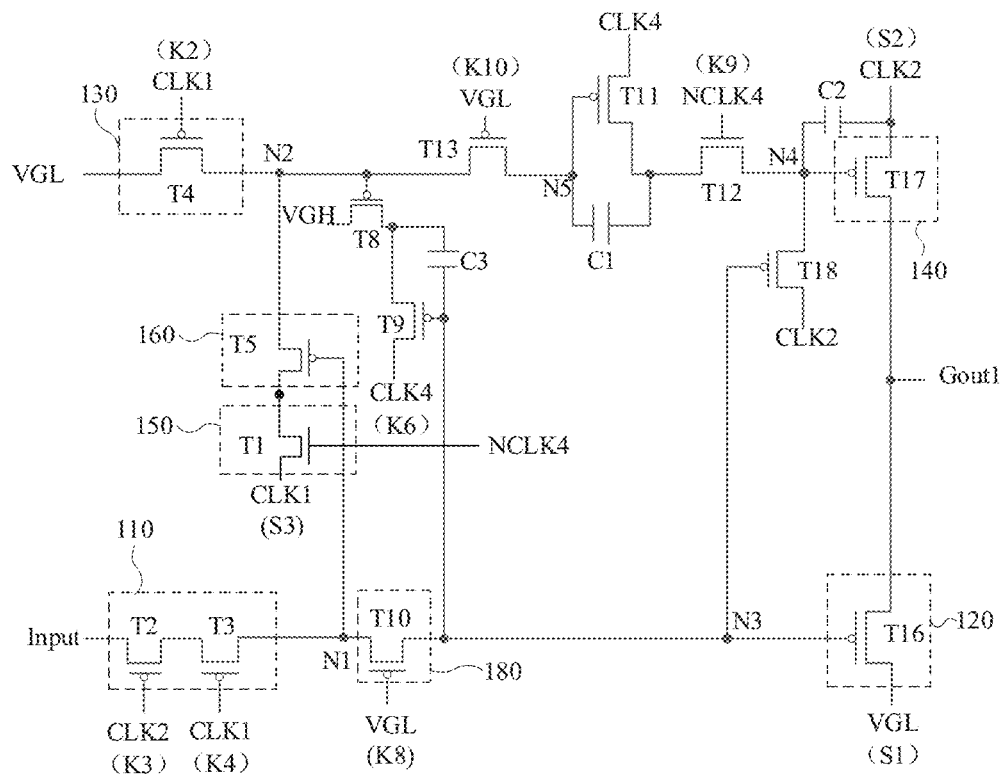
FIG. 53 is a structural diagram of a shift register, in accordance with some embodiments.
Figure 54:
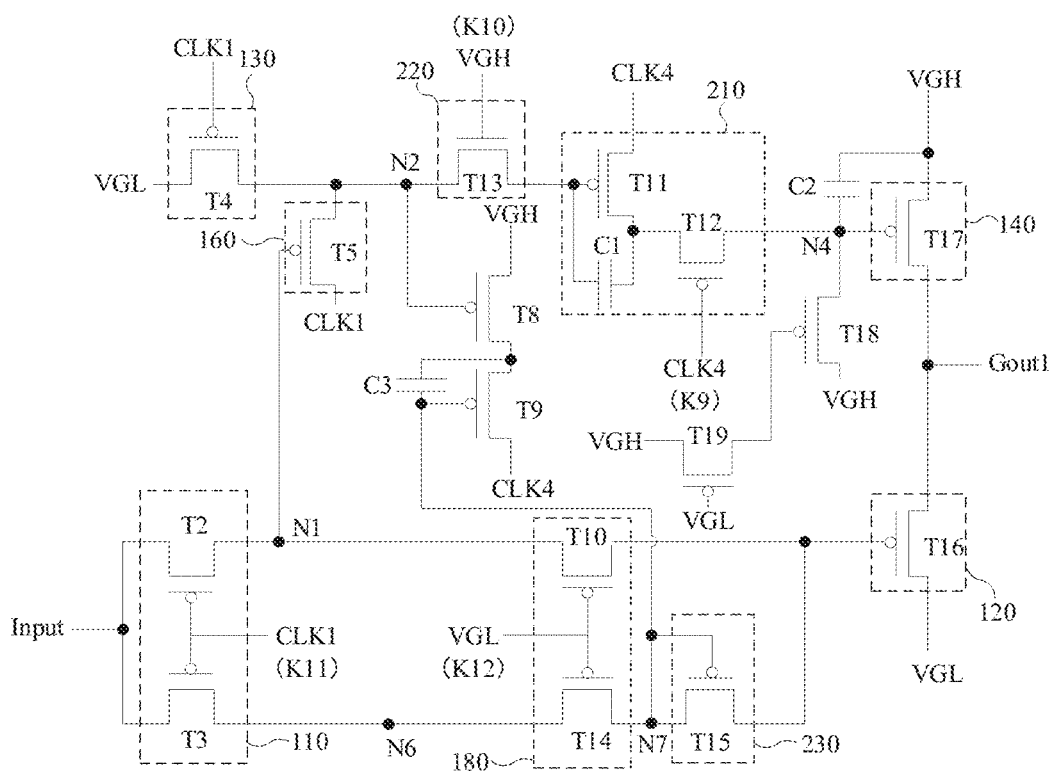
FIG. 54 is a structural diagram of a shift register, in accordance with some embodiments.

For the shift register shown in FIG. 53, in some embodiments, the difference from the shift register shown in FIG. 7 includes that the twelfth transistor T12 is the oxide transistor. The control electrode of the twelfth transistor T12 in the embodiments is coupled to the fourth auxiliary clock signal terminal NCLK4.

The following is described by taking the twelfth transistor T12 as an N-type transistor.

As shown in FIGS. 50 and 53, in the first phase t1, the second node N2 is at a low potential, and the thirteenth transistor T13 is turned on; the fifth node N5 is at the low potential, and the eleventh transistor T11 is in the on state. The fourth auxiliary clock signal provided by the fourth auxiliary clock signal terminal NCLK4 is a low potential signal, the twelfth transistor T12 is in the off state, and the path between the fourth clock signal terminal CLK4 and the fourth node N4 is blocked, which prevents the fourth clock signal as the high potential signal from affecting a low potential at the fourth node N4, and improves the stability of the potential of the fourth node N4.

In the second phase t2, the second node N2 is at a high potential, and the thirteenth transistor T13 is turned on; the fifth node N5 is at the high potential, and the eleventh transistor T11 is in the off state. The fourth auxiliary clock signal provided by the fourth auxiliary clock signal terminal NCLK4 is changed from a low potential signal to a high potential signal. When the fourth auxiliary clock signal is the high potential signal, the twelfth transistor T12 is in the on state, and the fourth node N4 maintains the high potential in the first phase t1.

In the third phase t3, the second node N2 is at a low potential, and the thirteenth transistor T13 is turned on; the fifth node N5 is at the low potential, and the eleventh transistor T11 is in the on state. The fourth auxiliary clock signal provided by the fourth auxiliary clock signal terminal NCLK4 is a low potential signal, the twelfth transistor T12 is in the off state, and the path between the fourth clock signal terminal CLK4 and the fourth node N4 is blocked to maintain the high potential of the fourth node N4.

In the fourth phase t4, the second node N2 is at the low potential, and the thirteenth transistor T13 is turned on; the fifth node N5 is at the low potential, and the eleventh transistor T11 is in the on state. The fourth auxiliary clock signal provided by the fourth auxiliary clock signal terminal NCLK4 is changed from a low potential signal to a high potential signal. When the fourth auxiliary clock signal is the high potential signal, the path between the fourth clock signal terminal CLK4 and the fourth node N4 is formed, and the fourth node N4 is at a low potential.

As described above, it can be seen from the fact that the twelfth transistor T12 includes the oxide transistor, on the basis of the normal operation of the second control circuit 210, it is also possible to effectively prevent the fourth clock signal provided by the fourth clock signal terminal CLK4 from affecting the potential of the fourth node N4, improve the stability of the potential of the fourth node N4, and thus improve the reliability of the shift register.

For the operation process of other transistors, reference may be made to the above schematic description, and details are not described here.

For the shift register shown in FIG. 30, in some embodiments, the difference from the shift register shown in FIG. 41 includes that a third transistor T3, a fourteenth transistor T14, a fifteenth transistor T15, and a nineteenth transistor T19 may be further included in the shift register.

A control electrode of the third transistor T3 is coupled to an eleventh control signal terminal K11, a first electrode of the third transistor T3 is coupled to the input signal terminal, and a second electrode of the third transistor T3 is coupled to a sixth node N6.

A control electrode of the fourteenth transistor T14 is coupled to a twelfth control signal terminal K12, a first electrode of the fourteenth transistor T14 is coupled to the sixth node N6, and a second electrode of the fourteenth transistor T14 is coupled to a seventh node N7.

A control electrode of the fifteenth transistor T15 is coupled to the seventh node N7, a first electrode of the fifteenth transistor T15 is coupled to the seventh node N7, and a second electrode of the fifteenth transistor T15 is coupled to the control electrode of the sixteenth transistor T16.

A control electrode of the nineteenth transistor T19 is coupled to an initialization signal terminal VEL, a first electrode of the nineteenth transistor T19 is coupled to the second voltage signal terminal VGH, and a second electrode of the nineteenth transistor T19 is coupled to the first node N1.

A control process of the third transistor T3 is substantially the same as a control process of the second transistor T2, and a control process of the fourteenth transistor T14 is substantially the same as a control process of the tenth transistor T10. The control process of the second transistor T2 and the control process of the tenth transistor T10 in each phase have been described, which will not be repeated here.

For the operation process of other transistors, reference may be made to the above schematic description, and details are not described here.

For the shift register shown in FIG. 31, in some embodiments, the difference from the shift register shown in FIG. 30 includes that the third transistor T3 is the oxide transistor. In an example where the third transistor T3 is an N-type transistor, the control electrode of the third transistor T3 is coupled to the first auxiliary clock signal terminal NCLK1.

In an example where the second transistor T2 is a P-type transistor and the third transistor T3 is an N-type transistor, the third transistor T3 can be in the on state at the same time as the second transistor T2, and in the off state at the same time as the second transistor T2. When the third transistor T3 is in the off state, and the path between the input signal terminal and the sixth node N6 can be blocked, thereby preventing the input signal from affecting the stability of the sixth node N6 when the potential of the input signal is different from the potential of the sixth node N6.

For the operation process of other transistors, reference may be made to the above schematic description, and details are not described here.

For the shift register shown in FIG. 31, in some embodiments, the difference from the shift register shown in FIG. 30 further includes that the fourteenth transistor T14 is the oxide transistor, and the control electrode of the fourteenth transistor T14 is coupled to the first auxiliary clock signal terminal NCLK1.

In an example where the tenth transistor T10 is a P-type transistor and the fourteenth transistor T14 is an N-type transistor, the fourteenth transistor T14 can be in the on state at the same time as the tenth transistor T10, and in the off state at the same time as the tenth transistor T10. When the fourteenth transistor T14 is in the off state, and the path between the sixth node N6 and the seventh node N7 can be blocked, thereby maintaining the stability of the potential of the seventh node N7 under the condition that the potential of the sixth node N6 is different from the potential of the seventh node N7.

For the operation process of other transistors, reference may be made to the above schematic description, and details are not described here.

As shown in FIGS. 14, 15, 19 and 55, embodiments of the present disclosure provide a scan driving circuit 1000. The scan driving circuit 1000 includes a first voltage signal line VGL' and N shift registers 100. The N shift registers 100 are arranged in cascade along an extending direction of the first voltage signal line VGL', and the shift register is the shift register as described above.

Figure 55:
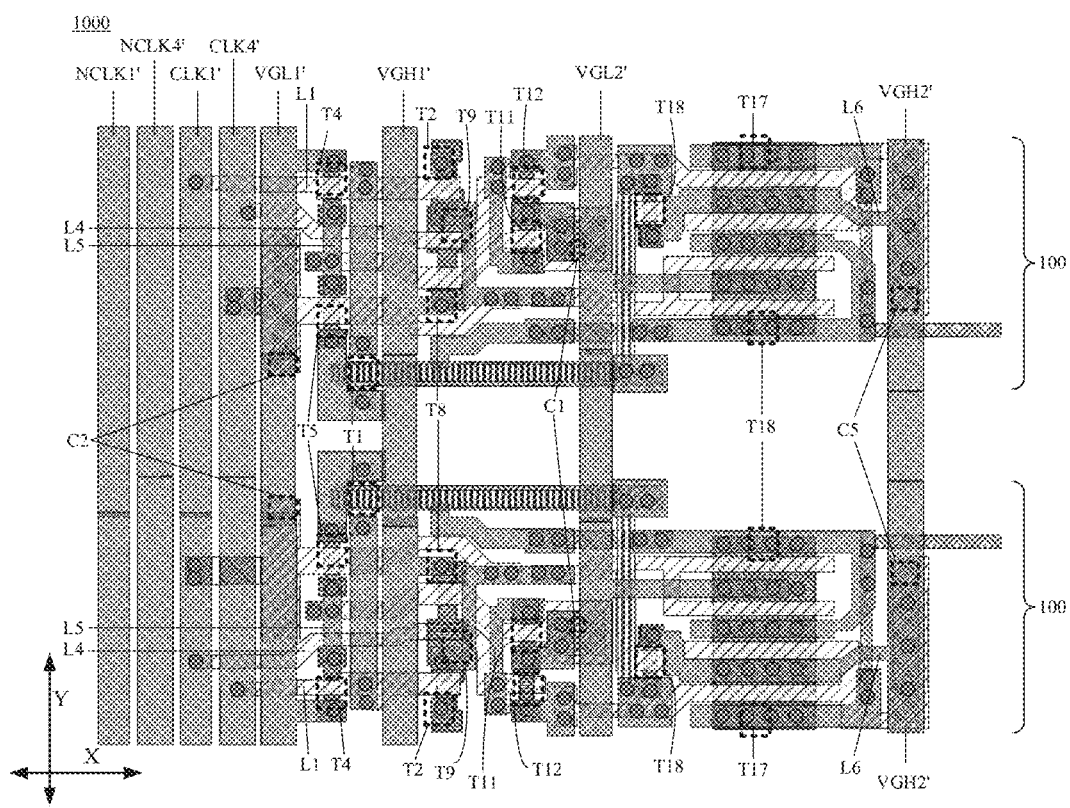
FIG. 55 is a top view of two shift registers in a display substrate in a display apparatus, in accordance with some embodiments.

There may be one or more first voltage signal lines VGL'. For example, as shown in FIG. 55, the first voltage signal lines VGL' includes two first voltage signal lines VGL1' and VGL2'. In addition, in the first direction X, the scan driving circuit 1000 may also be provided with other signal lines. For example, the other signal lines include at least one of second voltage signal line(s) VGH' (as shown in FIG. 55, the second voltage signal lines VGH' include two second voltage signal lines VGH1' and VGH2'), a first clock signal line CLK1', a second clock signal line CLK2', a third clock signal line CLK3', a fourth clock signal line CLK4', a first auxiliary clock signal line NCLK1', a second auxiliary clock signal line NCLK2', a third auxiliary clock signal line NCLK3', and a fourth auxiliary clock signal line NCLK4'. In addition, the number of the signal lines may be one or more.

The shift register of the scan driving circuit 1000 in the embodiments of the present disclosure is further provided with an input signal terminal Input and a scan signal terminal Gout1, and a circuit structure of each stage of shift register in the scan driving circuit 1000 may be the same.

On this basis, in the scan driving circuit 1000, the input signal terminal Input of a previous stage of shift register or the input signal terminals Input of multiple shift registers are coupled to a start signal terminal STV; except the shift register coupled to the start signal terminal STV, the scan signal terminal Gout1 of a previous stage of shift register is coupled to the input signal terminal Input of a next stage of shift register. Here, the previous stage of shift register and the next stage of shift register may or may not be shift registers at adjacent stages.

For example, in the scan driving circuit 1000, the input signal terminal Input of the first stage of shift register is coupled to the frame start signal terminal STV, and the scan signal terminal Gout1 of the i-th stage of shift register is coupled to the input signal terminal Input of the (i+1)-th stage of shift register. i is a positive integer greater than or equal to 2 and less than or equal to N−1 (2≤i≤N−1).

As shown in FIG. 55, in some embodiments, two adjacent shift registers are symmetrically arranged along a direction (e.g., the first direction X) perpendicular to the extending direction of the first voltage signal line VGL'.

Two oxide semiconductor structures belonging to two adjacent shift registers constitute into a one-piece structure. That is, oxide semiconductor structures of two oxide transistors in two adjacent shift registers may be manufactured by a patterning process, thereby reducing the manufacturing process of the semiconductor structures and improving the manufacturing efficiency of the scan driving circuit.

In some examples, as shown in FIG. 55, the first transistors T1 in the two shift registers are arranged close to each other, and active layers (i.e., oxide semiconductor structures) of the two first transistors T1 are formed simultaneously by one patterning process. That is, the first transistors T1 in the two shift registers have different portions of the same oxide semiconductor pattern.

By symmetrically arranging two adjacent shift registers, the transistors with the oxide semiconductor structure can be arranged close to each other. Further, the two oxide semiconductor structures belonging to two adjacent shift registers are formed into the one-piece structure, which can reduce the manufacturing process of the oxide semiconductor structures, thereby improving the manufacturing efficiency of the shift register.

It should be noted that wires connected to signal lines (including a plurality of clock signal lines and a plurality of voltage signal lines) outside two shift registers may be asymmetric.

The foregoing descriptions are merely specific implementation manners of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be determined by the protection scope of the claims.

What is claimed is:

1. A shift register, comprising:
a first input circuit coupled to an input signal terminal, a first control signal terminal and a first node, wherein the first input circuit is configured to transmit an input signal provided by the input signal terminal to the first node under control of a first control signal provided by the first control signal terminal;
a first output circuit coupled to a first output signal terminal, the first node and a first scan signal terminal, wherein the first output circuit is configured to transmit a first output signal provided by the first output signal terminal to the first scan signal terminal under control of a potential of the first node;
a second input circuit coupled to a first voltage signal terminal, a second control signal terminal and a second node, wherein the second input circuit is configured to transmit a first voltage signal provided by the first voltage signal terminal to the second node under control of a second control signal provided by the second control signal terminal;
a second output circuit coupled to a second output signal terminal, the second node and the first scan signal terminal, wherein the second output circuit is configured to transmit a second output signal provided by the second output signal terminal to the first scan signal terminal under control of a potential of the second node; and
at least one functional circuit, a functional circuit being coupled to a functional input terminal, a functional output terminal and a functional control terminal, wherein the functional circuit is configured to block a path between the functional input terminal and the functional output terminal under control of a functional control signal provided by the functional control terminal, so as to maintain a potential of the functional output terminal;
wherein the functional output terminal includes one of circuit nodes.

2. The shift register according to claim 1, wherein the functional circuit includes an oxide transistor; and
a control electrode of the oxide transistor is coupled to the functional control terminal, a first electrode of the oxide transistor is coupled to the functional input terminal, and a second electrode of the oxide transistor is coupled to the functional output terminal.

3. The shift register according to claim 2, wherein the oxide transistor includes a first gate pattern, an active layer, and a second gate pattern that are sequentially stacked on a side of a substrate; a material of the active layer includes an oxide semiconductor material; and
the first gate pattern and the second gate pattern constitute the control electrode of the oxide transistor.

4. The shift register according to claim 1, wherein the first control signal terminal includes a first clock signal terminal, wherein
the first input circuit includes a second transistor; a control electrode of the second transistor is coupled to the first clock signal terminal, a first electrode of the second transistor is coupled to the input signal terminal, and a second electrode of the second transistor is coupled to the first node; or
the first control signal terminal includes a first auxiliary clock signal terminal, wherein
the first input circuit is further used as the functional circuit; and
the first input circuit is further configured to block a path between the input signal terminal and the first node under control of a first auxiliary clock signal provided by the first auxiliary clock signal terminal, so as to maintain the potential of the first node; or
the first control signal terminal includes a third control signal terminal and a fourth control signal terminal; and
the first input circuit is further configured to transmit the input signal to the first node under control of a third control signal provided by the third control signal terminal and a fourth control signal provided by the fourth control signal terminal, wherein
the first input circuit includes the functional circuit, and the functional circuit is coupled in series between the input signal terminal and the first node;
the third control signal terminal is used as the functional control terminal, and the functional circuit is configured to block a path between the input signal terminal and the first node under control of the third control signal provided by the third control signal terminal, so as to maintain the potential of the first node; and/or
the fourth control signal terminal is used as the functional control terminal, and the functional circuit is configured to block the path between the input signal terminal and the first node under control of the fourth control signal provided by the fourth control signal terminal, so as to maintain the potential of the first node.

5. The shift register according to claim 4, wherein the third control signal terminal includes a second clock signal terminal, and the fourth control signal terminal includes a first auxiliary clock signal terminal;
the first input circuit includes a second transistor and a third transistor; the functional circuit includes the third transistor, and the third transistor includes an oxide transistor; and the first auxiliary clock signal terminal is used as the functional control terminal; and
a control electrode of the second transistor is coupled to the second clock signal terminal, a first electrode of the second transistor is coupled to the input signal terminal, and a second electrode of the second transistor is coupled to a first electrode of the third transistor; a control electrode of the third transistor is coupled to the first auxiliary clock signal terminal, and a second electrode of the third transistor is coupled to the first node;
or
the third control signal terminal includes a second auxiliary clock signal terminal, and the fourth control signal terminal includes a first clock signal terminal;
the first input circuit includes the second transistor and the third transistor; the functional circuit includes the second transistor, and the second transistor includes an oxide transistor; and the second auxiliary clock signal terminal is used as the functional control terminal; and
the control electrode of the second transistor is coupled to the second auxiliary clock signal terminal, the first electrode of the second transistor is coupled to the input signal terminal, and the second electrode of the second transistor is coupled to the first electrode of the third transistor; the control electrode of the third transistor is coupled to the first clock signal terminal, and the second electrode of the third transistor is coupled to the first node.

6. The shift register according to claim 1, wherein the second control signal terminal includes a first clock signal terminal, wherein
the second input circuit includes a fourth transistor; a control electrode of the fourth transistor is coupled to the first clock signal terminal, a first electrode of the fourth transistor is coupled to the first voltage signal terminal, and a second electrode of the fourth transistor is coupled to the second node; or
the second control signal terminal includes a first auxiliary clock signal terminal, wherein
the second input circuit is further used as the functional circuit; and
the second input circuit is further configured to block a path between the first voltage signal terminal and the second node under control of a first auxiliary clock signal provided by the first auxiliary clock signal terminal, so as to maintain the potential of the second node.

7. The shift register according to claim 1, further comprising a first control circuit, wherein
the first control circuit is coupled to a fifth control signal terminal, the second node and a third output signal terminal; and the first control circuit is configured to transmit a third output signal provided by the third output signal terminal to the second node under control of a fifth control signal provided by the fifth control signal terminal.

8. The shift register according to claim 7, wherein the first control circuit includes a fifth transistor, the fifth control signal terminal includes the first node, and the third output signal terminal includes a first clock signal terminal or a second voltage signal terminal; and
a control electrode of the fifth transistor is coupled to the first node, a first electrode of the fifth transistor is coupled to the third output signal terminal, and a second electrode of the fifth transistor is coupled to the second node.

9. The shift register according to claim 8, wherein the functional circuit is coupled in series between the second node and the third output signal terminal; the functional circuit is further coupled to a third clock signal terminal, and the third output signal terminal includes the first clock signal terminal; and
the functional circuit is configured to block a path between the second node and the first clock signal terminal under control of a third clock signal provided by the third clock signal terminal, so as to maintain the potential of the second node.

10. The shift register according to claim 1, further comprising a third output circuit and a fourth output circuit, wherein
the third output circuit is coupled to the first voltage signal terminal, the first node and a second scan signal terminal; the third output circuit is configured to transmit the first voltage signal provided by the first voltage signal terminal to the second scan signal terminal under the control of the potential of the first node; and
the fourth output circuit is coupled to a second voltage signal terminal, the first node and the second scan signal terminal; the fourth output circuit is configured to transmit a second voltage signal provided by the second voltage signal terminal to the second scan signal terminal under the control of the potential of the first node.

11. The shift register according to claim 10, wherein the third output circuit is further used as the functional circuit; and the third output circuit is further configured to block a path between the first voltage signal terminal and the second scan signal terminal under the control of the potential of the first node, so as to maintain a potential of the second scan signal terminal.

12. The shift register according to claim 11, further comprising a first control circuit, wherein the first control circuit is coupled to a fifth control signal terminal, the second node and a third output signal terminal; the first control circuit is configured to transmit a third output signal provided by the third output signal terminal to the second node under control of a fifth control signal provided by the fifth control signal terminal;
the third output signal terminal includes a first clock signal terminal; the fifth control signal terminal includes the second scan signal terminal; the first control circuit is further used as another functional circuit; and
the first control circuit is configured to block a path between the first clock signal terminal and the second node under control of a second scan signal provided by the second scan signal terminal, so as to maintain the potential of the second node.

13. The shift register according to claim 1, further comprising a noise reduction circuit, wherein the noise reduction circuit is coupled to a second voltage signal terminal, a sixth control signal terminal, the second node and the first node; and the noise reduction circuit is configured to transmit a second voltage signal provided by the second voltage signal terminal to the first node under control of the potential of the second node and a sixth control signal provided by the sixth control signal terminal.

14. The shift register according to claim 13, wherein the sixth control signal terminal includes a fourth clock signal terminal; and
the functional circuit is coupled in series between the second voltage signal terminal and the first node; the functional circuit is further coupled to the first node, and the functional circuit is configured to block a path between the second voltage signal terminal and the first node under the control of the potential of the first node, so as to maintain the potential of the first node; or
the sixth control signal terminal includes a fourth auxiliary clock signal terminal; and
the noise reduction circuit includes the functional circuit, and the functional circuit is configured to block a path between the first node and the second voltage signal terminal under control of a fourth auxiliary clock signal provided by the fourth auxiliary clock signal terminal, so as to maintain the potential of the first node.

15. The shift register according to claim 1, further comprising a first voltage stabilizing circuit, wherein the circuit nodes further include a third node;
the first voltage stabilizing circuit is coupled to the first node, the third node, and an eighth control signal terminal; the first output circuit is coupled to the third node and is coupled to the first node through the first voltage stabilizing circuit; and the first voltage stabilizing circuit is configured to connect the first node and the third node under control of a potential of the third node and an eighth control signal provided by the eighth control signal terminal; and the first output circuit is configured to transmit the first output signal provided by the first output signal terminal to the first scan signal terminal under control of the potential of the third node.

16. The shift register according to claim 15, wherein the eighth control signal terminal includes a second voltage signal terminal; and the first voltage stabilizing circuit is further used as the functional circuit; the first voltage stabilizing circuit is further configured to block a path between the first node and the third node under control of the potential of the third node and a potential of a second voltage signal provided by the second voltage signal terminal, so as to maintain the potential of the third node.

17. The shift register according to claim 1, further comprising a second control circuit, wherein the circuit nodes further include a fourth node;

the second control circuit is coupled to the second node, the fourth node, a fourth clock signal terminal and a ninth control signal terminal; the second output circuit is coupled to the fourth node and is coupled to the second node through the second control circuit; and the second control circuit is configured to transmit a fourth clock signal provided by the fourth clock signal terminal to the fourth node under control of the potential of the second node and a ninth control signal provided by the ninth control signal terminal; and the second output circuit is configured to transmit the second output signal provided by the second output signal terminal to the first scan signal terminal under control of the fourth node.

18. The shift register according to claim 17, wherein the ninth control signal terminal includes a fourth auxiliary clock signal terminal;

the second control circuit includes the functional circuit; and the functional circuit is configured to block a path between the fourth clock signal terminal and the fourth node under control of a fourth auxiliary clock signal provided by the fourth auxiliary clock signal terminal, so as to maintain a potential of the fourth node.

19. A scan driving circuit, comprising:
a first voltage signal line; and
N cascaded shift registers sequentially arranged along an extending direction of the first voltage signal line, wherein a shift register is the shift register according to claim 1.

20. A display apparatus, comprising a display area and a peripheral area located on at least one side of the display area;

a plurality of sub-pixels located in the display area; and
the scan driving circuit according to claim 19, wherein the scan driving circuit is located in the peripheral area and is coupled to the plurality of sub-pixels.

* * * * *